United States Patent
Negoro et al.

(10) Patent No.: US 10,032,654 B2
(45) Date of Patent: Jul. 24, 2018

(54) SUBSTRATE TREATMENT APPARATUS

(71) Applicant: DAINIPPON SCREEN MFG. CO., LTD., Kyoto (JP)

(72) Inventors: Sei Negoro, Kyoto (JP); Ryo Muramoto, Kyoto (JP); Toyohide Hayashi, Kyoto (JP); Koji Hashimoto, Kyoto (JP); Yasuhiko Nagai, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 633 days.

(21) Appl. No.: 14/493,908

(22) Filed: Sep. 23, 2014

(65) Prior Publication Data

US 2015/0013732 A1    Jan. 15, 2015

Related U.S. Application Data

(62) Division of application No. 13/777,128, filed on Feb. 26, 2013, now Pat. No. 8,877,076.

(30) Foreign Application Priority Data

Feb. 29, 2012  (JP) ................................ 2012-044650
Feb. 29, 2012  (JP) ................................ 2012-044651

(Continued)

(51) Int. Cl.
*H01L 21/67*    (2006.01)
*H01L 21/02*    (2006.01)
(Continued)

(52) U.S. Cl.
CPC .... *H01L 21/67023* (2013.01); *H01L 21/0206* (2013.01); *H01L 21/02282* (2013.01);
(Continued)

(58) Field of Classification Search
None
See application file for complete search history.

(56) References Cited

U.S. PATENT DOCUMENTS 4,924,800 A       5/1990   Tanaka .......................... 118/50.1
6,631,726 B1 *  10/2003   Kinoshita ................. B08B 7/00
                                                                          134/1

(Continued)

FOREIGN PATENT DOCUMENTS

CN       101090064 A      12/2007
JP       02-004269        1/1990
(Continued)

OTHER PUBLICATIONS

Machine Generated English Translation of JP10-209023A. Published Aug. 7, 1998.*

(Continued)

*Primary Examiner* — Sylvia MacArthur
(74) *Attorney, Agent, or Firm* — Ostrolenk Faber LLP

(57) ABSTRACT

A substrate treatment apparatus is used for treating a major surface of a substrate with a chemical liquid. The substrate treatment apparatus includes: a substrate holding unit which holds the substrate; a chemical liquid supplying unit having a chemical liquid nozzle which supplies the chemical liquid onto the major surface of the substrate held by the substrate holding unit; a heater having an infrared lamp to be located in opposed relation to the major surface of the substrate held by the substrate holding unit to heat the chemical liquid supplied onto the major surface of the substrate by irradiation with infrared radiation emitted from the infrared lamp, the heater having a smaller diameter than the substrate; and a heater moving unit which moves the heater along the major surface of the substrate held by the substrate holding unit.

11 Claims, 27 Drawing Sheets

(30) Foreign Application Priority Data

| | | |
|---|---|---|
| Mar. 15, 2012 | (JP) | 2012-059259 |
| Mar. 15, 2012 | (JP) | 2012-059260 |
| Jun. 27, 2012 | (JP) | 2012-144295 |

(51) Int. Cl.
*H01L 21/306* (2006.01)
*H01L 21/311* (2006.01)
*C23C 16/48* (2006.01)
*C23C 16/46* (2006.01)

(52) U.S. Cl.
CPC .. *H01L 21/30604* (2013.01); *H01L 21/31111* (2013.01); *H01L 21/6708* (2013.01); *C23C 16/46* (2013.01); *C23C 16/48* (2013.01); *C23C 16/481* (2013.01); *C23C 16/482* (2013.01)

(56) References Cited

U.S. PATENT DOCUMENTS

| | | | |
|---|---|---|---|
| 8,479,753 B2 | 7/2013 | Nanba et al. | 134/137 |
| 2002/0092542 A1 | 7/2002 | Park et al. | 134/1.3 |
| 2003/0140949 A1 | 7/2003 | Sugimoto et al. | 134/33 |
| 2004/0137751 A1 | 7/2004 | Ou-Yang | 438/720 |
| 2005/0089803 A1 | 4/2005 | Bouaidat et al. | 430/312 |
| 2006/0081180 A1 | 4/2006 | Aoki et al. | 118/696 |
| 2006/0207969 A1 | 9/2006 | Sugimoto et al. | 216/58 |
| 2007/0089761 A1 | 4/2007 | Banerjee et al. | 134/34 |
| 2007/0289528 A1 | 12/2007 | Nanba et al. | 118/52 |
| 2009/0145555 A1* | 6/2009 | Sawayama | C23C 16/24 156/345.37 |
| 2010/0101497 A1 | 4/2010 | Izuta et al. | 118/730 |
| 2011/0030737 A1 | 2/2011 | Amano et al. | 134/32 |
| 2011/0155181 A1* | 6/2011 | Inatomi | H01L 21/02052 134/30 |
| 2011/0265822 A1* | 11/2011 | Crowder | H01L 21/67109 134/18 |
| 2015/0013732 A1* | 1/2015 | Negoro | H01L 21/31111 134/57 R |

FOREIGN PATENT DOCUMENTS

| | | |
|---|---|---|
| JP | 03-052221 | 3/1991 |
| JP | 4-10689 | 1/1992 |
| JP | 10-209023 | 8/1998 |
| JP | 11-003846 | 1/1999 |
| JP | 2001-230198 | 8/2001 |
| JP | 2002-222789 | 8/2002 |
| JP | 2002-231674 | 8/2002 |
| JP | 2003-224105 | 8/2003 |
| JP | 2004-259734 | 9/2004 |
| JP | 2004-266089 | 9/2004 |
| JP | 2005-093926 | 4/2005 |
| JP | 2005-251847 A | 9/2005 |
| JP | 2006-508787 | 3/2006 |
| JP | 2006-108304 | 4/2006 |
| JP | 2006-223995 | 8/2006 |
| JP | 2007-81419 | 3/2007 |
| JP | 2008-004878 | 1/2008 |
| JP | 2008-004879 A | 1/2008 |
| JP | 2008-060368 | 3/2008 |
| JP | 2008-103556 | 5/2008 |
| JP | 2008-138904 | 6/2008 |
| JP | 2008-258437 | 10/2008 |
| JP | 2008-270402 | 11/2008 |
| JP | 2008-270402 A | 11/2008 |
| JP | 2009-4597 | 1/2009 |
| JP | 2010-109087 | 5/2010 |
| JP | 2011-54932 | 3/2011 |
| JP | 2011-135002 | 7/2011 |
| JP | 2011-233902 | 11/2011 |

OTHER PUBLICATIONS

Machine Generated English Translation of JP 2008-060368. Published Mar. 13, 2008.*
Machine Generated English Translation of JP 03-052221. Published Mar. 6, 1991.*

* cited by examiner

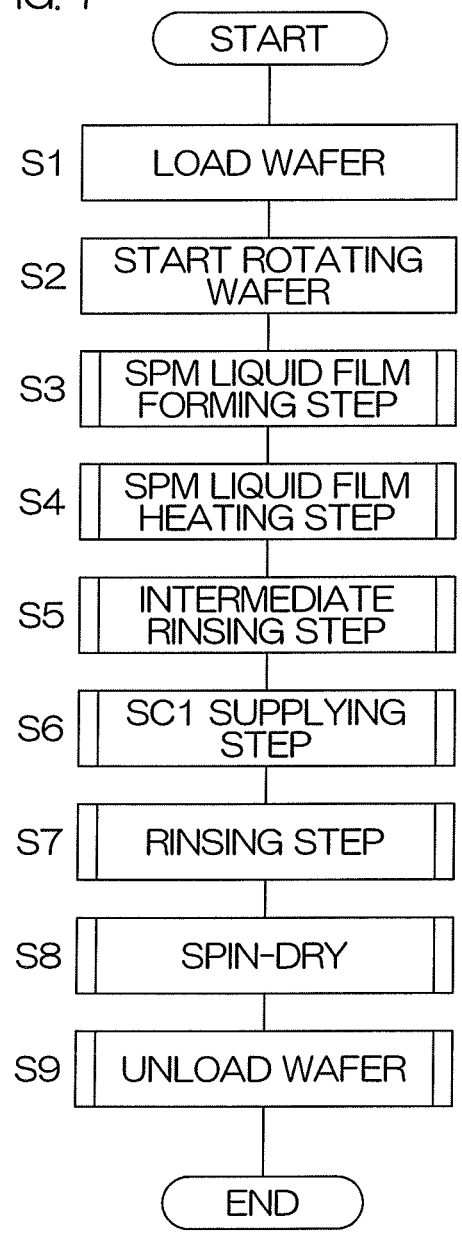

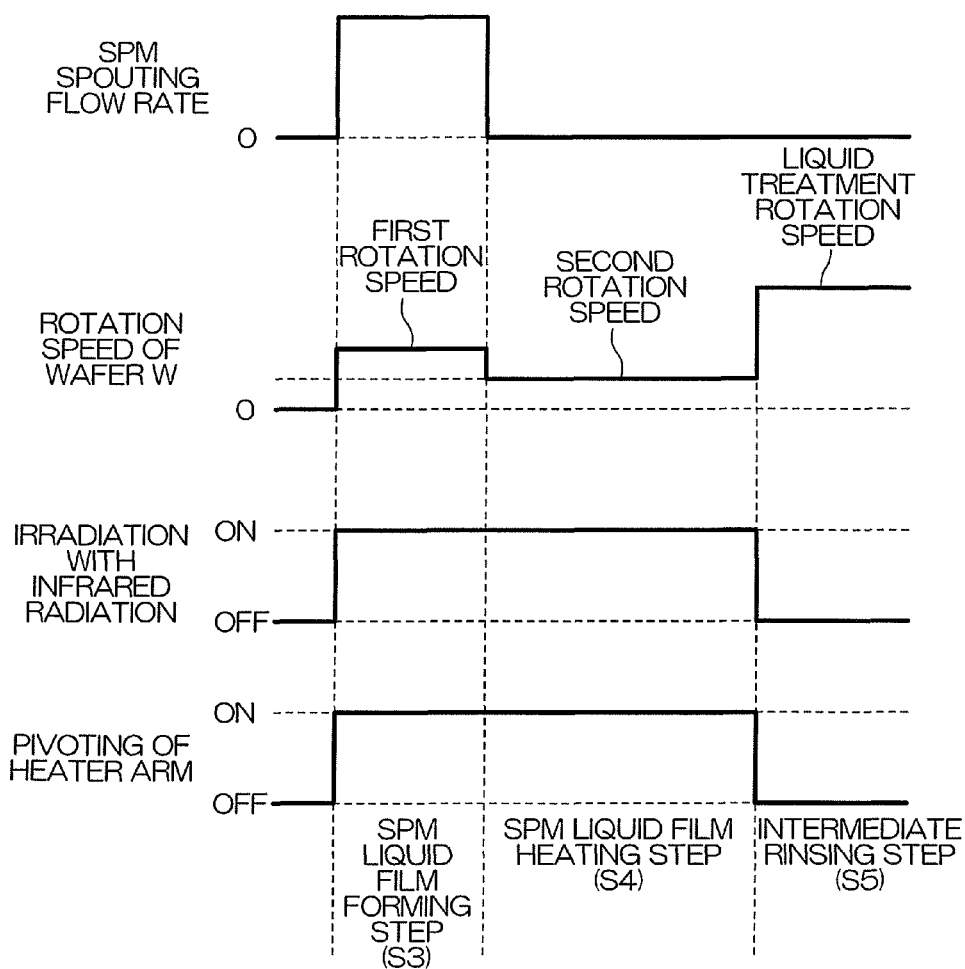

FIRST ROTATION SPEED

SECOND ROTATION SPEED

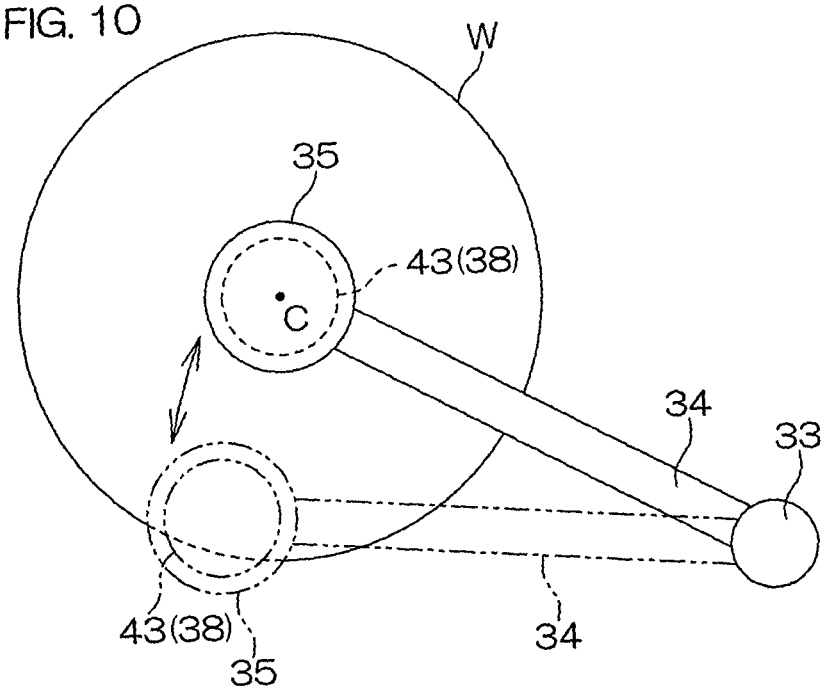

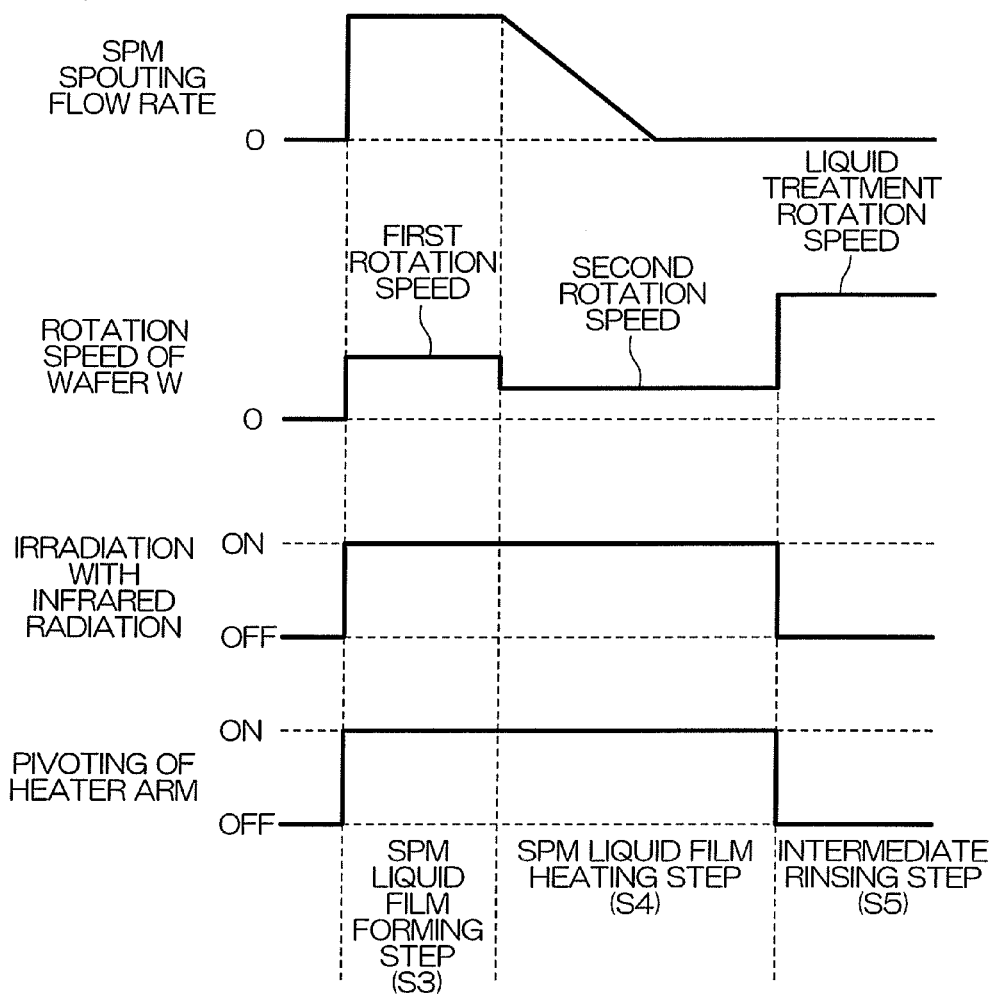

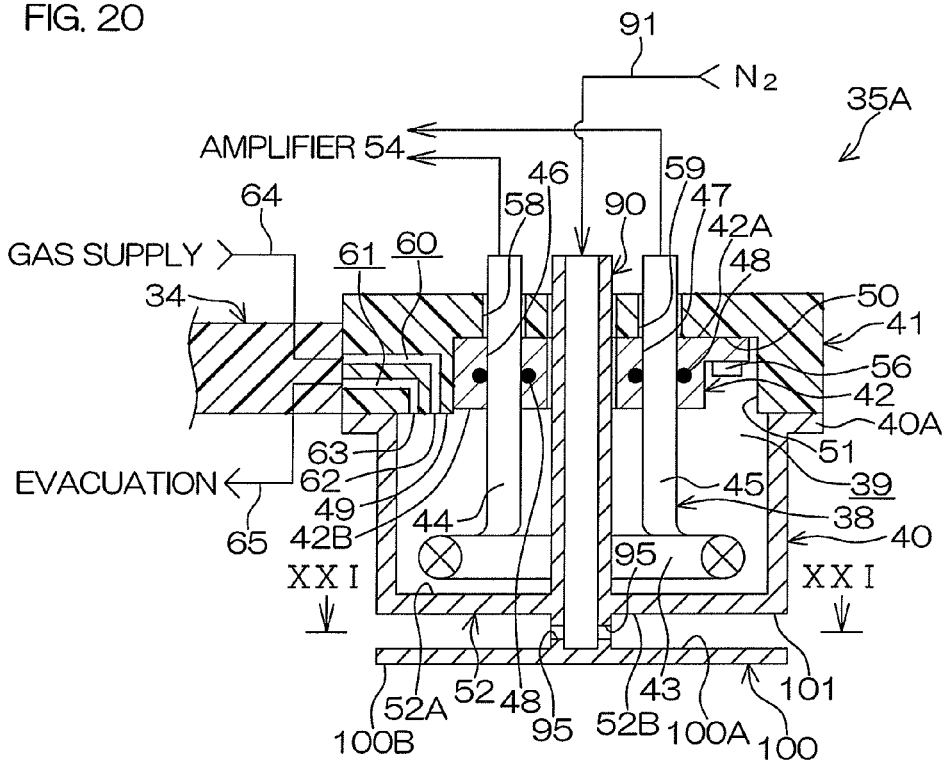

FIRST ROTATION SPEED

SECOND ROTATION SPEED

SUBSTRATE TREATMENT APPARATUS

CROSS-REFERENCE TO RELATED APPLICATIONS

This application is a divisional of U.S. patent application Ser. No. 13/777,128, filed Feb. 26, 2012, incorporated herein by reference, which claims the benefit of Japanese Patent Application Nos. 2012-044650, filed Feb. 29, 2012, JP 2012-044651, filed Feb. 29, 2012, JP 2012-059259, filed Mar. 15, 2012, JP 2012-059260, filed Mar. 15, 2012, and JP 2012-144295, filed Jun. 27, 2012, incorporated herein by reference.

BACKGROUND OF THE INVENTION

1. Field of the Invention

The present invention relates to a substrate treatment apparatus for treating a substrate with a hot chemical liquid. Examples of the substrate to be treated include semiconductor wafers, substrates for liquid crystal display devices, substrates for plasma display devices, substrates for FED (Field Emission Display) devices, substrates for optical disks, substrates for magnetic disks, substrates for magneto-optical disks, substrates for photo masks, ceramic substrates and substrates for solar cells.

2. Description of Related Art

Semiconductor device production processes include the step of locally implanting an impurity (ions) such as phosphorus, arsenic or boron, for example, into a major surface (front surface) of a semiconductor wafer (hereinafter referred to simply as "wafer"). In order to prevent the ion implantation into an unnecessary portion of the wafer, a resist pattern of a photosensitive resin is formed on the front surface of the wafer to mask the unnecessary portion of the wafer with the resist in this step. After the ion implantation, the resist pattern formed on the front surface of the wafer becomes unnecessary and, therefore, a resist removing process is performed for removing the unnecessary resist from the front surface of the wafer.

In a typical example of the resist removing process, the front surface of the wafer is irradiated with oxygen plasma to ash the resist on the front surface of the wafer. Then, a chemical liquid such as a sulfuric acid/hydrogen peroxide mixture (SPM liquid which is a liquid mixture of sulfuric acid and a hydrogen peroxide solution) is supplied to the front surface of the wafer to remove the ashed resist. Thus, the resist is removed from the front surface of the wafer.

However, the irradiation with the oxygen plasma for the ashing of the resist damages a portion of the front surface of the wafer uncovered with the resist (an oxide film of the wafer exposed from the resist pattern).

Therefore, a method of lifting off the resist from the front surface of the wafer by the strong oxidative power of peroxosulfuric acid ($H_2SO_5$) contained in the SPM liquid supplied onto the front surface of the wafer without ashing the resist has recently been attracting attention.

SUMMARY OF THE INVENTION

A resist formed on a wafer ion-implanted at a higher dose is liable to be altered due to carbonization thereof to be thereby hardened.

In order to cause the SPM liquid to exhibit a higher resist lift-off capability, it is necessary to heat the SPM liquid to a liquid temperature of 200° C. or higher. With this higher-temperature SPM liquid, even a resist having a hardened layer in its surface can be removed from the front surface of the wafer without the ashing. By keeping the temperature of the SPM liquid at 200° C. or higher, the resist lift-off efficiency is increased, thereby reducing the time required for the resist lift-off process.

Not only in the resist removing process employing the resist lift-off liquid such as the SPM liquid, but also in a nitride film selective etching process or the like employing hot phosphoric acid, it is preferable to maintain the chemical liquid at a higher temperature to improve the treatment efficiency and reduce the treatment period.

It is therefore an object of the present invention to provide a substrate treatment apparatus which is capable of advantageously treating a major surface of a substrate with a chemical liquid by maintaining the chemical liquid at a higher temperature on the major surface of the substrate.

A first aspect of the present invention provides a substrate treatment apparatus to be used for treating a major surface of a substrate with a chemical liquid, the apparatus including: a substrate holding unit which holds the substrate; a chemical liquid supplying unit having a chemical liquid nozzle which supplies the chemical liquid onto the major surface of the substrate held by the substrate holding unit; a heater having an infrared lamp to be located in opposed relation to the major surface of the substrate held by the substrate holding unit to heat the chemical liquid supplied onto the major surface of the substrate by irradiation with infrared radiation emitted from the infrared lamp, the heater having a smaller diameter than the substrate; and a heater moving unit which moves the heater along the major surface of the substrate held by the substrate holding unit.

With this arrangement, the heater is located in opposed relation to the major surface of the substrate, and the infrared radiation is emitted from the infrared lamp, whereby the chemical liquid is heated in a region of the major surface of the substrate opposed to the heater. Simultaneously with the heating by the heater, the heater is moved along the major surface of the substrate. Therefore, the region of the major surface of the substrate opposed to the heater is moved along a predetermined path, so that the entire major surface of the substrate can be heated by the heater. Thus, all the chemical liquid present on the major surface of the substrate can be maintained at a higher temperature. As a result, the entire major surface of the substrate can be advantageously and evenly treated with the chemical liquid.

Since the chemical liquid present on the major surface of the substrate can be maintained at a higher temperature, the treatment with the chemical liquid can be promoted, thereby reducing the period required for the treatment with the chemical liquid.

According to an embodiment of the present invention, the substrate treatment apparatus further includes a heater head provided separately from the chemical liquid nozzle and including the heater, wherein the heater moving unit includes a heater head moving unit which moves the heater head.

With this arrangement, the heater head including the heater is provided separately from the chemical liquid nozzle. Where the heater and the chemical liquid nozzle are retained by a common retention head, only the chemical liquid just supplied onto the major surface of the substrate from the chemical liquid nozzle is heated by the heater. Where the heater head is provided separately from the chemical liquid nozzle, on the other hand, the heater head and the chemical liquid nozzle can be moved in different ways individually set for the heater head and the chemical liquid nozzle. In this case, the chemical liquid can be heated even if the temperature thereof is reduced after a lapse of time from the supply of the chemical liquid onto the major surface of the substrate. Therefore, the chemical liquid present on the major surface of the substrate can be properly maintained at a higher temperature.

In another embodiment of the present invention, the heater head includes a lamp housing which is a bottomed container accommodating the infrared lamp.

With this arrangement, the periphery of the infrared lamp is covered with the lamp housing. Therefore, an atmosphere containing droplets of the chemical liquid around the major surface of the substrate can be prevented from adversely influencing the infrared lamp. Since the chemical liquid droplets are prevented from adhering to a tube wall of the infrared lamp, the amount of the infrared radiation emitted from the infrared lamp can be stably maintained for a longer period of time.

In this case, the heater may include a bottom plate of the lamp housing, which is heated by the irradiation with the infrared radiation emitted from the infrared lamp.

The bottom plate preferably has a flat opposed surface to be opposed to the major surface of the substrate. In this case, an atmosphere present between the opposed surface and the major surface of the substrate can be isolated from a peripheral environment, whereby the temperature of the atmosphere can be maintained. Thus, the temperature of the chemical liquid is substantially prevented from being lowered in a region of the major surface opposed to the opposed surface, so that the temperature of the chemical liquid present in this region can be further increased.

The lamp housing may be formed of quartz. The lamp housing, which receives the infrared radiation emitted from the infrared lamp, is liable to be heated to a higher temperature. Where the lamp housing is formed of quartz that is heat-resistant and highly transparent to the infrared radiation, therefore, the breakage and the melt-down of the lamp housing are less liable to occur.

The heater head preferably further includes a lid which closes an opening of the lamp housing.

With this arrangement, the opening of the lamp housing is closed by the lid. Therefore, the atmosphere containing the chemical liquid droplets is reliably prevented from entering the lamp housing to be thereby more reliably prevented from adversely influencing the infrared lamp.

In this case, the lid is not heated by the infrared lamp, if the lid and the infrared lamp are sufficiently spaced from each other. Therefore, the lid may be formed of a resin material.

The heater may further include an opposed member to be located between the major surface of the substrate and the infrared lamp and heated by the irradiation with the infrared radiation emitted from the infrared lamp.

The opposed member preferably has a flat opposed surface to be opposed to the major surface of the substrate. In this case, an atmosphere present between the opposed surface and the major surface of the substrate can be isolated from a peripheral environment, whereby the temperature of the atmosphere can be maintained. Thus, the temperature of the chemical liquid is substantially prevented from being lowered in a region of the major surface of the substrate opposed to the opposed member, whereby the chemical liquid present in this region can be maintained at a further higher temperature.

The infrared lamp may have an annular shape defined about a center axis perpendicular to the major surface of the substrate. In this case, the infrared lamp extends along the major surface of the substrate, so that a greater flow amount of the chemical liquid can be irradiated with the infrared radiation.

The chemical liquid may be a resist lift-off liquid. In this case, all the resist lift-off liquid present on the major surface of the substrate can be maintained at a higher temperature, so that the resist can be advantageously and evenly removed from the entire major surface of the substrate. Since the resist lift-off liquid present on the major surface of the substrate can be maintained at a higher temperature, even a resist having a hardened layer can be removed from the major surface of the substrate without the ashing. Without the need for the ashing of the resist, it is possible to eliminate the problem of the damage to the major surface of the substrate due to the ashing.

According to further another embodiment of the present invention, the substrate holding unit is adapted to horizontally hold the substrate, and the substrate treatment apparatus further includes a rotation unit which rotates the substrate held by the substrate holding unit about a predetermined vertical axis, and a control unit. The control unit performs: a liquid film forming step of controlling the chemical liquid supplying unit to supply the chemical liquid from the chemical liquid nozzle onto the major surface of the substrate held by the substrate holding unit, and controlling the rotation unit to rotate the substrate held by the substrate holding unit at a first rotation speed, whereby a liquid film of the chemical liquid is formed on the major surface of the substrate as covering the major surface; a liquid film retaining step of, after the liquid film forming step, controlling the rotation unit to rotate the substrate held by the substrate holding unit at a second rotation speed lower than the first rotation speed, whereby the chemical liquid film formed on the major surface of the substrate is retained on the major surface of the substrate; a liquid film heating step of, simultaneously with the liquid film retaining step, controlling the heater and the heater moving unit to locate the heater in opposed relation to the major surface of the substrate held by the substrate holding unit and heat the chemical liquid film retained on the major surface of the substrate by the heater; and a heater moving step of, simultaneously with the liquid film retaining step and the liquid film heating step, moving the heater along the major surface of the substrate.

With this arrangement, the chemical liquid is supplied at a first flow rate onto the major surface of the substrate held by the substrate holding unit, and the substrate is rotated at the first rotation speed, whereby the chemical liquid film is formed on the major surface of the substrate as covering the major surface. Thereafter, the rotation speed of the substrate is reduced to the second rotation speed, whereby the chemical liquid film is continuously retained on the major surface of the substrate. With the liquid film thus retained, the heater is located in opposed relation to the major surface of the substrate and the heating by the heater is started, whereby the chemical liquid film present in the region of the major surface of the substrate opposed to the heater is heated. Simultaneously with the heating by the heater, the heater is moved along the major surface of the substrate, whereby the region of the major surface of the substrate opposed to the heater is moved. Therefore, the entire major surface of the substrate can be heated by the heater. Thus, almost all the chemical liquid present on the major surface of the substrate can be heated. In this case, the chemical liquid can be maintained at a higher temperature on the entire major surface of the substrate. As a result, the major surface of the substrate can be advantageously and evenly treated with the chemical liquid.

A second aspect of the present invention provides a substrate treatment method for removing a resist from a substrate surface, the method including: a liquid film forming step of supplying a resist lift-off liquid at a predetermined flow rate onto a major surface of a substrate held by a substrate holding unit, and rotating the substrate at a first rotation speed, whereby a liquid film of the resist lift-off liquid is formed on the major surface of the substrate as covering the major surface; a liquid film retaining step of, after the liquid film forming step, rotating the substrate held by the substrate holding unit at a second rotation speed lower than the first rotation speed, whereby the resist lift-off liquid film formed on the major surface of the substrate is retained on the major surface of the substrate; a liquid film heating step of, simultaneously with the liquid film retaining step, locating a heater in opposed relation to the major surface of the substrate held by the substrate holding unit and heating the resist lift-off liquid film retained on the major surface of the substrate by the heater; and a heater moving step of, simultaneously with the liquid film retaining step and the liquid film heating step, moving the heater along the major surface of the substrate.

The resist lift-off liquid supplied to the substrate is liable to be influenced by the ambient temperature and the substrate temperature. After the resist lift-off liquid reaches the front surface of the substrate, the temperature of the resist lift-off liquid is significantly reduced with time.

A conceivable approach to maintaining the resist lift-off liquid present on the front surface of the substrate at a higher temperature (e.g., 200° C. or higher) is to continuously supply a resist lift-off liquid having a liquid temperature of 200° C. or higher onto the substrate. However, this approach is liable to increase the use amount of the resist lift-off liquid. Therefore, where the SPM liquid is used as the resist lift-off liquid, for example, the use amount of sulfuric acid is also increased. In addition, it is necessary to maintain the temperature of sulfuric acid at a higher temperature (e.g., 180° C. to 195° C.) before mixing in order to prepare the SPM liquid having a liquid temperature increased to 200° C. or higher. This increases the heat amount required for increasing the temperature of sulfuric acid as well as the use amount of sulfuric acid, thereby increasing costs required for the treatment of a single substrate.

According to the second aspect of the present invention, the substrate treatment method makes it possible to advantageously remove the resist from the major surface of the substrate while reducing the consumption of the resist lift-off liquid.

In the method according to the second aspect of the present invention, the resist lift-off liquid is supplied at the predetermined flow rate onto the major surface of the substrate held by the substrate holding unit, and the substrate is rotated at the first rotation speed, whereby the resist lift-off liquid film is formed on the major surface of the substrate as covering the major surface. Thereafter, the rotation speed of the substrate is reduced to the second rotation speed, whereby the resist lift-off liquid film is continuously retained over the major surface of the substrate. With the liquid film thus retained, the heater is located in opposed relation to the major surface of the substrate, and the heating by the heater is started, whereby the resist lift-off liquid is heated in a region of the major surface of the substrate opposed to the heater. Simultaneously with the heating by the heater, the heater is moved along the major surface of the substrate, whereby the region of the major surface of the substrate opposed to the heater is moved. Therefore, the entire major surface of the substrate can be heated by the heater. Thus, all the resist lift-off liquid in the resist lift-off liquid film formed on the major surface of the substrate can be heated. As a result, the resist can be advantageously and evenly removed from the entire major surface of the substrate.

After the resist lift-off liquid film is formed, the supply of the resist lift-off liquid to the substrate may be stopped, or the supply flow rate of the resist lift-off liquid may be reduced. Therefore, the consumption of the resist lift-off liquid can be reduced in the resist removing process. In this case, the heat amount required for increasing the temperature of the resist lift-off liquid can be reduced. Thus, the costs required for performing the resist removing process on the single substrate can be reduced.

Further, the resist lift-off liquid present on the major surface of the substrate can be maintained at a higher temperature, thereby promoting the lift-off of the resist. Thus, the time required for the resist removing process can be reduced.

According to still another embodiment of the present invention, the supply of the resist lift-off liquid onto the major surface of the substrate is stopped in the liquid film retaining step. In this case, the resist lift-off liquid is not supplied onto the major surface of the substrate when the resist lift-off liquid present on the major surface of the substrate is heated. Therefore, the consumption of the resist lift-off liquid can be reduced in the resist removing process.

According to further another embodiment of the present invention, the method further includes a lift-off liquid supplying step of, simultaneously with the liquid film retaining step, supplying the resist lift-off liquid at a per-unit-time flow rate lower than the predetermined flow rate onto the major surface of the substrate. In this method, the resist lift-off liquid is newly supplied to the resist lift-off liquid film when the resist lift-off liquid film is heated. Thus, the resist lift-off liquid film is stably retained on the major surface of the substrate. Since the resist lift-off liquid is supplied at a lower flow rate, the consumption of the resist lift-off liquid can be reduced in the resist removing process.

The lift-off liquid supplying step may include the step of supplying the resist lift-off liquid at the predetermined flow rate to the substrate held by the substrate holding unit at the start of the liquid film retaining step, and then (gradually) reducing the flow rate of the resist lift-off liquid to be supplied to the substrate as the liquid film retaining step proceeds.

Alternatively, the lift-off liquid supplying step may include the step of intermittently supplying the resist lift-off liquid to the substrate held by the substrate holding unit.

The liquid film heating step and the heater moving step may be performed simultaneously with the liquid film forming step.

A third aspect of the present invention provides a substrate treatment method for removing a resist from a substrate surface, the method including: a liquid film forming step of supplying a resist lift-off liquid onto a major surface of a substrate held by a substrate holding unit and rotating the substrate, whereby a liquid film of the resist lift-off liquid is formed on the major surface of the substrate as covering the major surface; a liquid film thinning step of, after the liquid film forming step, rotating the substrate held by the substrate holding unit at a first rotation speed without supplying the resist lift-off liquid onto the major surface of the substrate, whereby the resist lift-off liquid film formed on the major surface of the substrate is thinned; a liquid film retaining step of, after the liquid film thinning step, rotating the substrate held by the substrate holding unit at a second rotation speed lower than the first rotation speed without supplying the resist lift-off liquid onto the major surface of the substrate, whereby the resist lift-off liquid film formed on the major surface of the substrate is retained on the major surface of the substrate; and a liquid film heating step of, simultaneously with the liquid film retaining step, heating at least one of the substrate held by the substrate holding unit and the resist lift-off liquid film retained on the major surface of the substrate by a heater.

A resist formed on a substrate ion-implanted at a higher dose is liable to be altered (hardened). An exemplary method for causing an SPM liquid (an example of the resist lift-off liquid) to exhibit a higher resist lift-off capability is to heat the SPM liquid on the front surface of the substrate, particularly around an interface between the front surface of the substrate and the SPM liquid, to a higher temperature (e.g., 200° C. or higher). With this method, even a resist having a hardened layer in its surface can be removed from the front surface of the substrate without the ashing.

A conceivable approach to maintaining the SPM liquid present around the interface between the front surface of the substrate and the SPM liquid at a higher temperature is to continuously supply a hot SPM liquid. However, this approach is likely to increase the use amount of the SPM liquid.

The inventors of the present invention contemplate a method of heating the resist lift-off liquid film by a heater located in opposed relation to the major surface of the substrate while covering the entire major surface of the substrate with the resist lift-off liquid film. This method makes it possible to remove the hardened resist from the substrate while reducing the consumption of the resist lift-off liquid. In addition, it is possible to significantly increase the resist lift-off efficiency, thereby reducing the time required for the resist removing process.

On the other hand, the thickness of the resist lift-off liquid film present on the major surface of the substrate is increased, as the rotation speed of the substrate is reduced. If the resist lift-off liquid film has a greater thickness, it is difficult to sufficiently heat the resist lift-off liquid film around the interface between the substrate and the resist lift-off liquid film, making it impossible to properly lift off the hardened resist. In addition, the resist lift-off efficiency is reduced. As a result, a longer period is required for the resist removing process.

If the resist lift-off liquid film has a greater thickness, the amount of the resist lift-off liquid present on the major surface of the substrate is increased. Therefore, mist of the resist lift-off liquid is liable to be generated in a greater amount around the major surface of the substrate due to the heating by the heater. The resist lift-off liquid mist is liable to adhere to peripheral components. This may result in generation of particles. Therefore, the generation of the mist due to the heating by the heater is desirably suppressed as much as possible.

According to the third aspect of the present invention, the substrate treatment method makes it possible to advantageously heat the resist lift-off liquid film around the interface between the substrate and the resist lift-off liquid film while covering the entire major surface of the substrate with the resist lift-off liquid film.

According to the third aspect of the present invention, the substrate treatment method suppresses the generation of the mist of the resist lift-off liquid when the resist lift-off liquid film present on the major surface of the substrate is heated by the heater.

In the method according to the third aspect of the present invention, the liquid film thinning step is performed after the liquid film forming step before the start of the liquid film retaining step. In the liquid film thinning step, the substrate is rotated at the first rotation speed without supplying the resist lift-off liquid onto the major surface of the substrate. Thus, the resist lift-off liquid present on the major surface of the substrate receives a centrifugal force generated by the rotation of the substrate to be thereby partly drained from a peripheral edge of the substrate. In this manner, the thickness of the resist lift-off liquid film is reduced (the liquid film is thinned). Then, at least one of the thinned liquid film and the substrate is heated by the heater. Thus, at least one of the substrate and the resist lift-off liquid can be efficiently heated. As a result, the time required for the entire resist lift-off process can be reduced.

After completion of the liquid film forming step, the supply of the resist lift-off liquid to the substrate is stopped, so that the consumption of the resist lift-off liquid in the resist removing process can be reduced. This makes it possible to advantageously remove the resist from the major surface of the substrate while reducing the consumption of the resist lift-off liquid.

The method may further include an opposing step of, before the liquid film heating step, locating the heater in opposed relation to the major surface of the substrate.

The method may further include a heater moving step of, simultaneously with the liquid film heating step, moving the heater along the major surface of the substrate. In this method, a region of the major surface of the substrate opposed to the heater can be changed by moving the heater along the major surface of the substrate during the heating by the heater. This makes it possible to heat the entire major surface of the substrate. Therefore, the resist can be advantageously and evenly removed from the entire major surface of the substrate.

The heater moving step may include a keeping-still step of moving the heater along the major surface of the substrate over the major surface of the substrate and, after the movement of the heater, keeping the heater still above the major surface of the substrate.

The heater moving step may include a continuously moving step of continuously moving the heater along the major surface of the substrate over the major surface of the substrate while changing a movement direction of the heater.

In the liquid film forming step, the substrate may be rotated at the second rotation speed. In this case, the entire major surface of the substrate can be covered with the resist lift-off liquid film. This ensures complete coverage of the major surface of the substrate with the resist lift-off liquid.

Alternatively, the substrate may be rotated at a third rotation speed that is higher than the second rotation speed and lower than the first rotation speed in the liquid film forming step. In this case, the entire major surface of the substrate can be covered with the resist lift-off liquid film. This ensures complete coverage of the major surface of the substrate with the resist lift-off liquid.

Further, the substrate may be rotated at a fourth rotation speed that is lower than the second rotation speed in the liquid film forming step. In this case, the entire major surface of the substrate can be covered with the resist lift-off liquid film. This ensures complete coverage of the major surface of the substrate with the resist lift-off liquid. Thus, it is possible to advantageously heat the resist lift-off liquid film around the interface between the substrate and the resist lift-off liquid film while covering the entire major surface of the substrate with the resist lift-off liquid film.

In the liquid film forming step, the substrate may be rotated at the first rotation speed.

Further, the liquid film heating step may be performed simultaneously with the liquid film forming step.

Furthermore, the liquid film heating step may be performed simultaneously with the liquid film thinning step.

A fourth aspect of the present invention provides a substrate treatment apparatus which includes: a treatment chamber; a substrate holding unit provided in the treatment chamber to hold a substrate; a chemical liquid supplying unit which supplies a chemical liquid onto a major surface of the substrate held by the substrate holding unit; an infrared lamp to be located in opposed relation to the major surface of the substrate held by the substrate holding unit to heat the chemical liquid supplied onto the major surface of the substrate by irradiation with infrared radiation emitted from the infrared lamp; an annular gas outlet port to be located in opposed relation to the major surface of the substrate held by the substrate holding unit to radially spout a gas along the major surface of the substrate; and a retention head which retains the infrared lamp and the gas outlet port together.

The inventors of the present invention contemplate a method of heating the chemical liquid supplied onto the major surface of the substrate during a treatment with the chemical liquid in order to further increase the temperature of the chemical liquid supplied onto the major surface of the substrate. More specifically, the inventors contemplate a method of heating the chemical liquid present on the major surface of the substrate with the use of the infrared lamp located in spaced opposed relation to the major surface of the substrate.

However, the chemical liquid is liable to be rapidly heated by the infrared lamp to generate a great amount of mist of the chemical liquid around the major surface of the substrate. In a substrate drying step, the chemical liquid mist is liable to adhere to the major surface of the substrate to thereby contaminate the major surface of the substrate.

A conceivable approach to this problem is to accommodate the substrate holding unit in a cup and provide an evacuation port in the cup for evacuation of the cup to thereby expel an internal atmosphere of the cup. If a greater amount of the chemical liquid mist is generated around the major surface of the substrate, however, there is a possibility that an atmosphere containing the chemical liquid mist cannot be reliably prevented from flowing out of the cup.

According to the fourth aspect of the present invention, the substrate treatment apparatus prevents the atmosphere containing the chemical liquid mist from diffusing into a peripheral environment around the major surface of the substrate even if the chemical liquid present on the major surface of the substrate is heated by the infrared lamp.

With the arrangement according to the fourth aspect of the present invention, the infrared radiation is emitted from the infrared lamp located in opposed relation to the major surface of the substrate. Therefore, the chemical liquid is heated in a region of the major surface of the substrate opposed to the infrared lamp. Thus, the chemical liquid can be heated to a further higher temperature.

Further, the gas is radially spouted along the major surface of the substrate from the annular gas outlet port. Thus, a gas curtain is formed in opposed relation to the major surface of the substrate. The gas curtain isolates an inside space of the gas curtain including a space accommodating the substrate holding unit from an outside space of the gas curtain.

The chemical liquid present on the major surface of the substrate is liable to be rapidly heated to generate a great amount of the chemical liquid mist around the major surface of the substrate.

However, the atmosphere containing the chemical liquid mist can be confined in the inside space of the gas curtain, because the gas curtain formed by the gas spouted from the annular gas outlet port isolates the inside space from the outside space of the gas curtain. This prevents the atmosphere from diffusing into the peripheral environment around the major surface of the substrate (the outside space of the gas curtain), thereby preventing contamination of the treatment chamber.

The gas outlet port and the infrared lamp, which are retained together, can be disposed close to each other. Thus, the atmosphere containing the chemical liquid mist can be efficiently confined in the inside space of the gas curtain.

The substrate treatment apparatus may further include a retention head moving unit which moves the retention head along the major surface of the substrate held by the substrate holding unit. In this case, the infrared lamp has a smaller diameter than the substrate held by the substrate holding unit.

With this arrangement, the retention head is moved along the major surface of the substrate simultaneously with the heating by the infrared lamp and the spouting of the gas from the gas outlet port. The region of the major surface of the substrate opposed to the infrared lamp is moved along a predetermined path, so that the entire major surface of the substrate can be heated by the infrared lamp.

As the infrared lamp is moved, the gas outlet port is also moved along the major surface of the substrate. Thus, the gas outlet port and the infrared lamp can be constantly located close to each other. Therefore, the atmosphere containing the chemical liquid mist can be efficiently confined in the inside space of the gas curtain irrespective of the position of the retention head.

Since a gas spouting direction in which the gas is spouted from the gas outlet port coincides with a retention head moving direction in which the retention head is moved, the gas curtain assumes a constant state irrespective of the position of the retention head. Thus, the peripheral environment around the substrate can be isolated from the internal space of the treatment chamber irrespective of the position of the retention head.

The substrate treatment apparatus may further include a cup which accommodates the substrate holding unit and has an opening provided at a position to be opposed to the major surface of the substrate held by the substrate holding unit and having a size such that the substrate can be passed through the opening. In this case, the gas outlet port may be disposed in the opening, and adapted to spout the gas toward an open end of the cup.

The opening is provided in the cup at the position to be opposed to the major surface of the substrate held by the substrate holding unit, and the size of the opening is such that the substrate can be passed through the opening. Therefore, the substrate can be loaded into and unloaded out of the cup through the opening. With the provision of the opening, on the other hand, an inside space and an outside space of the cup communicate with each other, so that the atmosphere can flow between the inside space and the outside space of the cup.

With the arrangement described above, the gas is spouted from the gas outlet port disposed in the opening toward the open end of the cup along the opening of the cup. Thus, the gas curtain is formed to close the opening of the cup. Therefore, the internal atmosphere of the cup can be confined in the inside space of the gas curtain to be thereby prevented from flowing out of the cup. Thus, the atmosphere containing the chemical liquid mist generated in the cup can be prevented from flowing out into the treatment chamber.

The substrate treatment apparatus may further include a gas flow pipe through which the gas flows to be spouted from an outlet hole thereof extending thicknesswise through a pipe wall thereof, a gas supplying unit which supplies the gas to the gas flow pipe, and an upper baffle plate and a lower baffle plate which deflect the gas flowing through the gas flow pipe and spouted from the outlet hole to form a gas stream flowing along the major surface of the substrate held by the substrate holding unit. In this case, the gas stream formed by deflecting the gas by the pair of baffle plates is supplied to the gas outlet port.

With this arrangement, the gas supplied to the gas flow pipe flows through the gas flow pipe to be spouted from the outlet hole. Then, the gas spouted from the outlet hole is deflected into the gas stream flowing radially along the major surface of the substrate by the pair of baffle plates to be supplied to the gas outlet port. Thus, the gas can be spouted radially from the gas outlet port along the major surface of the substrate.

The outlet hole may include a plurality of separate outlet holes which are provided circumferentially of the gas flow pipe in circumferentially spaced relation.

The outlet hole may have an annular shape extending circumferentially of the gas flow pipe.

The infrared lamp may have an annular shape surrounding the gas flow pipe, and the pipe wall of the gas flow pipe may be heated by the irradiation with the infrared radiation emitted from the infrared lamp to heat the gas flowing through the gas flow pipe.

With this arrangement, the gas is heated when flowing through the gas flow pipe, and the gas heated to a higher temperature is spouted from the outlet hole. Therefore, the gas curtain has a higher temperature. Thus, the chemical liquid present on the major surface of the substrate held by the substrate holding unit is substantially prevented from being cooled. As a result, the chemical liquid present on the major surface of the substrate can be kept hot.

The pipe wall of the gas flow pipe may be formed of quartz. Supposedly, the pipe wall of the gas flow pipe is liable to be heated to a higher temperature by the infrared radiation received from the infrared lamp. Where the pipe wall of the gas flow pipe is formed of heat-resistant quartz, therefore, the breakage and the melt-down of the gas flow pipe are unlikely to occur.

The retention head may include a lamp housing which accommodates the infrared lamp. In this case, the pipe wall of the gas flow pipe may be formed integrally with the lamp housing and the lower baffle plate.

The lower baffle plate may be supported by the gas flow pipe.

The substrate treatment apparatus may further include a suction pipe having a suction port and inserted in the gas flow pipe, and a suction unit which sucks an inside of the suction pipe. The gas flow pipe and the suction pipe may be configured in a double pipe structure such that the suction pipe is inserted in the gas flow pipe. A distal end portion of the suction pipe preferably extends through the lower baffle plate to be open as the suction port.

With this arrangement, the suction port is closely opposed to the major surface of the substrate when a lower surface of the lower baffle plate is located in closely opposed relation to the major surface of the substrate. When the inside of the suction port is sucked in this state, an atmosphere present between the lower surface of the lower baffle plate and the major surface of the substrate is sucked, so that a space defined between the lower surface of the lower baffle plate and the major surface of the substrate has a reduced pressure.

Where the infrared lamp opposed to the major surface of the substrate is used to heat the chemical liquid present on the major surface of the substrate, there is a possibility that the chemical liquid is rapidly heated to cause significant convection around the major surface of the substrate. As the convection is increased, the amount of heat escaping from the chemical liquid present on the major surface of the substrate is increased. Therefore, the chemical liquid present on the major surface of the substrate is likely to be cooled.

Since the space defined between the lower surface of the lower baffle plate and the major surface of the substrate has a reduced pressure, it is possible to substantially prevent the significant convention from occurring in the space defined between the lower surface of the lower baffle plate and the major surface of the substrate. This reduces the heat amount to be removed from the chemical liquid by the convection, thereby substantially preventing the cooling of the chemical liquid present on the major surface of the substrate. Thus, the chemical liquid present on the major surface of the substrate can be kept hot.

Further, the atmosphere containing the chemical liquid mist can be sucked from the suction port to be thereby expelled from the space defined between the lower baffle plate and the major surface of the substrate. This reduces the amount of the chemical liquid mist present around the major surface of the substrate, thereby effectively suppressing the diffusion of the atmosphere containing the chemical liquid mist into the treatment chamber.

The chemical liquid may be a resist lift-off liquid. In this case, the resist lift-off liquid present on the major surface of the substrate can be heated around an interface between the major surface of the substrate and the resist lift-off liquid. This promotes a reaction between a resist present on the major surface of the substrate and the resist lift-off liquid. Therefore, the resist can be advantageously removed from the entire major surface of the substrate. Even a resist having a hardened layer can be removed from the major surface of the substrate without ashing. Without the need for the ashing of the resist, the major surface of the substrate is free from the damage due to the ashing.

A fifth aspect of the present invention provides a substrate treatment apparatus including: a substrate holding unit which holds a substrate; a chemical liquid flow pipe through which a chemical liquid is supplied onto a major surface of the substrate; a chemical liquid supplying unit which supplies the chemical liquid to the chemical liquid flow pipe; a heater having an annular infrared lamp surrounding the chemical liquid flow pipe to be located in opposed relation to the major surface of the substrate held by the substrate holding unit for heating the chemical liquid supplied onto the major surface of the substrate by irradiation with infrared radiation emitted from the infrared lamp, the heater having a smaller diameter than the substrate; a retention head which retains the heater and the chemical liquid flow pipe together; and a retention head moving unit which moves the retention head along the major surface of the substrate held by the substrate holding unit; wherein the chemical liquid flowing through the chemical liquid flow pipe is heated by the irradiation with the infrared radiation emitted from the infrared lamp.

With this arrangement, the chemical liquid flowing through the chemical liquid flow pipe surrounded by the infrared lamp is heated by the irradiation with the infrared radiation emitted from the infrared lamp. Therefore, the chemical liquid flowing through the chemical liquid flow pipe to be thereby heated to a higher temperature is supplied onto the major surface of the substrate.

Further, the heater is located in opposed relation to the major surface of the substrate, and the infrared radiation is emitted from the infrared lamp, whereby the chemical liquid is heated in a region of the major surface of the substrate opposed to the heater. Simultaneously with the heating by the heater, the retention head is moved along the major surface of the substrate. Thus, the region of the major surface of the substrate opposed to the heater is moved along a predetermined path, so that the entire major surface of the substrate can be heated by the heater.

Therefore, the chemical liquid flowing through the chemical liquid flow pipe to be thereby heated to a higher temperature is further heated by the heater after being supplied onto the major surface of the substrate. Thus, the chemical liquid present on the major surface of the substrate can be maintained at a higher temperature. As a result, the entire major surface of the substrate can be advantageously and evenly treated with the chemical liquid. Since the chemical liquid present on the major surface of the substrate can be maintained at a higher temperature, it is possible to promote the treatment with the chemical liquid, thereby reducing the time required for the treatment with the chemical liquid.

A pipe wall of the chemical liquid flow pipe may be heated to a higher temperature by the irradiation with the infrared radiation emitted from the infrared lamp to heat the chemical liquid flowing through the chemical liquid flow pipe.

The chemical liquid flow pipe preferably has a chemical liquid outlet port from which the chemical liquid is spouted onto the major surface of the substrate held by the substrate holding unit. With this arrangement, the chemical liquid flowing through the chemical liquid flow pipe is thereafter supplied onto the major surface of the substrate. Therefore, the chemical liquid just heated to a higher temperature while flowing through the chemical liquid flow pipe can be supplied onto the major surface of the substrate.

The substrate treatment apparatus may further include an outer pipe surrounding the chemical liquid flow pipe and fixed to the chemical liquid flow pipe to define a gas flow passage between the chemical liquid flow pipe and the outer pipe and define a gas outlet port between the chemical liquid flow pipe and a distal end of the outer pipe so that a gas flows through the gas flow passage to be spouted from the gas outlet port. Further, the chemical liquid spouted from the chemical liquid outlet port and the gas spouted from the gas outlet port may be mixed together to form droplets of the chemical liquid.

With this arrangement, the chemical liquid flowing through the chemical liquid flow pipe to be thereby heated is spouted from the chemical liquid outlet port. Therefore, minute droplets of the chemical liquid can be generated by mixing the chemical liquid spouted from the chemical liquid outlet port and the gas spouted from the gas outlet port together. The temperature of the chemical liquid supplied onto the major surface of the substrate in the form of minute liquid droplets is easily increased by the heating with the heater. Thus, the chemical liquid present on the major surface of the substrate can be maintained at a higher temperature.

Since the chemical liquid in the form of minute liquid droplets is easily evaporated, it is also conceivable to evaporate the chemical liquid during the mixing. In this case, the evaporated chemical liquid (i.e., a gas containing a chemical liquid component) can be supplied onto the major surface of the substrate. The evaporated chemical liquid has a temperature higher than the boiling point of the chemical liquid, so that the chemical liquid present on the major surface of the substrate can be maintained at a higher temperature.

According to still another embodiment of the present invention, the retention head includes a lamp housing which is a bottomed container accommodating the infrared lamp and has a bottom plate having horizontal upper and lower surfaces, and the chemical liquid flow pipe has an opening opposed to the upper surface of the bottom plate in the lamp housing. Further, the bottom plate has a multiplicity of chemical liquid outlet ports vertically extending through the bottom plate.

With this arrangement, the chemical liquid flowing through the chemical liquid flow pipe is spouted from the opening and then received by the bottom plate of the lamp housing. The chemical liquid received by the bottom plate of the lamp housing is retained on the bottom plate before being spouted from the chemical liquid outlet ports. The chemical liquid retained on the bottom plate is further heated by the irradiation with the infrared radiation emitted from the infrared lamp.

The chemical liquid retained on the bottom plate is spouted in a shower form from the multiplicity of chemical liquid outlet ports of the bottom plate. That is, droplets of the chemical liquid are spouted from the respective chemical liquid outlet ports. The temperature of the chemical liquid supplied onto the major surface of the substrate in the form of liquid droplets is easily increased by the heating with the heater.

With the chemical liquid outlet ports extensively distributed in the bottom plate, the high-temperature chemical liquid droplets can be more extensively supplied onto the major surface of the substrate. Thus, the temperature of the chemical liquid supplied onto the major surface of the substrate can be further increased, so that the chemical liquid present on the major surface of the substrate can be maintained at a higher temperature.

The pipe wall of the chemical liquid flow pipe may be formed of quartz. The pipe wall of the chemical liquid flow pipe is heated to a higher temperature by the infrared radiation received from the infrared lamp. Since the pipe wall of the chemical liquid flow pipe is formed of heat-resistant quartz, the breakage and the melt-down of the chemical liquid flow pipe are less liable to occur.

The retention head may include a lamp housing which is a bottomed container accommodating the infrared lamp. With this arrangement, the infrared lamp is surrounded by the lamp housing. Therefore, an atmosphere containing the chemical liquid droplets around the major surface of the substrate is prevented from adversely influencing the infrared lamp. Since the chemical liquid droplets are prevented from adhering to a tube wall of the infrared lamp, the amount of the infrared radiation emitted from the infrared lamp can be stably maintained for a longer period of time.

In this case, the heater may include a bottom plate of the lamp housing to be heated by the irradiation with the infrared radiation emitted from the infrared lamp. In this case, the bottom plate of the lamp housing accommodating the infrared lamp is heated to a higher temperature by the irradiation with the infrared radiation emitted from the infrared lamp. Thus, the lamp housing functions to heat the chemical liquid as well as to protect the infrared lamp.

The bottom plate preferably has a flat opposed surface to be opposed to the major surface of the substrate. In this case, an atmosphere present between the opposed surface and the major surface of the substrate can be isolated from a peripheral environment, whereby the temperature of the atmosphere present between the opposed surface and the major surface of the substrate can be maintained. Thus, the temperature of the chemical liquid is substantially prevented from being lowered in a region of the major surface opposed to the bottom plate, so that the temperature of the chemical liquid present in the region opposed to the bottom plate can be further increased.

The lamp housing may be formed of quartz. The lamp housing is liable to be heated to a higher temperature by the infrared radiation received from the infrared lamp. Since the lamp housing is formed of heat-resistant quartz, the breakage and the melt-down of the lamp housing are less liable to occur.

The pipe wall of the chemical liquid flow pipe may be formed integrally with the lamp housing.

According to further another embodiment of the present invention, the retention head further includes a lid which closes an opening of the lamp housing. With this arrangement, the opening of the lamp housing is closed by the lid. Therefore, the atmosphere containing the chemical liquid droplets is reliably prevented from entering the lamp housing to be thereby more reliably prevented from adversely influencing the infrared lamp.

In this case, the lid is not heated by the infrared lamp, if the lid and the infrared lamp are sufficiently spaced from each other. Therefore, the lid may be formed of a resin material.

The heater may further include an opposed member to be located between the major surface of the substrate and the infrared lamp and heated by the irradiation with the infrared radiation emitted from the infrared lamp.

In this case, the opposed member is heated to a higher temperature by the irradiation with the infrared radiation emitted from the infrared lamp. With the opposed member located in opposed relation to the major surface of the substrate, the chemical liquid is heated by both the infrared lamp and the opposed member in a region of the major surface of the substrate opposed to the opposed member. Thus, the chemical liquid can be efficiently heated.

The opposed member preferably has a flat opposed surface to be opposed to the major surface of the substrate. In this case, an atmosphere present between the opposed surface and the major surface of the substrate can be isolated from a peripheral environment, whereby the temperature of the atmosphere present between the opposed surface and the major surface of the substrate can be maintained. Thus, the temperature of the chemical liquid is substantially prevented from being lowered in the region of the major surface of the substrate opposed to the opposed member, so that the temperature of the chemical liquid present in the region opposed to the opposed member can be further increased.

The infrared lamp may have an annular shape defined about a center axis perpendicular to the major surface of the substrate. In this case, the infrared lamp extends along the major surface of the substrate, so that a greater flow amount of the chemical liquid can be irradiated with the infrared radiation.

The chemical liquid may be a resist lift-off liquid. In this case, all the resist lift-off liquid present on the major surface of the substrate can be maintained at a higher temperature, so that the resist can be advantageously and evenly removed from the entire major surface of the substrate.

Since the resist lift-off liquid present on the major surface of the substrate can be maintained at a higher temperature, even a resist having a hardened layer can be removed from the major surface of the substrate without the ashing. Without the need for the ashing of the resist, the major surface of the substrate is free from the damage due to the ashing.

According to still another embodiment of the present invention, the substrate treatment apparatus further includes a rotation unit which rotates the substrate held by the substrate holding unit about a predetermined vertical axis, and a control unit which performs: a liquid film forming step of controlling the chemical liquid supplying unit to supply the chemical liquid from the chemical liquid flow pipe onto the major surface of the substrate held by the substrate holding unit, and controlling the rotation unit to rotate the substrate held by the substrate holding unit at a first rotation speed, whereby a liquid film of the chemical liquid is formed on the major surface of the substrate as covering the major surface of the substrate; a liquid film retaining step of, after the liquid film forming step, controlling the rotation unit to rotate the substrate held by the substrate holding unit at a second rotation speed lower than the first rotation speed, whereby the chemical liquid film formed on the major surface of the substrate is retained on the major surface of the substrate; a liquid film heating step of, simultaneously with the liquid film retaining step, controlling the heater and the heater moving unit to locate the heater in opposed relation to the major surface of the substrate held by the substrate holding unit and heat the chemical liquid film retained on the major surface of the substrate by the heater; and a retention head moving step of, simultaneously with the liquid film retaining step and the liquid film heating step, moving the retention head along the major surface of the substrate; wherein the substrate holding unit horizontally holds the substrate.

With this arrangement, the chemical liquid is supplied at a first flow rate onto the major surface of the substrate held by the substrate holding unit and, at the same time, the substrate is rotated at the first rotation speed, whereby the chemical liquid film is formed on the major surface of the substrate as covering the major surface. Thereafter, the rotation speed of the substrate is reduced to the second rotation speed, whereby the chemical liquid film is continuously retained on the major surface of the substrate. With the liquid film thus retained, the heater is located in opposed relation to the major surface of the substrate and the heating by the heater is started, whereby the chemical liquid film is heated in the region of the major surface of the substrate opposed to the heater. Simultaneously with the heating by the heater, the heater is moved along the major surface of the substrate, whereby the region of the major surface of the substrate opposed to the heater is moved. Therefore, the entire major surface of the substrate can be heated by the heater. Thus, almost all the chemical liquid present on the major surface of the substrate can be heated. In this case, the chemical liquid can be maintained at a higher temperature on the entire major surface of the substrate. As a result, the major surface of the substrate can be advantageously and evenly treated with the chemical liquid.

The foregoing and other objects, features and effects of the present invention will become more apparent from the following detailed description of the preferred embodiments with reference to the attached drawings.

BRIEF DESCRIPTION OF THE DRAWINGS

FIG. 7 is a process diagram showing a first exemplary treatment for a resist removing process.

FIG. 8 is a time chart for explaining a control operation to be performed by a controller in major steps of the first exemplary treatment shown in FIG. 7.

FIG. 10 is a plan view showing a movement range of the heater head in the step shown in FIG. 9B.

FIG. 11 is a time chart for explaining a control operation to be performed in major steps of a second exemplary treatment.

FIG. 20 is a schematic sectional view of a heater head in the second embodiment.

FIG. 21 is a diagram of the heater head taken along a sectional plane and seen in a direction XXI-XXI in FIG. 20.

DETAILED DESCRIPTION OF THE PREFERRED EMBODIMENTS

Figure 1:
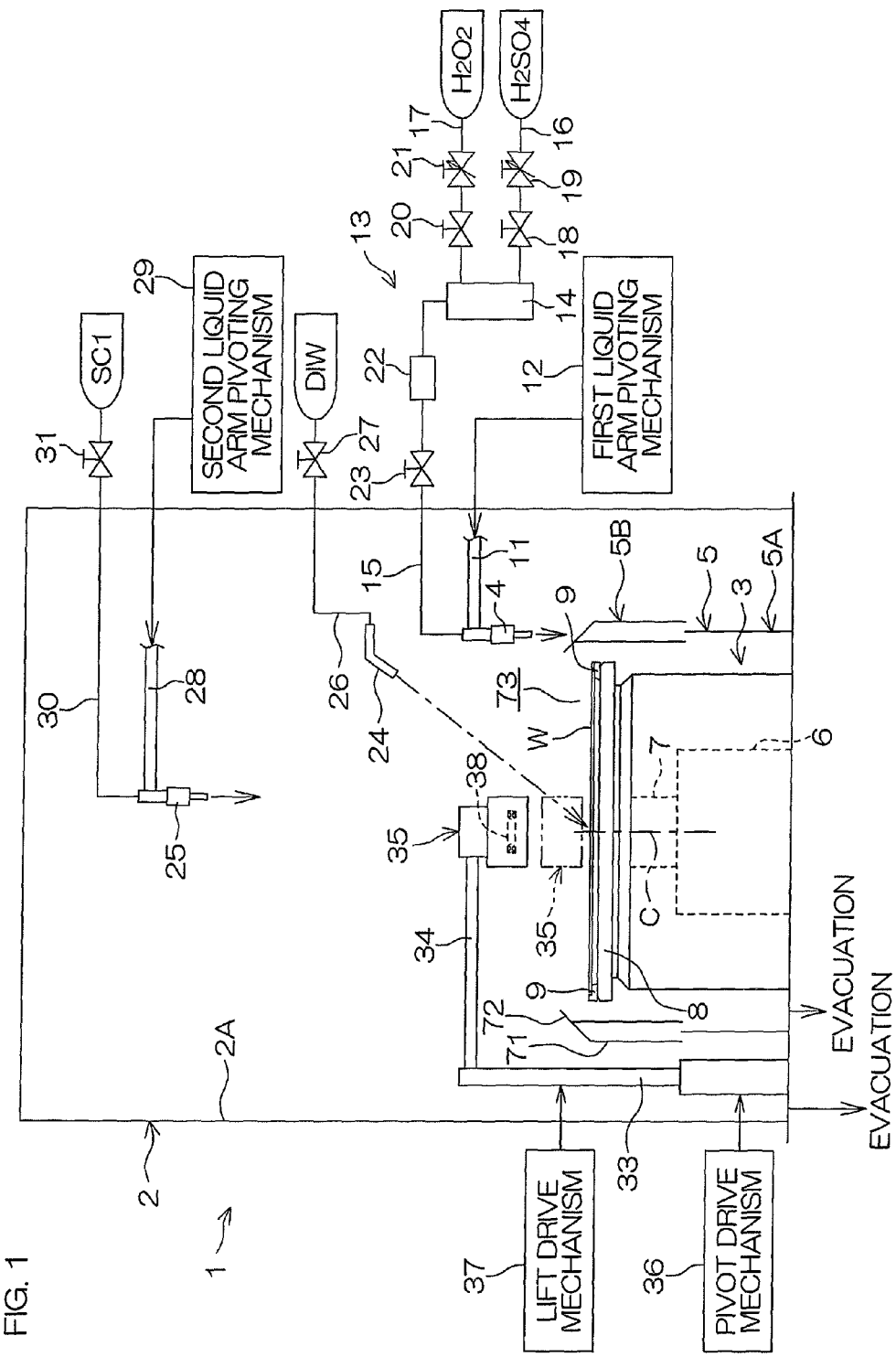
FIG. 1 is a diagram schematically showing the construction of a substrate treatment apparatus according to an embodiment of the present invention.

FIG. 1 is a diagram schematically showing the construction of a substrate treatment apparatus 1 according to an embodiment of the present invention. The substrate treatment apparatus 1 is an apparatus of a single wafer treatment type to be used, for example, in a resist removing process for removing an unnecessary resist from a front surface (major surface) of a wafer W (an example of a substrate) after an ion implantation process for implanting an impurity into the front surface of the wafer W or after a dry etching process.

The substrate treatment apparatus 1 includes a treatment chamber 2 defined by a partition wall 2A. A fan/filter unit (not shown) for supplying clean air into the treatment chamber 2 is provided in a top wall of the treatment chamber 2. On the other hand, an evacuation port (not shown) is provided in a bottom wall of the treatment chamber 2. During operation of the substrate treatment apparatus 1, down flow of the clean air is constantly formed in the treatment chamber 2 by the supply of the clean air from the fan/filter unit and evacuation through the evacuation port. The term "clean air" herein means air prepared by cleaning air in a clean room in which the substrate treatment apparatus 1 is installed.

The substrate treatment apparatus 1 includes a wafer rotating mechanism (substrate holding unit) 3 which holds and rotates the wafer W, a lift-off liquid nozzle (chemical liquid nozzle, chemical liquid supplying unit) 4 which supplies an SPM liquid (an example of a resist lift-off liquid (chemical liquid)) onto the front surface (upper surface) of the wafer W held by the wafer rotating mechanism 3, and a heater head (heater) 35 to be located in opposed relation to the front surface of the wafer W held by the wafer rotating mechanism 3 for heating the wafer W and the SPM liquid present on the front surface of the wafer W. The wafer rotating mechanism 3, the lift-off liquid nozzle 4 and the heater head 35 are provided in the treatment chamber 2 defined by the partition wall 2A.

The wafer rotating mechanism 3 may be of a clamping type. More specifically, the wafer rotating mechanism 3 includes, for example, a motor (rotating unit) 6, a spin shaft 7 integrated with a drive shaft of the motor 6, a disk-shaped spin base 8 horizontally attached to an upper end of the spin shaft 7, and a plurality of holding members 9 provided in generally equiangularly spaced relation at positions on a peripheral edge portion of the spin base 8. The wafer W is horizontally held between the holding members 9. When the motor 6 is driven in this state, the spin base 8 is rotated about a vertical rotation axis C by a driving force of the motor 6, and the wafer W is generally horizontally rotated together with the spin base 8 about the rotation axis C.

The wafer rotating mechanism 3 is not limited to the clamping type, but may be of a vacuum suction type, which is rotated about the rotation axis C while horizontally holding the wafer W by sucking a back surface of the wafer W by vacuum to thereby rotate the wafer W thus held.

The wafer rotating mechanism 3 is accommodated in a cup 5. The cup 5 includes a lower cup portion 5A and an upper cup portion 5B provided above the lower cup portion 5A in a vertically movable manner.

The lower cup portion 5A has a bottomed cylindrical shape having a center axis coinciding with the rotation axis C of the wafer W. The lower cup portion 5A has an evacuation port (not shown) provided in a bottom thereof. During the operation of the substrate treatment apparatus 1, an internal atmosphere of the cup 5 is constantly expelled from the evaluation port.

The upper cup portion 5B includes a cylindrical portion 71 sharing the center axis with the lower cup portion 5A, and an inclined portion 72 extending obliquely upward toward the center axis of the cylindrical portion 71 from an upper edge of the cylindrical portion 71. A cup lift mechanism (not shown) for moving up and down (vertically moving) the upper cup portion 5B is connected to the upper cup portion 5B. The cup lift mechanism moves the upper cup portion 5B between a position at which the cylindrical portion 71 thereof is located on a lateral side of the spin base 8 and a position at which an upper edge of the inclined portion 72 thereof is located below the spin base 8.

The upper cup portion 5B has a round opening 73 provided in an upper face thereof and defined by the upper edge of the inclined portion 72 thereof. The opening 73 is dimensioned so that the spin base 8 can pass through the opening 73 to permit the vertical movement of the upper cup portion 5B. Therefore, the opening 73 is dimensioned so that the wafer W can pass through the opening 73.

The lift-off liquid nozzle 4 is a straight nozzle from which the SPM liquid is spouted in the form of a continuous stream. The lift-off liquid nozzle 4 is attached to a distal end of a generally horizontally extending first liquid arm 11 with its spout directed downward. The first liquid arm 11 is provided pivotally about a predetermined pivot axis extending vertically. A first liquid arm pivoting mechanism 12 for pivoting the first liquid arm 11 within a predetermined angular range is connected to the first liquid arm 11. By the pivoting of the first liquid arm 11, the lift-off liquid nozzle 4 is moved between a position on the rotation axis C of the wafer W (at which the lift-off liquid nozzle 4 is opposed to the rotation center of the wafer W) and a home position defined on a lateral side of the wafer rotating mechanism 3.

A lift-off liquid supplying mechanism (chemical liquid supplying unit) 13 for supplying the SPM liquid to the lift-off liquid nozzle 4 includes a mixing portion 14 which mixes sulfuric acid ($H_2SO_4$) and a hydrogen peroxide solution ($H_2O_2$), and a lift-off liquid supply line 15 connected between the mixing portion 14 and the lift-off liquid nozzle 4. A sulfuric acid supply line 16 and a hydrogen peroxide solution supply line 17 are connected to the mixing portion 14. Sulfuric acid temperature-controlled at a predetermined temperature (e.g., about 80° C.) is supplied to the sulfuric acid supply line 16 from a sulfuric acid supply portion to be described later. On the other hand, a hydrogen peroxide solution not temperature-controlled but having a temperature generally equal to a room temperature (about 25° C.) is supplied to the hydrogen peroxide solution supply line 17 from a hydrogen peroxide solution supply source. A sulfuric acid valve 18 and a flow rate control valve 19 are provided in the sulfuric acid supply line 16. A hydrogen peroxide solution valve 20 and a flow rate control valve 21 are provided in the hydrogen peroxide solution supply line 17. An agitation flow pipe 22 and a lift-off liquid valve 23 are provided in this order from the mixing portion 14 in the lift-off liquid supply line 15. The agitation flow pipe 22 is configured such that a plurality of rectangular planar agitation fins each twisted by about 180 degrees about an axis extending in a liquid flowing direction are provided in a tubular member so as to be angularly offset from each other by 90 degrees about a center axis of the tubular member extending in the liquid flowing direction.

When the sulfuric acid valve 18 and the hydrogen peroxide solution valve 20 are opened with the lift-off liquid valve 23 being open, sulfuric acid from the sulfuric acid supply line 16 and the hydrogen peroxide solution from the hydrogen peroxide solution supply line 17 flow into the mixing portion 14, and then flow out of the mixing portion 14 into the lift-off liquid supply line 15. Sulfuric acid and the hydrogen peroxide solution flow through the agitation flow pipe 22 to be thereby sufficiently agitated when flowing through the lift-off liquid supply line 15. With the agitation in the agitation flow pipe 22, sulfuric acid and the hydrogen peroxide solution sufficiently react with each other, whereby an SPM liquid containing a great amount of peroxosulfuric acid ($H_2SO_5$) is prepared.

The temperature of the SPM liquid is increased to a temperature higher than the temperature of sulfuric acid supplied to the mixing portion 14 by reaction heat generated by a reaction between sulfuric acid and the hydrogen peroxide solution. The SPM liquid having a higher temperature is supplied to the lift-off liquid nozzle 4 through the lift-off liquid supply line 15.

In this embodiment, sulfuric acid is stored in a sulfuric acid tank (not shown) of the sulfuric acid supply portion. Sulfuric acid stored in the sulfuric acid tank is temperature-controlled at a predetermined temperature (e.g., about 80° C.) by a temperature controller (not shown). Sulfuric acid stored in the sulfuric acid tank is supplied to the sulfuric acid supply line 16. In the mixing portion 14, sulfuric acid having a temperature of about 80° C. is mixed with the hydrogen peroxide solution kept at a room temperature, whereby an SPM liquid having a temperature of about 140° C. is prepared. The SPM liquid having a temperature of about 140° C. is spouted from the lift-off liquid nozzle 4.

The substrate treatment apparatus 1 further includes a DIW nozzle 24 from which DIW (deionized water) is supplied as a rinse liquid onto the front surface of the wafer W held by the wafer rotating mechanism 3, and an SC1 nozzle 25 from which SC1 (an ammonia-hydrogen peroxide mixture) is supplied as a cleaning chemical liquid onto the front surface of the wafer W held by the wafer rotating mechanism 3.

The DIW nozzle 24 is a straight nozzle which spouts the DIW, for example, in the form of a continuous stream, and is fixedly disposed above the wafer rotating mechanism 3 with its spout directed toward a portion around the rotation center of the wafer W. The DIW nozzle 24 is connected to a DIW supply line 26 to which the DIW is supplied from a DIW supply source. A DIW valve 27 for switching on and off the supply of the DIW from the DIW nozzle 24 is provided in the DIW supply line 26.

The SC1 nozzle 25 is a straight nozzle from which the SC1 is spouted, for example, in the form of a continuous stream, and is fixed to a distal end of a generally horizontally extending second liquid arm 28 with its spout directed downward. The second liquid arm 28 is provided pivotally about a predetermined vertical pivot axis. A second liquid arm pivoting mechanism 29 for pivoting the second liquid arm 28 within a predetermined angular range is connected to the second liquid arm 28. By the pivoting of the second liquid arm 28, the SC1 nozzle 25 is moved between a position on the rotation axis C of the wafer W (at which the SC1 nozzle 25 is opposed to the rotation center of the wafer W) and a home position defined on a lateral side of the wafer rotating mechanism 3.

The SC1 nozzle 25 is connected to an SC1 supply line 30 to which the SC1 is supplied from an SC1 supply source. An SC1 valve 31 for switching on and off the supply of the SC1 from the SC1 nozzle 25 is provided in the SC1 supply line 30.

A vertically extending support shaft 33 is disposed on a lateral side of the wafer rotating mechanism 3. A horizontally extending heater arm 34 is attached to an upper end of the support shaft 33, and a heater head 35 which accommodates and retains an infrared lamp 38 is attached to a distal end of the heater arm 34. A pivot drive mechanism (heater head moving unit, retention head moving unit) 36 which rotates the support shaft 33 about its rotation axis and a lift drive mechanism (heater head moving unit, retention head moving unit) 37 which vertically moves the support shaft 33 along its center axis are connected to the support shaft 33.

A driving force is inputted to the support shaft 33 from the pivot drive mechanism 36 to rotate the support shaft 33 within a predetermined angular range, whereby the heater arm 34 is pivoted about the support shaft 33 above the wafer W held by the wafer rotating mechanism 3. By pivoting the heater arm 34, the heater head 35 is moved between a position on the rotation axis C of the wafer W (at which the heater head 35 is opposed to the rotation center of the wafer W) and a home position defined on a lateral side of the wafer rotating mechanism 3. Further, a driving force is inputted to the support shaft 33 from the lift drive mechanism 37 to vertically move the support shaft 33, whereby the heater head 35 is moved up and down between a position adjacent to the front surface of the wafer W held by the wafer rotating mechanism 3 (a height position indicated by a two-dot-and-dash line in FIG. 1, and including a center adjacent position, a peripheral adjacent position and an intermediate adjacent position to be described later) and a retracted position above the wafer W (a height position indicated by a solid line in FIG. 1). In this embodiment, the adjacent position is defined so that a lower surface of the heater head 35 is spaced a distance of, for example, 3 mm from the front surface of the wafer W held by the wafer rotating mechanism 3.

Figure 2:
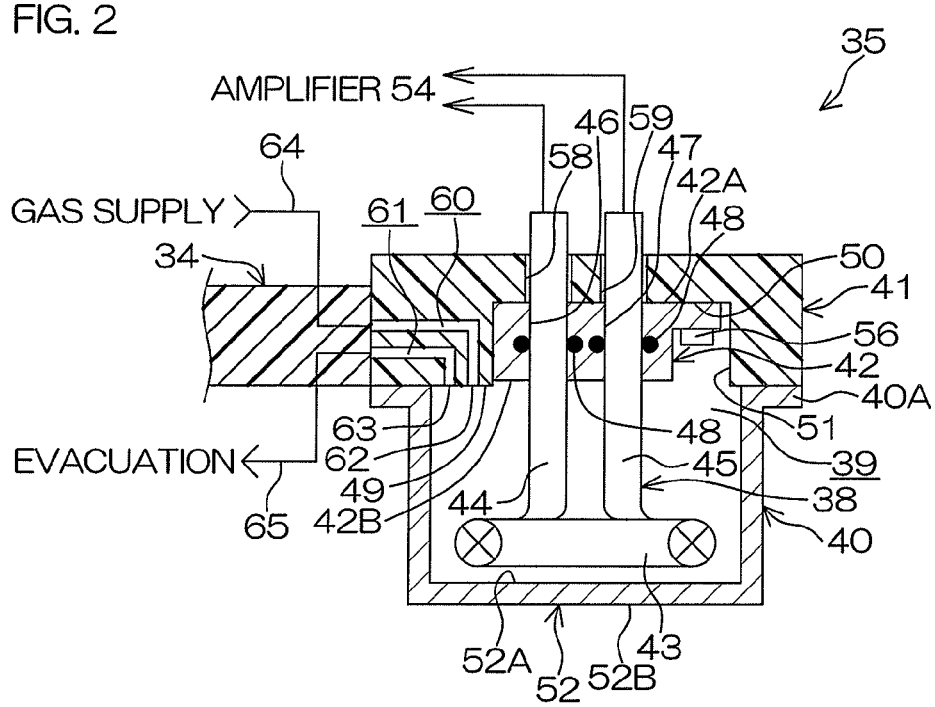
FIG. 2 is a schematic sectional view showing an exemplary structure of a heater head.

FIG. 2 is a schematic sectional view showing an exemplary structure of the heater head 35. The heater head 35 includes an infrared lamp 38, a lamp housing 40 which is a bottomed container having a top opening 39 and accommodating the infrared lamp 38, a support member 42 which supports the infrared lamp 38 while suspending the infrared lamp 38 in the lamp housing 40, and a lid 41 which closes the opening 39 of the lamp housing 40. In this embodiment, the lid 41 is fixed to the distal end of the heater arm 34.

Figure 3:
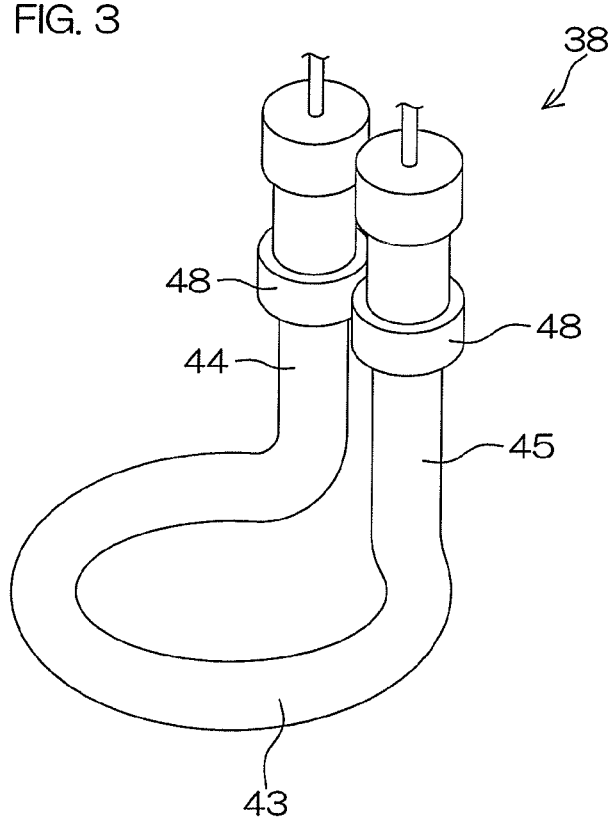
FIG. 3 is a perspective view showing an exemplary structure of an infrared lamp.

FIG. 3 is a perspective view showing an exemplary structure of the infrared lamp 38. As shown in FIGS. 2 and 3, the infrared lamp 38 is a unitary infrared lamp heater which includes an annular portion 43 having an annular shape (arcuate shape), and a pair of straight portions 44, 45 extending vertically upward from opposite ends of the annular portion 43 along a center axis of the annular portion 43. The annular portion 43 mainly functions as a light emitting portion which emits infrared radiation. In this embodiment, the annular portion 43 has a diameter (outer diameter) of, for example, about 60 mm. With the infrared lamp 38 supported by the support member 42, the center axis of the annular portion 43 vertically extends. In other words, the center axis of the annular portion 43 is perpendicular to the front surface of the wafer W held by the wafer rotating mechanism 3. The annular portion 43 of the infrared lamp 38 is disposed in a generally horizontal plane.

The infrared lamp 38 includes a quartz tube, and a filament accommodated in the quartz tube. An amplifier 54 (see FIG. 6) for voltage supply is connected to the infrared lamp 38. Typical examples of the infrared lamp 38 include infrared heaters of shorter wavelength, intermediate wavelength and longer wavelength such as halogen lamps and carbon lamps.

Figure 4:
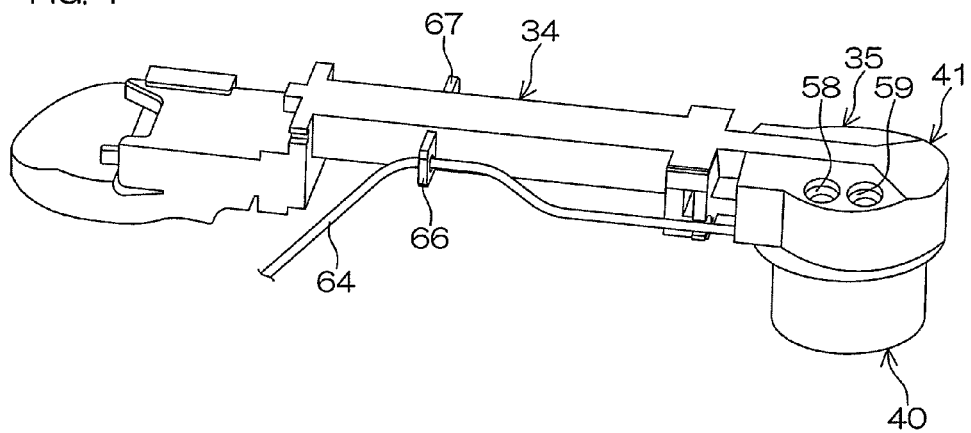
FIG. 4 is a perspective view showing an exemplary structure of a combination of a heater arm and the heater head.

FIG. 4 is a perspective view showing an exemplary structure of a combination of the heater arm 34 and the heater head 35. As shown in FIGS. 2 and 4, the lid 41 has a disk shape, and is fixed to the heater arm 34 in a horizontal orientation, i.e., as extending longitudinally from the heater arm 34. The lid 41 is formed of a fluororesin such as PTFE (polytetrafluoroethylene). In this embodiment, the lid 41 is formed integrally with the heater arm 34. However, the lid 41 may be formed separately from the heater arm 34. Exemplary materials for the lid 41 other than resin materials such as PTFE include ceramic materials and quartz.

As shown in FIG. 2, a generally cylindrical groove 51 is formed in a lower surface 49 of the lid 41. The groove 51 has a horizontal flat upper base surface 50, and an upper surface 42A of the support member 42 is fixed to the upper base surface 50 in contact with the upper base surface 50. As shown in FIGS. 2 and 4, the lid 41 has insertion holes 58, 59 extending vertically through the upper base surface 50. Upper end portions of the straight portions 44, 45 of the infrared lamp 38 are respectively inserted in the insertion holes 58, 59. In FIG. 4, the heater head 35 is illustrated with the infrared lamp 38 removed from the heater head 35.

As shown in FIG. 2, the lamp housing 40 is a bottomed cylindrical container. The lamp housing 40 is formed of quarts.

The lamp housing 40 is fixed to the lower surface 49 of the lid 41 (fixed to a portion of the lower surface 49 of the lid 41 not formed with the groove 51 in this embodiment) with its opening 39 facing up. An annular flange 40A projects radially outward (horizontally) from a peripheral edge of the opening of the lamp housing 40. The flange 40A is fixed to the lower surface 49 of the lid 41 with a fixture unit such as bolts (not shown), whereby the lamp housing 40 is supported by the lid 41.

In this state, a bottom plate (opposed member) 52 of the lamp housing 40 has a horizontal disk shape. The bottom plate 52 has an upper surface 52A and a lower surface (opposed surface) 52B which are horizontal flat surfaces. In the lamp housing 40, a lower portion of the annular portion 43 of the infrared lamp 38 is located in closely opposed relation to the upper surface 52A of the bottom plate 52. The annular portion 43 and the bottom plate 52 are parallel to each other. In other words, the lower portion of the annular portion 43 is covered with the bottom plate 52 of the lamp housing 40. In this embodiment, the lamp housing 40 has an outer diameter of, for example, about 85 mm. Further, a vertical distance between the infrared lamp 38 (the lower portion of the annular portion 43) and the upper surface 52A is, for example, about 2 mm.

The support member 42 is a thick plate (having a generally disk shape). The support member 42 is horizontally attached and fixed to the lid 41 from below by bolts 56 or the like. The support member 42 is formed of a heat-resistant material (e.g., a ceramic or quartz). The support member 42 has two insertion holes 46, 47 extending vertically through the upper surface 42A and the lower surface 42B thereof. The straight portions 44, 45 of the infrared lamp 38 are respectively inserted in the insertion holes 46, 47.

O-rings are respectively fixedly fitted around intermediate portions of the straight portions 44, 45. With the straight portions 44, 45 respectively inserted in the insertion holes 46, 47, outer peripheries of the two O-rings 48 are kept in press contact with inner walls of the corresponding insertion holes 46, 47. Thus, the straight portions 44, 45 are prevented from being withdrawn from the insertion holes 46, 47, whereby the infrared lamp 38 is suspended to be supported by the support member 42.

When electric power is supplied to the infrared lamp 38 from the amplifier 54, the infrared lamp 38 emits infrared radiation, which is in turn outputted through the lamp housing 40 downward of the heater head 35. The infrared radiation outputted through the bottom plate 52 of the lamp housing 40 heats the SPM liquid present on the wafer W.

More specifically, the bottom plate 52 of the lamp housing 40 which defines a lower end face of the heater head 35 is located in opposed relation to the front surface of the wafer W held by the wafer rotating mechanism 3 in the resist removing process to be described later. In this state, the infrared radiation outputted through the bottom plate 52 of the lamp housing 40 heats the wafer W and the SPM liquid present on the wafer W.

Since the annular portion 43 of the infrared lamp 38 assumes a horizontal attitude, the infrared radiation can be evenly applied onto the front surface of the wafer W horizontally held. Thus, the wafer W and the SPM liquid present on the wafer W can be efficiently irradiated with the infrared radiation. That is, the annular portion 43 of the infrared lamp 38 and the bottom plate 52 are parallel to each other, so that the annular portion 43 extends along the bottom plate 52. Therefore, the annular portion 43 can emit the infrared radiation over a greater irradiation area of the bottom plate 52. Since the annular portion 43 of the infrared lamp 38 assumes a horizontal attitude, the front surface of the wafer W horizontally held also has a greater irradiation area. Thus, the SPM liquid present on the wafer W can be efficiently irradiated with the infrared radiation.

The periphery of the infrared lamp 38 is covered with the lamp housing 40. Further, the flange 40A of the lamp housing 40 and the lower surface 49 of the lid 41 are kept in intimate contact with each other circumferentially of the lamp housing 40. Further, the opening 39 of the lamp housing 40 is closed by the lid 41. Thus, an atmosphere containing droplets of the SPM liquid around the front surface of the wafer W is prevented from entering the lamp housing 40 and adversely influencing the infrared lamp 38 in the resist removing process to be described later. Further, the SPM liquid droplets are prevented from adhering onto the quarts tube wall of the infrared lamp 38, so that the amount of the infrared radiation emitted from the infrared lamp 38 can be stably maintained for a longer period of time.

In the resist removing process to be described later, the annular portion 43 of the infrared lamp 38 and the bottom plate 52 of the lamp housing 40 are opposed to the front surface of the wafer W held by the wafer rotating mechanism 3. In other words, when the resist removing process is performed on the wafer W, the bottom plate 52 is located between the front surface of the wafer W held by the wafer rotating mechanism 3 and the infrared lamp 38.

The lid 41 includes a gas supply passage 60 through which air is supplied into the lamp housing 40, and an evacuation passage 61 through which an internal atmosphere of the lamp housing 40 is expelled. The gas supply passage 60 and the evacuation passage 61 respectively have a gas supply port 62 and an evacuation port 63 which are open in the lower surface of the lid 41. The gas supply passage 60 is connected to one of opposite ends of a gas supply pipe 64. The other end of the gas supply pipe 64 is connected to an air supply source. The evacuation passage 61 is connected to one of opposite ends of an evacuation pipe 65. The other end of the evacuation pipe 65 is connected to an evacuation source.

While air is supplied into the lamp housing 40 from the gas supply port 62 through the gas supply pipe 64 and the gas supply passage 60, the internal atmosphere of the lamp housing 40 is expelled to the evacuation pipe 65 through the evacuation port 63 and the evacuation passage 61. Thus, a higher-temperature atmosphere in the lamp housing 40 can be expelled for ventilation. Thus, the inside of the lamp housing 40 can be cooled. As a result, the infrared lamp 38 and the lamp housing 40, particularly the support member 42, can be cooled.

As shown in FIG. 4, the gas supply pipe 64 and the evacuation pipe 65 (not shown in FIG. 4, but see FIG. 2) are respectively supported by a plate-shaped gas supply pipe holder 66 provided on one side face of the heater arm 34 and a plate-shaped evacuation pipe holder 67 provided on the other side face of the heater arm 34.

Figure 5:
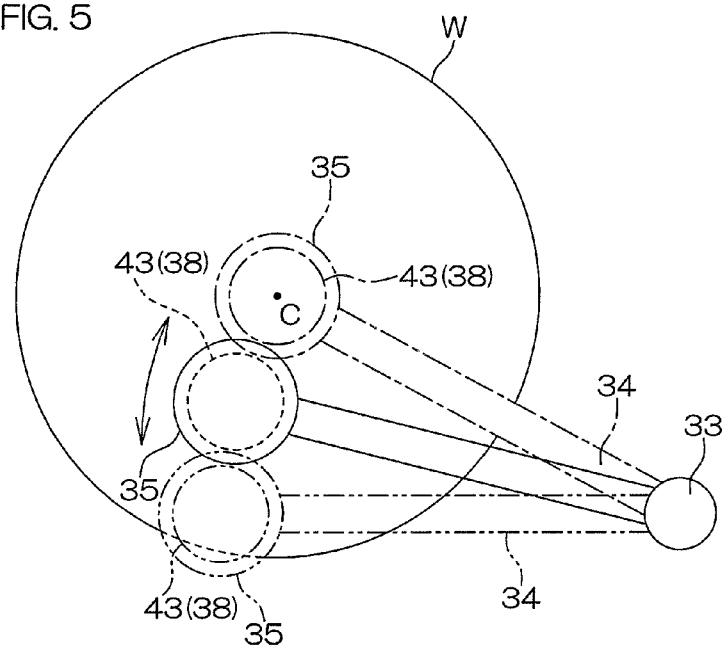
FIG. 5 is a plan view showing positions of the heater head.

FIG. 5 is a plan view showing positions of the heater head 35. The pivot drive mechanism 36 and the lift drive mechanism 37 are controlled to move the heater head 35 along an arcuate path crossing a wafer rotating direction above the front surface of the wafer W.

When the wafer W and the SPM liquid present on the wafer W are heated by the infrared lamp 38 of the heater head 35, the heater head 35 is located at the adjacent position at which the bottom plate 52 (lower end face) thereof is opposed to and spaced a minute distance (e.g., 3 mm) from the front surface of the wafer W. During the heating, the bottom plate 52 (lower surface 52B) and the front surface of the wafer W are kept spaced the minute distance from each other.

Examples of the adjacent position include an intermediate adjacent position (indicated by a solid line in FIG. 5), a peripheral adjacent position (indicated by a two-dot-and-dash line in FIG. 5) and a center adjacent position (indicated by a one-dot-and-dash line in FIG. 5).

With the heater head 35 located at the intermediate adjacent position, the center of the round heater head 35 as seen in plan is opposed to a radially intermediate portion of the front surface of the wafer W (a portion intermediate between the rotation center (on the rotation axis C) and a peripheral edge portion of the wafer W), and the bottom plate 52 of the heater head 35 is spaced the minute distance (e.g., 3 mm) from the front surface of the wafer W.

With the heater head 35 located at the peripheral adjacent position, the center of the round heater head 35 as seen in plan is opposed to the peripheral edge portion of the front surface of the wafer W, and the bottom plate 52 of the heater head 35 is spaced the minute distance (e.g., 3 mm) from the front surface of the wafer W.

With the heater head 35 located at the center adjacent position, the center of the round heater head 35 as seen in plan is opposed to the rotation center (on the rotation axis C) of the front surface of the wafer W, and the bottom plate 52 of the heater head 35 is spaced the minute distance (e.g., 3 mm) from the front surface of the wafer W.

Figure 6:
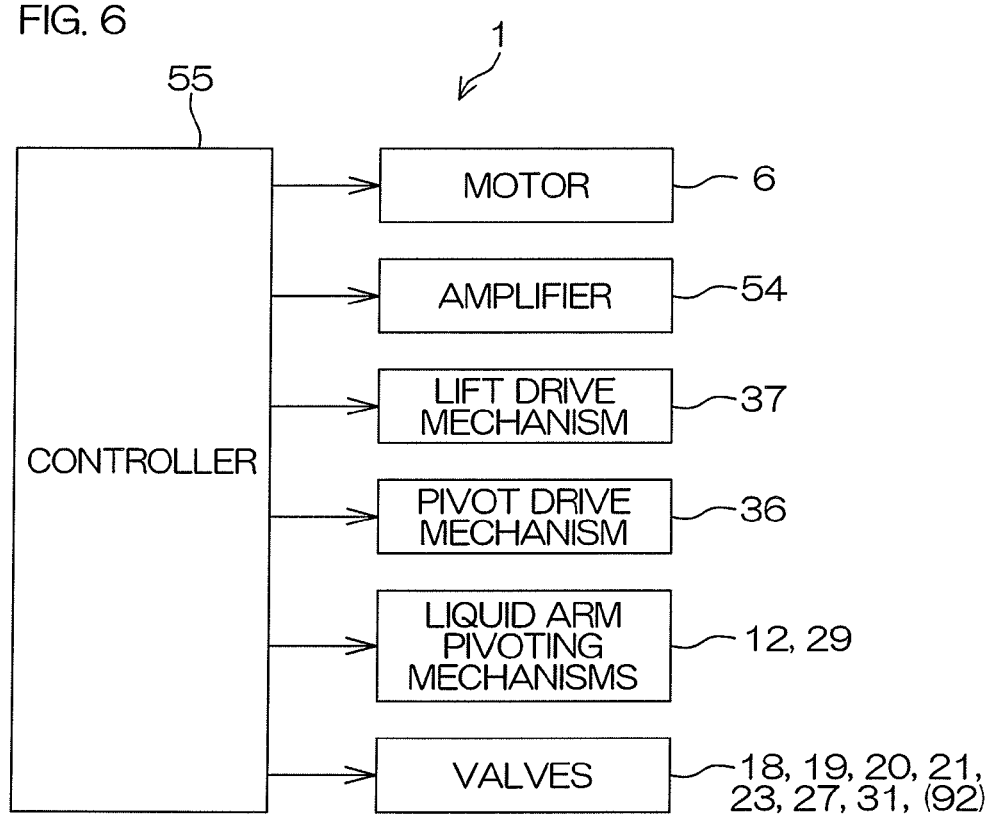
FIG. 6 is a block diagram showing the electrical construction of the substrate treatment apparatus.

FIG. 6 is a block diagram showing the electrical construction of the substrate treatment apparatus 1. The substrate treatment apparatus 1 includes a controller 55 having a configuration including a micro computer. The controller 55 is connected to the motor 6, the amplifier 54, the pivot drive mechanism 36, the lift drive mechanism 37, the first liquid arm pivoting mechanism 12, the second liquid arm pivoting mechanism 29, the sulfuric acid valve 18, the hydrogen peroxide solution valve 20, the lift-off liquid valve 23, the DIW valve 27, the SC1 valve 31, the flow rate control valves 19, 21, and the like, which are controlled by the controller 55.

Figure 9A:
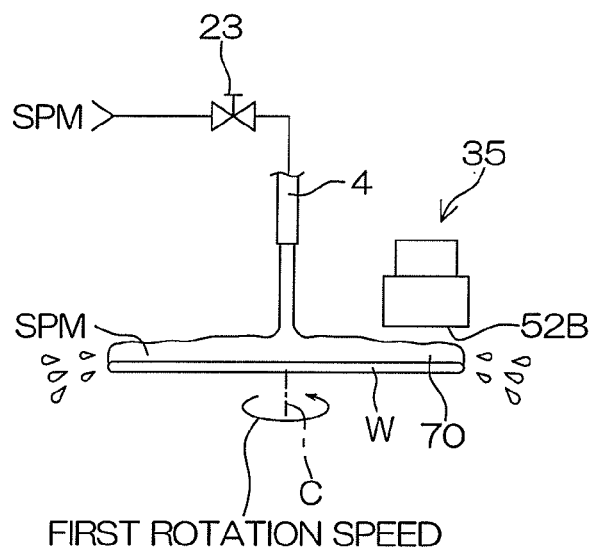
FIGS. 9A and 9B are diagrams for explaining the steps of the first exemplary treatment.
Figure 9B:
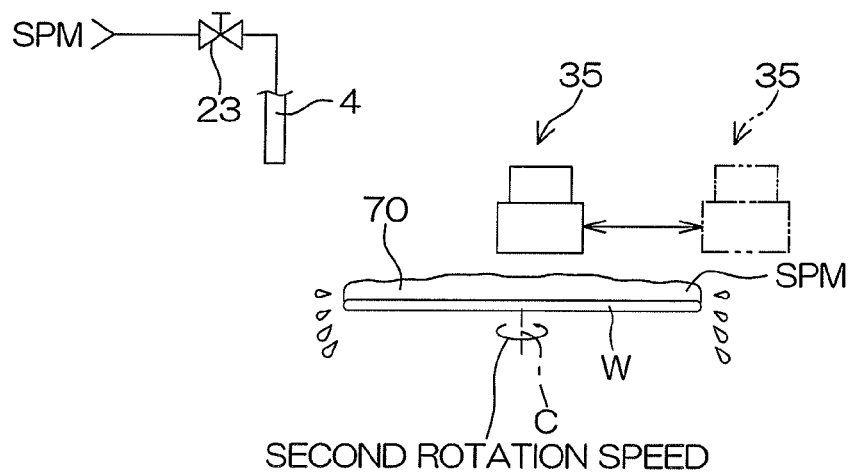

FIG. 7 is a process diagram showing a first exemplary treatment for the resist removing process to be performed by the substrate treatment apparatus 1. FIG. 8 is a time chart for explaining a control operation to be performed by the controller 55 in an SPM liquid film forming step and an SPM liquid film heating step to be described below. FIGS. 9A and 9B are schematic sectional views for explaining the SPM liquid film forming step and the SPM liquid film heating step. FIG. 10 is a plan view showing the movement range of the heater head 35 in the steps shown in FIGS. 9A and 9B.

Referring to FIGS. 1 to 10, the first exemplary treatment for the resist removing process will be described.

In the resist removing process, a transport robot (not shown) is controlled to load a wafer W subjected to the ion implantation process into the treatment chamber 2 (see FIG. 1) (Step S1: wafer loading step). It is assumed that the wafer W has not been subjected to a resist ashing process. The wafer W is transferred to the wafer rotating mechanism 3 with its front surface facing up. At this time, the heater head 35, the lift-off liquid nozzle 4 and the SC1 nozzle 25 are located at their home positions so as not to prevent the loading of the wafer W.

With the wafer W held by the wafer rotating mechanism 3, the controller 55 controls the motor 6 to start rotating the wafer W. The rotation speed of the wafer W is increased to a first rotation speed (in a range of 30 to 300 rpm, e.g., 60 rpm), and then maintained at the first rotation speed (Step S2). The first rotation speed is a speed which ensures that the wafer W can be covered with the SPM liquid to be later supplied, i.e., a speed at which a liquid film of the SPM liquid can be retained on the front surface of the wafer W. Further, the controller 55 controls the first liquid arm pivoting mechanism 12 to move the lift-off liquid nozzle 4 to above the wafer W.

After the rotation speed of the wafer W reaches the first rotation speed, the controller 55 opens the sulfuric acid valve 18, the hydrogen peroxide solution valve 20 and the lift-off liquid valve 23 to supply the SPM liquid onto the front surface of the wafer W from the lift-off liquid nozzle 4 as shown in FIG. 9A.

Since the rotation speed of the wafer W is the first rotation speed, the SPM liquid supplied onto the front surface of the wafer W is accumulated on the front surface of the wafer W, whereby the SPM liquid film (chemical liquid film) 70 is formed on the front surface of the wafer Was covering the entire front surface (Step S3: SPM liquid film forming step).

As shown in FIG. 9A, the controller 55 controls the first liquid arm pivoting mechanism 12 to locate the lift-off liquid nozzle 4 above the rotation center of the wafer W and spout the SPM liquid from the lift-off liquid nozzle 4 at the start of the SPM liquid film forming step. Thus, the SPM liquid film 70 is formed on the front surface of the wafer W, whereby the SPM liquid is distributed over the entire front surface of the wafer W. In this manner, the entire front surface of the wafer W is covered with the SPM liquid film 70.

Simultaneously with the SPM liquid film forming step of Step S3, the controller 55 controls the amplifier 54 to cause the infrared lamp 38 to emit the infrared radiation, and controls the pivot drive mechanism 36 and the lift drive mechanism 37 to pivot and vertically move the heater arm 34 retaining the heater head 35 above the wafer W. More specifically, the heater head 35 is moved from the home position to the peripheral retracted position above the peripheral edge portion of the wafer W, and then moved down from the peripheral retracted position to the peripheral adjacent position to be opposed to the peripheral edge portion of the wafer W (as indicated by a solid line in FIG. 9A and indicated by a two-dot-and-dash line in FIG. 10). After the heater head 35 is located at the peripheral adjacent position, the controller 55 horizontally moves the heater head 35 to the center adjacent position to be opposed to the rotation center of the wafer W (as indicated by a solid line in FIG. 9B and indicated by a solid line in FIG. 10).

A liquid film forming period required for forming the SPM liquid film 70 over the entire front surface of the wafer W varies depending on the flow rate of the SPM liquid to be spouted from the lift-off liquid nozzle 4, but may be in a range of 2 to 15 seconds, e.g., 5 seconds.

After a lapse of the liquid film forming period (e.g., 5 seconds) from the start of the supply of the SPM liquid, the controller 55 controls the motor 6 to reduce the rotation speed of the wafer W to a predetermined second rotation speed that is lower than the first rotation speed. Thus, the SPM liquid film heating step of Step S4 is performed.

The second rotation speed is a speed (in a range of 1 to 20 rpm, e.g., 15 rpm) which ensures that the SPM liquid film 70 can be retained on the front surface of the wafer W without the supply of the SPM liquid to the wafer W. In synchronism with the reduction of the rotation speed of the wafer W by the motor 6, as shown in FIG. 9B, the controller 55 closes the lift-off liquid valve 23 to stop supplying the SPM liquid from the lift-off liquid nozzle 4, and controls the first liquid arm pivoting mechanism 12 to move the lift-off liquid nozzle 4 back to the home position. Even without the supply of the SPM liquid to the wafer W, the SPM liquid film 70 is continuously retained on the front surface of the wafer W by reducing the rotation speed of the wafer W to the second rotation speed.

Even after the reduction of the rotation speed of the wafer W, as shown in FIG. 9B, the SPM liquid present on the front surface of the wafer W is continuously heated by the heater 38, 52 of the heater head 35, and the heater head 35 is continuously moved (scanned) (Step S4: SPM liquid film heating step). The controller 55 controls the amplifier 54 to cause the infrared lamp 38 to emit the infrared radiation and, as shown in FIGS. 9B and 10, controls the pivot drive mechanism 36 and the lift drive mechanism 37 to reciprocally move the heater head 35 between the center adjacent position indicated by the solid line in FIG. 9B and the peripheral adjacent position indicated in FIG. 9A. By the irradiation with the infrared radiation emitted from the infrared lamp 38, the SPM liquid is rapidly heated to a higher temperature on the order of about 250° C. in a region of the front surface of the wafer W opposed to the lower surface 52B of the bottom plate 52. Then, the region of the front surface of the wafer W opposed to the lower surface 52B of the bottom plate 52 (the region of the front surface of the wafer W opposed to the infrared lamp 38) is moved along an arcuate zone path in a range from a region including the rotation center of the wafer W to a region including the peripheral edge of the wafer W. Thus, the entire front surface of the wafer W can be heated. In this case, the wafer W is heated immediately below the infrared lamp 38, so that the SPM liquid is heated around an interface between the wafer W and the SPM liquid.

The peripheral adjacent position is a position at which the lower surface 52B of the bottom plate 52, preferably the annular portion 43 of the infrared lamp 38, partly projects radially outward of the outer periphery of the wafer W when the heater head 35 is seen from above.

As described above, when the heater head 35 is located at any of the adjacent positions, the lower surface 52B of the bottom plate 52 and the front surface of the wafer W are kept spaced the minute distance (e.g., 3 mm) from each other. Therefore, an atmosphere present between the lower surface 52B and the front surface of the wafer W can be isolated from a peripheral environment to be thereby kept hot. This suppresses the reduction in the temperature of the SPM liquid present in the region of the front surface of the wafer W opposed to the lower surface 52B of the bottom plate 52. Thus, the SPM liquid present in this region can be maintained at a further higher temperature.

In the SPM liquid film heating step of Step S4, the SPM liquid film 70 is heated around the interface between the front surface of the wafer W and the SPM liquid film 70. During this period, the reaction between the SPM liquid and the resist present on the front surface of the wafer W proceeds, so that the resist is lifted off from the front surface of the wafer W.

After a lapse of a predetermined liquid film heating period (in a range of 5 to 240 seconds, e.g., about 14 seconds) from the reduction of the rotation speed of the wafer W, the controller 55 closes the sulfuric acid valve 18 and the hydrogen peroxide solution valve 20. Further, the controller 55 controls the amplifier 54 to stop emitting the infrared radiation from the infrared lamp 38. The controller 55 controls the pivot drive mechanism 36 and the lift drive mechanism 37 to move the heater head 35 back to the home position. Then, the controller 55 controls the motor 6 to increase the rotation speed of the wafer W to a predetermined liquid treatment rotation speed (in a range of 300 to 1500 rpm, e.g., 1000 rpm), and opens the DIW valve 27 to supply the DIW from the spout of the DIW nozzle 24 toward the portion around the center axis of the wafer W (Step S5: intermediate rinsing step). The DIW supplied onto the front surface of the wafer W receives a centrifugal force generated by the rotation of the wafer W to flow toward the peripheral edge of the wafer W on the front surface of the wafer W. Thus, SPM liquid adhering to the front surface of the wafer W is rinsed away with the DIW.

After the supply of the DIW is continued for a predetermined intermediate rinsing period, the DIW valve 27 is closed to stop supplying the DIW onto the front surface of the wafer W.

While maintaining the rotation speed of the wafer W at the liquid treatment rotation speed, the controller 55 opens the SC1 valve 31 to supply the SC1 from the SC1 nozzle 25 onto the front surface of the wafer W (Step S6). The controller 55 controls the second liquid arm pivoting mechanism 29 to pivot the second liquid arm 28 within the predetermined angular range to reciprocally move the SC1 nozzle 25 between a position above the rotation center and a position above the peripheral edge of the wafer W. Thus, an SC1 supply position on the front surface of the wafer W to which the SC1 is supplied from the SC1 nozzle 25 is reciprocally moved along an arcuate path crossing the wafer rotating direction in a range from the rotation center of the wafer W to the peripheral edge of the wafer W. Thus, the SC1 is evenly supplied over the entire front surface of the wafer W, whereby foreign matter such as a resist residue and particles adhering to the front surface of the wafer W can be removed by chemical power of the SC1.

After the supply of the SC1 is continued for a predetermined SC1 supplying period, the controller 55 closes the SC1 valve 31, and controls the second liquid arm pivoting mechanism 29 to move the SC1 nozzle 25 back to the home position. While maintaining the rotation speed of the wafer W at the liquid treatment rotation speed, the controller 55 opens the DIW valve 27 to supply the DIW from the spout of the DIW nozzle 24 toward the portion around the rotation center of the wafer W (Step S7: rinsing step). The DIW supplied onto the front surface of the wafer W receives a centrifugal force generated by the rotation of the wafer W to flow toward the peripheral edge of the wafer W on the front surface of the wafer W, whereby SC1 adhering to the front surface of the wafer W is rinsed away with the DIW.

After the supply of the DIW is continued for a predetermined rinsing period, the DIW valve 27 is closed to stop supplying the DIW onto the front surface of the wafer W.

In the intermediate rinsing step of Step S5 and the rinsing step of Step S7, the rinse liquid is not limited to the DIW, but carbonated water, electrolytic ion water, ozone water, reduced water (hydrogen water), magnetic water or the like may be used.

After a lapse of a predetermined period from the start of the rinsing step, the controller 55 closes the DIW valve 27 to stop supplying the DIW onto the front surface of the wafer W. Thereafter, the controller 55 drives the motor 6 to increase the rotation speed of the wafer W to a predetermined higher rotation speed (e.g., 1500 to 2500 rpm), whereby a spin drying process is performed to spin off the DIW from the wafer W to dry the wafer W (Step S8). In the spin drying process of Step S8, DIW adhering to the wafer W is removed from the wafer W.

After the spin drying process is performed for a predetermined spin drying period, the controller 55 controls the motor 6 to stop rotating the wafer rotating mechanism 3. Thus, the resist removing process is completed for the single wafer W, and the treated wafer W is unloaded from the treatment chamber 2 by the transport robot (Step S9).

According to this embodiment, as described above, the SPM liquid is supplied onto the front surface of the wafer W. The SPM liquid is supplied at a first flow rate (e.g., 0.9 liters/min) onto the front surface of the wafer W held by the wafer rotating mechanism 3, and the wafer W is rotated at the first rotation speed (e.g., 60 rpm), whereby the SPM liquid film 70 is formed on the front surface of the wafer W as covering the front surface. Thereafter, the rotation speed of the wafer W is reduced to the second rotation speed (e.g., 15 rpm), whereby the SPM liquid film 70 is continuously retained on the front surface of the wafer W.

With the liquid film 70 thus retained, the heater head 35 is located close to the front surface of the wafer W, and the emission of the infrared radiation from the infrared lamp 38 is started, whereby the SPM liquid present in the region of the front surface of the wafer W opposed to the infrared lamp 38 is heated by the infrared lamp 38. Further, the heater head 35 is moved along the front surface of the wafer W simultaneously with the heating by the infrared lamp 38. At this time, the region of the front surface of the wafer W opposed to the infrared lamp 38 is moved along the arcuate zone path within the range from the region including the rotation center of the wafer W to the region including the peripheral edge of the wafer W. This makes it possible to heat substantially the entire front surface of the wafer W, thereby heating the SPM liquid film 70 around the interface between the front surface of the wafer W and the SPM liquid film 70 formed on the front surface of the wafer W. As a result, the resist can be advantageously and evenly removed from the entire front surface of the wafer W.

Since the SPM liquid can be heated around the interface between the front surface of the wafer W and the SPM liquid, even a resist having a hardened layer can be removed from the front surface of the wafer W without ashing. Without the need for the ashing of the resist, the front surface of the wafer W is free from the damage due to the ashing.

Since the SPM liquid can be heated around the interface between the front surface of the wafer W and the SPM liquid, it is possible to promote the lift off of the resist, thereby reducing the time required for the resist removing process.

Where the resist is to be lifted off on the wafer W without performing the SPM liquid film forming step of Step S3 and the SPM liquid film heating step of Step S4, the SPM liquid kept at 200° C. or higher should be continuously supplied at a flow rate of 2 liters/min onto the wafer W for 60 seconds. At this time, the consumption of the SPM liquid required for performing the resist removing process on the single wafer W is 1 liter. In this case, sulfuric acid to be supplied into the mixing portion 14 from the sulfuric acid supply portion (not shown) should be kept at a higher temperature (about 180° C. to about 195° C.) in order to prepare the SPM liquid having a temperature of 200° C. or higher. Therefore, the consumption of sulfuric acid is increased and, in addition, the heat amount required for increasing the temperature of sulfuric acid is significantly increased.

In the present invention, in contrast, the supply of the SPM liquid to the wafer W is stopped in the SPM liquid film heating step of Step S4. Therefore, the consumption of the SPM liquid in the SPM liquid film forming step of Step S3 and the SPM liquid film heating step of Step S4 is reduced, for example, to about 0.075 liters. This makes it possible to reduce the consumption of sulfuric acid.

Further, it is possible to supply sulfuric acid at a lower temperature (about 80° C.) from the sulfuric acid supply portion (not shown) and to reduce the consumption of sulfuric acid. Therefore, the heat amount required for increasing the temperature of sulfuric acid can be significantly reduced as compared with the case in which sulfuric acid having a higher temperature (about 180° C. to about 195° C.) is consumed in a greater amount. Thus, the costs required for the treatment of the single wafer W are reduced.

The heater head 35 including the infrared lamp 38 and the lamp housing 40 is provided separately from the lift-off liquid nozzle 4. If the infrared lamp 38, the lamp housing 40 and the lift-off liquid nozzle 4 were incorporated in a common retention head, for example, only the SPM liquid just supplied onto the front surface of the wafer W from the lift-off liquid nozzle 4 would be heated by the infrared lamp 38 and the bottom plate 52.

In this embodiment, in contrast, the heater head 35 is provided separately from the lift-off liquid nozzle 4, so that the SPM liquid having a temperature reduced due to a lapse of time from the supply of the SPM liquid to the front surface of the wafer W can be thereafter heated. Thus, the temperature of the SPM liquid can be increased again. In this manner, the SPM liquid present on the front surface of the wafer W can be advantageously maintained at a higher temperature on the order of 200° C. or higher.

FIG. 11 is a time chart for explaining a control operation to be performed by the controller 55 in major steps of a second exemplary treatment for the resist removing process.

Figure 12:
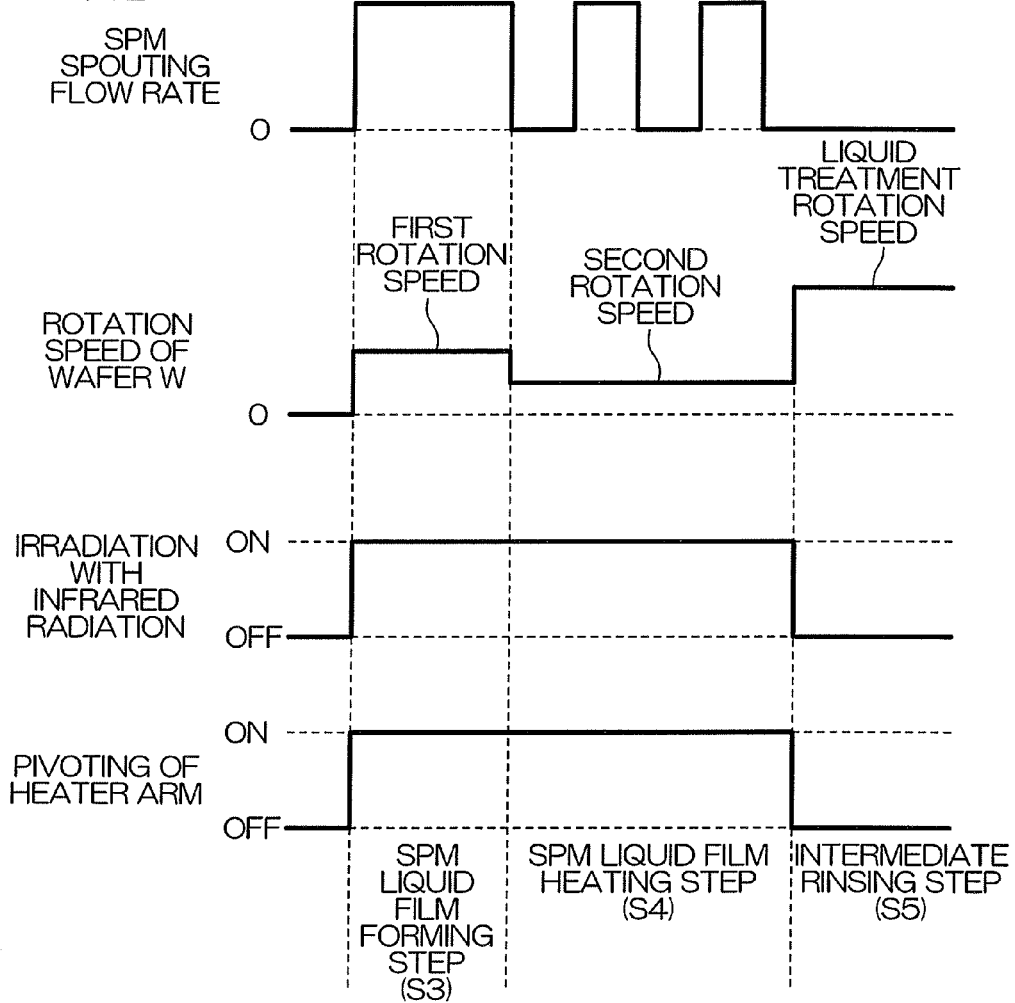
FIG. 12 is a time chart for explaining a control operation to be performed in major steps of a third exemplary treatment.

FIG. 12 is a time chart for explaining a control operation to be performed by the controller 55 in major steps of a third exemplary treatment for the resist removing process.

In the second exemplary treatment and the third exemplary treatment, as in the first exemplary treatment, the SPM liquid film forming step (Step S3 shown in FIG. 7), the SPM liquid film heating step (Step S4 shown in FIG. 7), the intermediate rinsing step (Step S5 shown in FIG. 7), the SC1 supplying step (Step S6 shown in FIG. 7) and the rinsing step (Step S7 shown in FIG. 7), and the spin drying process (Step S8 shown in FIG. 7) are performed in this order.

The second exemplary treatment and the third exemplary treatment are different from the first exemplary treatment in that, in the SPM liquid film heating step of Step S4, the SPM liquid is supplied onto the front surface of the wafer W at a per-unit-time flow rate lower than the first flow rate.

In the second exemplary treatment, more specifically, the controller 55 supplies the SPM liquid at the first flow rate to the wafer W held by the wafer rotating mechanism 3 at the initial stage of the SPM liquid film heating step of Step S4. At this time, the controller 55 controls the flow rate control valves 19, 21 to gradually reduce the flow rate of the SPM liquid to be supplied to the wafer W (for example, proportionally with time), as the SPM liquid film heating step of Step S4 proceeds. After a lapse of a predetermined period (e.g., 5 seconds) from the start of the SPM liquid film heating step, the controller 55 stops supplying the SPM liquid to the wafer W.

In the third exemplary treatment, the controller 55 intermittently supplies the SPM liquid at the first flow rate to the wafer W held by the wafer rotating mechanism 3 at the start of the SPM liquid film heating step of Step S4. More specifically, the intermittent supply of the SPM liquid may be achieved, for example, by repeatedly alternately switching on the supply of the SPM liquid for 2 seconds and switching off the supply of the SPM liquid for 5 seconds.

In the second exemplary treatment and the third exemplary treatment, the SPM liquid is newly added to the liquid film 70 when the SPM liquid film 70 is heated. Thus, the SPM liquid film 70 is stably retained on the front surface of the wafer W. Since the average supply flow rate (per unit time) of the SPM liquid to be supplied to the front surface of the wafer W is lower than the first flow rate, the consumption of the SPM liquid can be reduced.

In the second exemplary treatment, the supply of the SPM liquid to the wafer W is stopped in the midst of the SPM liquid film heating step of Step S4. However, the flow rate of the SPM liquid to be supplied to the wafer W may be once gradually reduced to the second flow rate lower than the first flow rate (for example, proportionally with time), and then maintained at the second flow rate.

In the third exemplary treatment, the SPM liquid is intermittently spouted at the first flow rate, but the flow rate for the intermittent spouting of the SPM liquid may be the second flow rate that is lower than the first flow rate.

Figure 13:
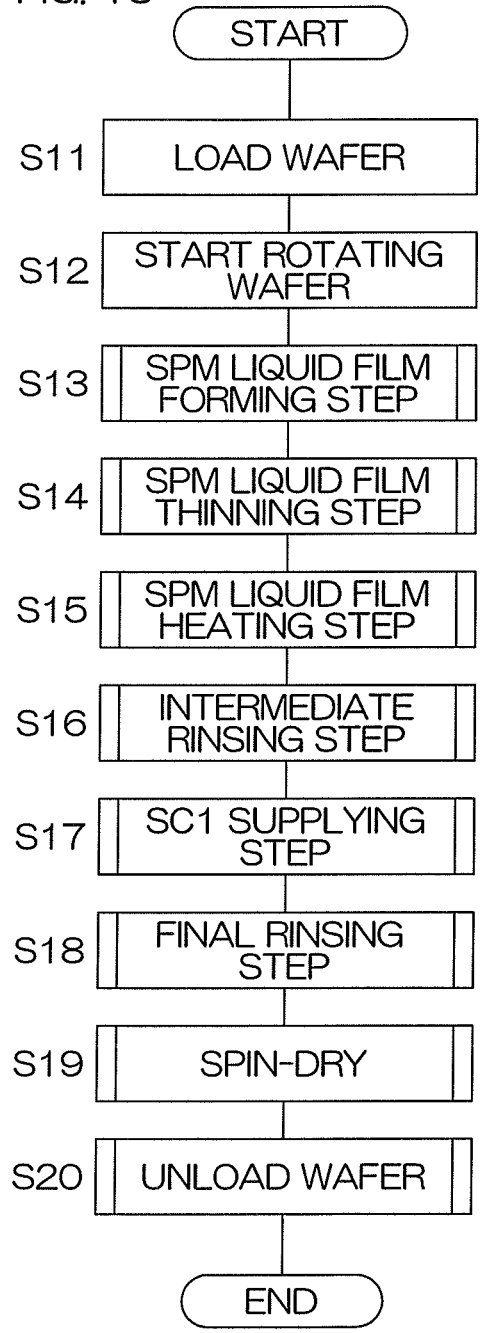
FIG. 13 is a process diagram showing a fourth exemplary treatment for the resist removing process.
Figure 14:
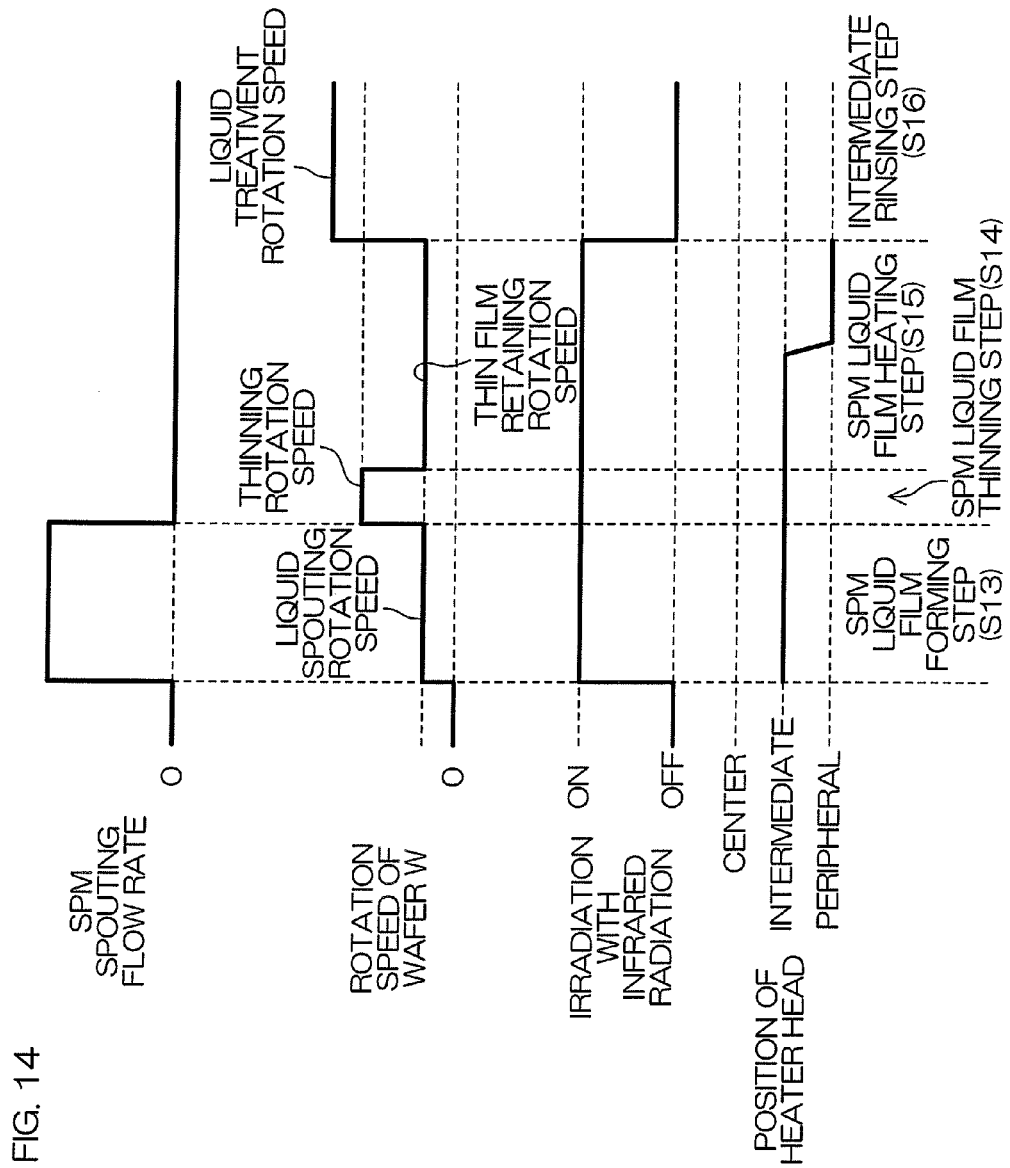
FIG. 14 is a time chart for explaining a control operation to be performed in major steps of the fourth exemplary treatment.
Figure 15A:
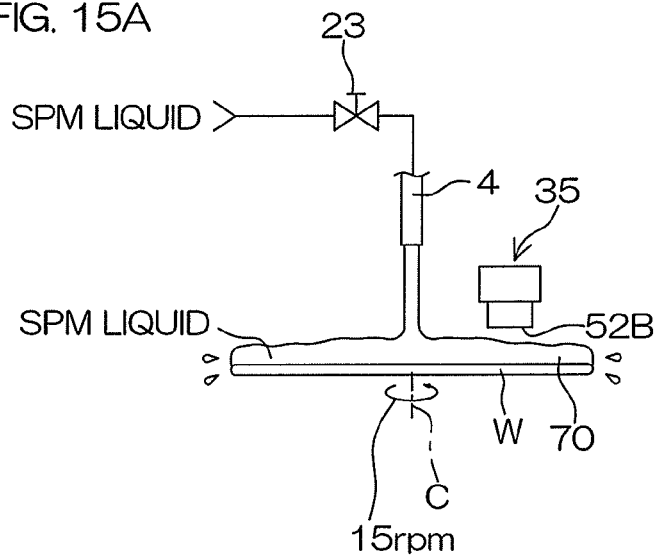
FIGS. 15A to 15C are schematic diagrams for explaining an SPM liquid film forming step, an SPM liquid film thinning step and an SPM liquid film heating step in the fourth exemplary treatment.
Figure 15B:
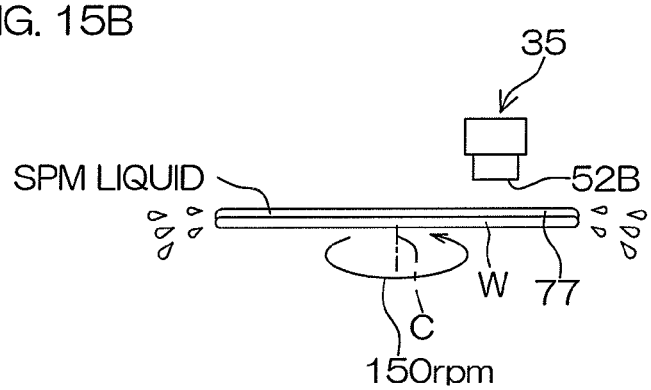
Figure 15C:
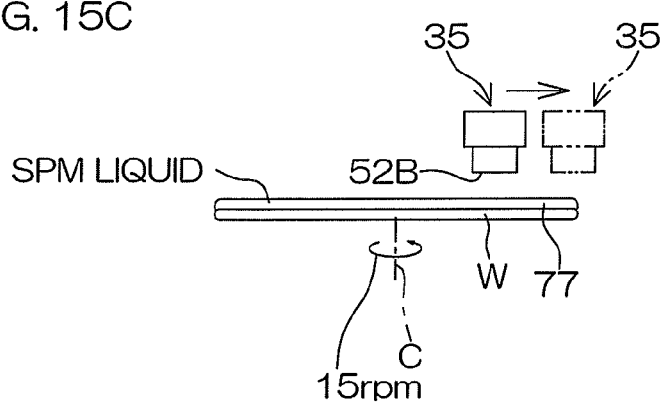

FIG. 13 is a process diagram showing a fourth exemplary treatment for the resist removing process to be performed by the substrate treatment apparatus 1. FIG. 14 is a time chart for explaining a control operation to be mainly performed by the controller 55 in an SPM liquid film forming step (liquid film forming step), an SPM liquid film thinning step (liquid film thinning step) and an SPM liquid film heating step (liquid film retaining step). FIGS. 15A to 15C are schematic diagrams for explaining the SPM liquid film forming step, the SPM liquid film thinning step and the SPM liquid film heating step.

Referring to FIGS. 1 to 6 and 13 to 15C, the fourth exemplary treatment for the resist removing process will be described.

In the resist removing process, the transport robot (not shown) is controlled to load a wafer W subjected to the ion implantation process into the treatment chamber 2 (see FIG. 1) (Step S11: wafer loading step). It is assumed that the wafer W has not been subjected to a resist ashing process. The wafer W is transferred to the wafer rotating mechanism 3 with its front surface facing up. At this time, the heater head 35, the lift-off liquid nozzle 4 and the SC1 nozzle 25 are located at their home positions so as not to prevent the loading of the wafer W.

With the wafer W held by the wafer rotating mechanism 3, the controller 55 controls the motor 6 to start rotating the wafer W (Step S12). The rotation speed of the wafer W is increased to a predetermined liquid spouting rotation speed, and then maintained at the liquid spouting rotation speed. The liquid spouting rotation speed is a speed which ensures that the entire front surface of the wafer W can be covered with the SPM liquid and, for example, is set at 15 to 300 rpm. In the fourth exemplary treatment, the liquid spouting rotation speed is set at a rotation speed substantially equal to a thin film retaining rotation speed (second rotation speed) to be described later. More specifically, the liquid spouting rotation speed is, for example, set at 15 rpm. The controller 55 controls the first liquid arm pivoting mechanism 12 to move the lift-off liquid nozzle 4 to above the wafer W. Thus, as shown in FIG. 15A, the lift-off liquid nozzle 4 is located above the rotation center (on the rotation axis C) of the wafer W.

The controller 55 opens the sulfuric acid valve 18, the hydrogen peroxide solution valve 20 and the lift-off liquid valve 23 to supply the SPM liquid onto the front surface of the wafer W from the lift-off liquid nozzle 4 as shown in FIG. 15A. Since the wafer W is rotated at the lower rotation speed, the SPM liquid supplied onto the front surface of the wafer W is accumulated on the front surface of the wafer W and distributed over the entire front surface of the wafer W. Thus, an SPM liquid film (resist lift-off liquid film) 70 is formed on the front surface of the wafer Was covering the entire front surface (Step S13: SPM liquid film forming step). The liquid spouting rotation speed is a very low speed, e.g., 15 rpm. Therefore, the SPM liquid film 70 formed on the front surface of the wafer W has a relatively great thickness. The thickness is, for example, about 1.8 mm.

Simultaneously with the SPM liquid film forming step of Step S13, the infrared radiation is emitted from the infrared lamp 38 of the heater head 35, and the heater head 35 is located at the intermediate adjacent position. More specifically, the heater head 35 is moved from the home position defined on the lateral side of the wafer rotating mechanism 3 to above the intermediate adjacent position (indicated by the slid line in FIG. 5), and then lowered to be located at the intermediate adjacent position.

After a lapse of a predetermined liquid supplying period from the start of the supply of the SPM liquid, the controller 55 closes the sulfuric acid valve 18, the hydrogen peroxide solution valve 20 and the lift-off liquid valve 23 to stop supplying the SPM liquid from the lift-off liquid nozzle 4. Further, the controller 55 controls the first liquid arm pivoting mechanism 12 to move the lift-off liquid nozzle 4 back to the home position after the supply of the SPM liquid is stopped. The SPM liquid supplying period may be longer than a period required for covering the entire front surface of the wafer W with the SPM liquid film 70. The SPM liquid supplying period varies depending on the flow rate of the SPM liquid to be spouted from the lift-off liquid nozzle 4 and the liquid spouting rotation speed, but is typically in a range of 3 to 30 seconds, e.g., 15 seconds.

In synchronism with the stop of the supply of the SPM liquid, the controller 55 controls the motor 6 to increase the rotation speed of the wafer W to a thinning rotation speed (first rotation speed in a range of 30 to 1000 rpm, e.g., 150 rpm). Thus, a centrifugal force generated by the rotation acts on the SPM liquid film 70 on the front surface of the wafer W, whereby the SPM liquid present on the front surface of the wafer W is partly drained from the peripheral edge of the wafer W. As a result, the thickness of the SPM liquid film 70 is reduced (Step S14: SPM liquid film thinning step). In other words, a thin SPM liquid film 77 is formed on the front surface of the wafer W. The thickness of the SPM liquid film 77 is, for example, 0.4 mm. In the SPM liquid film thinning step, the SPM liquid present on the wafer W is irradiated with the infrared radiation emitted from the infrared lamp 38 continuously from the SPM liquid film forming step.

After a lapse of a predetermined liquid film thinning period from the increase of the rotation speed of the wafer W to the thinning rotation speed, the controller 55 controls the motor 6 to reduce the rotation speed of the wafer W to the thin film retaining rotation speed. The liquid film thinning period may be longer than a period required for reducing the thickness of the SPM liquid film 70, and is typically in a range of 0.5 to 10 seconds, e.g., 5 seconds.

Even after the reduction of the rotation speed of the wafer W, the irradiation with the infrared radiation emitted from the heater head 35 is continued. Thus, the SPM liquid film heating step is performed to heat the wafer W and the SPM liquid film 77 present on the wafer W in Step S15.

The thin film retaining rotation speed is a speed (in a range of 1 to 30 rpm, e.g., 15 rpm) which ensures that the SPM liquid film 77 can be retained on the front surface of the wafer W even without newly supplying the SPM liquid onto the front surface of the wafer W. In the SPM liquid film heating step of Step S15, the SPM liquid is not newly supplied onto the front surface of the wafer W. However, a great centrifugal force does not act on the SPM liquid on the wafer W, because the rotation speed of the wafer W is low. Therefore, the thin SPM liquid film 77 is continuously retained on the front surface of the wafer W.

In the SPM liquid film heating step, a portion of the wafer W opposed to the bottom plate 52 of the heater head 35 and a portion of the SPM liquid film 77 present on the opposed portion of the wafer W are heated by the irradiation with the infrared radiation emitted from the infrared lamp 38. The SPM liquid film heating step is performed for a liquid film heating period (in a range of 2 to 90 seconds, e.g., about 40 seconds). Before a lapse of a predetermined period (e.g., 20 seconds that is approximately half the liquid film heating period) from the start of the SPM liquid film heating step, the heater head 35 is located at the intermediate adjacent position (indicated by the solid line in FIG. 5), whereby a radially intermediate portion of the wafer Wand a portion of the SPM liquid film 77 present on the radially intermediate portion are heated.

After a lapse of the predetermined period, as indicated by an arrow in FIG. 15C, the controller 55 controls the pivot drive mechanism 36 to move the heater head 35 from the intermediate adjacent position (indicated by the solid line in FIG. 5) horizontally (along the front surface of the wafer W) radially outward and stop the heater head 35 at the peripheral adjacent position (indicated by the two-dot-and-dash line in FIG. 5) (keeping-still step). Thus, the peripheral portion of the wafer W and the a portion of the SPM liquid film 77 present on the peripheral portion are heated.

In the SPM liquid film heating step of Step S15, the SPM liquid film 77 and the wafer W are heated by the irradiation with the infrared radiation emitted from the infrared lamp 38. Since the SPM liquid film 77 to be heated by the heater head 35 is thin, the SPM liquid film 77 can be sufficiently heated around an interface between the front surface of the wafer W and the liquid film 77. In the SPM liquid film heating step, a reaction between the SPM liquid and the resist on the front surface of the wafer W proceeds, whereby the resist is lifted off from the front surface of the wafer W.

In the SPM liquid film heating step of Step S15, the heater head 35 is located at either of the adjacent positions. Therefore, an atmosphere present between the lower surface 52B and the front surface of the wafer W can be isolated from a peripheral environment to be thereby kept hot. This suppresses the reduction in the temperature of the SPM liquid in the region of the front surface of the wafer W opposed to the lower surface 52B of the bottom plate 52. Thus, the SPM liquid present in this region can be maintained at a further higher temperature.

After a lapse of a predetermined liquid film heating period from the reduction of the rotation speed of the wafer W, the controller 55 controls the amplifier 54 to stop the emission of the infrared radiation from the infrared lamp 38. Further, the controller 55 controls the pivot drive mechanism 36 and the lift drive mechanism 37 to move the heater head 35 back to the home position. Then, the controller 55 controls the motor 6 to increase the rotation speed of the wafer W to a predetermined liquid treatment rotation speed (in a range of 300 to 1500 rpm, e.g., 1000 rpm), and opens the DIW valve 27 to supply the DIW from the spout of the DIW nozzle 24 toward the portion around the rotation center of the wafer W (Step S16: intermediate rinsing step). The DIW supplied onto the front surface of the wafer W receives a centrifugal force generated by the rotation of the wafer W to flow toward the peripheral edge of the wafer W on the front surface of the wafer W. Thus, SPM liquid adhering to the front surface of the wafer W is rinsed away with the DIW.

After the supply of the DIW is continued for a predetermined intermediate rinsing period, the DIW valve 27 is closed to stop supplying the DIW onto the front surface of the wafer W.

While maintaining the rotation speed of the wafer W at the liquid treatment rotation speed, the controller 55 opens the SC1 valve 31 to supply the SC1 from the SC1 nozzle 25 onto the front surface of the wafer W (Step S17). The controller 55 controls the second liquid arm pivoting mechanism 29 to pivot the second liquid arm 28 within the predetermined angular range to reciprocally move the SC1 nozzle 25 between a position above the rotation center and a position above the peripheral edge of the wafer W. Thus, the SC1 supply position on the front surface of the wafer W at which the SC1 is supplied from the SC1 nozzle 25 is reciprocally moved along the arcuate path crossing the wafer rotating direction within the range from the rotation center of the wafer W to the peripheral edge of the wafer W. Thus, the SC1 is evenly supplied over the entire front surface of the wafer W, whereby foreign matter such as a resist residue and particles adhering to the front surface of the wafer W can be removed by chemical power of the SC1.

After the supply of the SC1 is continued for a predetermined SC1 supplying period, the controller 55 closes the SC1 valve 31, and controls the second liquid arm pivoting mechanism 29 to move the SC1 nozzle 25 back to the home position. While maintaining the rotation speed of the wafer W at the liquid treatment rotation speed, the controller 55 opens the DIW valve 27 to supply the DIW from the spout of the DIW nozzle 24 toward the portion around the rotation center of the wafer W (Step S18: final rinsing step). The DIW supplied onto the front surface of the wafer W receives a centrifugal force generated by the rotation of the wafer W to flow toward the peripheral edge of the wafer W on the front surface of the wafer W, whereby SC1 adhering to the front surface of the wafer W is rinsed away with the DIW.

After the supply of the DIW is continued for a predetermined rinsing period, the DIW valve 27 is closed to stop supplying the DIW onto the front surface of the wafer W. In the intermediate rinsing step of Step S16 and the final rinsing step of Step S18, the rinse liquid is not limited to the DIW, but carbonated water, electrolytic ion water, ozone water, reduced water (hydrogen water), magnetic water or the like may be used.

After a lapse of a predetermined period from the start of the final rinsing step, the controller 55 closes the DIW valve 27 to stop supplying the DIW onto the front surface of the wafer W. Thereafter, the controller 55 drives the motor 6 to increase the rotation speed of the wafer W to a predetermined higher rotation speed (e.g., 1500 to 2500 rpm), whereby a spin drying process is performed to spin off the DIW from the wafer W to dry the wafer W (Step S19). In the spin drying process of Step S19, DIW adhering to the wafer W is removed from the wafer W.

After the spin drying process is performed for a predetermined spin drying period, the controller 55 controls the motor 6 to stop rotating the wafer rotating mechanism 3. Thus, the resist removing process is completed for the single wafer W, and the treated wafer W is unloaded from the treatment chamber 2 by the transport robot (Step S20).

According to this embodiment, as described above, the SPM liquid film thinning step (Step S14 in FIG. 13) is performed by rotating the wafer W at the higher thinning rotation speed without supplying the SPM liquid onto the front surface of the wafer W before the start of the SPM liquid film heating step (Step S15 in FIG. 13) after the SPM liquid film forming step (Step S13 in FIG. 13). In the SPM liquid film thinning step, the SPM liquid (resist lift-off liquid) present on the front surface of the wafer W is partly drained from the peripheral edge of the wafer W by the centrifugal force generated by the rotation of the wafer W, whereby the SPM liquid film 70 has a reduced thickness. Therefore, the SPM liquid film 77 (70) to be heated by the heater head 35 in the SPM liquid film heating step can be thinned, so that the SPM liquid can be efficiently heated around the interface between the front surface of the wafer W and the SPM liquid. As a result, the time required for the overall resist lift-off process can be reduced.

Where the SPM liquid film has a greater thickness and hence contains a greater amount of SPM liquid, for example, the SPM liquid is liable to boil on the front surface of the wafer W due to the heating by the heater head 35 to thereby generate a greater amount of mist (minute liquid droplets) of the SPM liquid. If the SPM liquid mist was dried in the treatment chamber 2, the resulting particles would be suspended in the internal atmosphere of the treatment chamber 2 to contaminate a wafer W to be subsequently treated.

In this embodiment, in contrast, the SPM liquid film 77 has a smaller thickness and hence contains a smaller amount of SPM liquid, so that the amount of the SPM liquid mist generated due to the heating by the heater head 35 is reduced. This suppresses the generation of the particles on the wafer W.

In the SPM liquid film forming step, the wafer W is rotated at the lower rotation speed (e.g., 15 rpm) substantially equal to the thin film retaining rotation speed, so that the entire front surface of the wafer W can be covered with the SPM liquid (the coverage of the wafer W with the SPM liquid can be ensured). Thus, the front surface of the wafer W can be entirely covered with the SPM liquid film 70.

Simultaneously with the heating by the heater head 35, the heater head 35 is moved from the intermediate adjacent position to the peripheral adjacent position, whereby the region of the front surface of the wafer W opposed to the heater head 35 is changed. Thus, the entire front surface of the wafer W and the entire SMP liquid film 77 present on the wafer W can be heated, so that the resist can be advantageously and evenly removed from the entire front surface of the wafer W.

After the completion of the SPM liquid film forming step, the supply of the SPM liquid to the wafer W is stopped. Therefore, the consumption of the SPM liquid in the resist removing process can be reduced.

This makes it possible to advantageously remove the resist from the front surface of the wafer W, while reducing the consumption of the SPM liquid.

Figure 16:
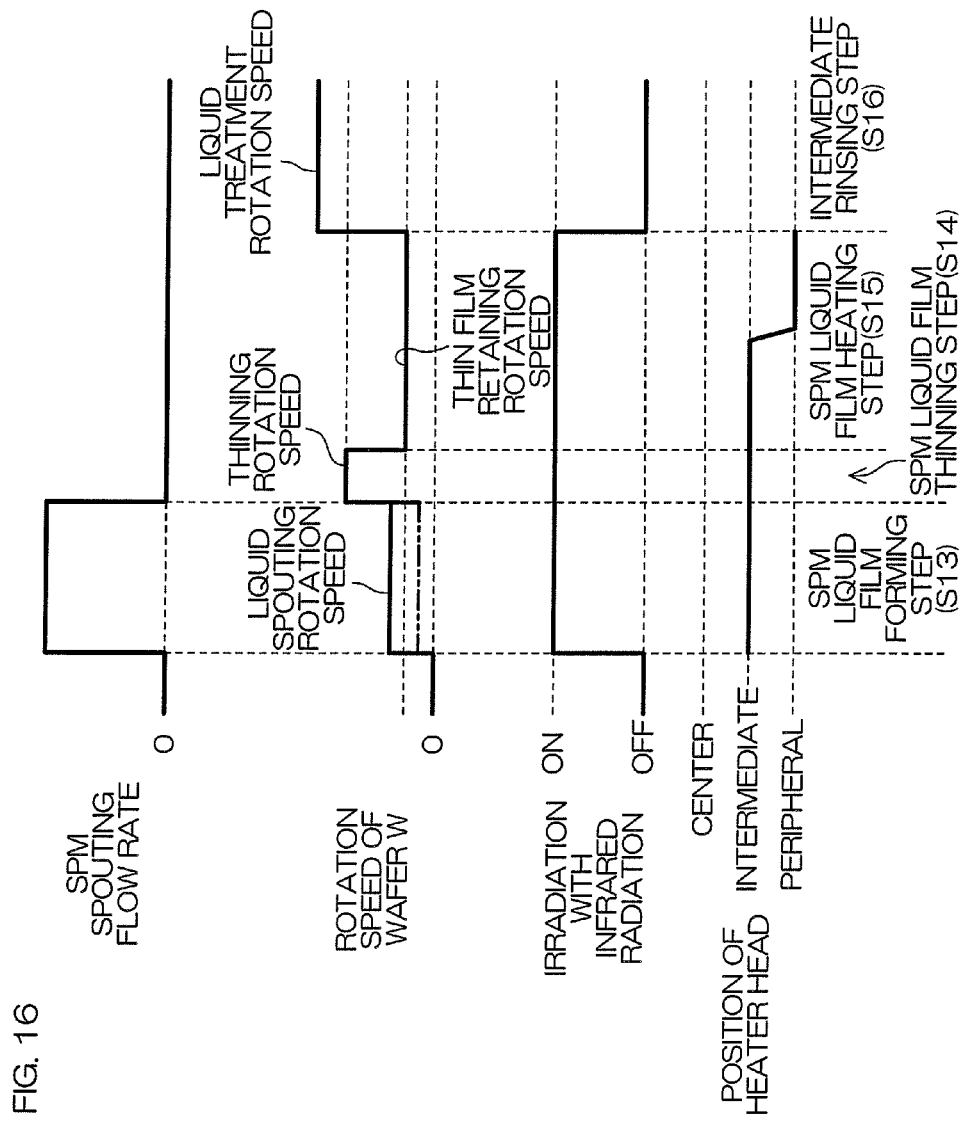
FIG. 16 is a time chart for explaining a fifth exemplary treatment for the resist removing process.

FIG. 16 is a time chart for explaining a fifth exemplary treatment for the resist removing process to be performed in the substrate treatment apparatus 1. In the fifth exemplary treatment, as in the fourth exemplary treatment, the SPM liquid film forming step (Step S13 in FIG. 13), the SPM liquid film thinning step (Step S14 in FIG. 13), the SPM liquid film heating step (Step S15 in FIG. 13), the intermediate rinsing step (Step S16 in FIG. 13), the SC1 supplying step (Step S17 in FIG. 13) and the final rinsing step (Step S18 in FIG. 13), and the spin drying process (Step S19 in FIG. 13) are performed in this order.

The fifth exemplary treatment is different from the fourth exemplary treatment in the rotation speed (liquid spouting rotation speed) of the wafer W in the SPM liquid film forming step. That is, the liquid spouting rotation speed is set at a speed (third rotation speed, e.g., 20 rpm) that is higher than the rotation speed (thin film retaining rotation speed, e.g., 15 rpm) of the wafer W in the SPM liquid film heating step, and lower than the rotation speed (thinning rotation speed, first rotation speed, e.g., 150 rpm) of the wafer W in the SPM liquid film thinning step.

Alternatively, as indicated by a two-dot-and-dash line in FIG. 16, the liquid spouting rotation speed may be set at a speed (fourth rotation speed, e.g., 10 rpm) that is lower than the thin film retaining rotation speed.

Figure 17:
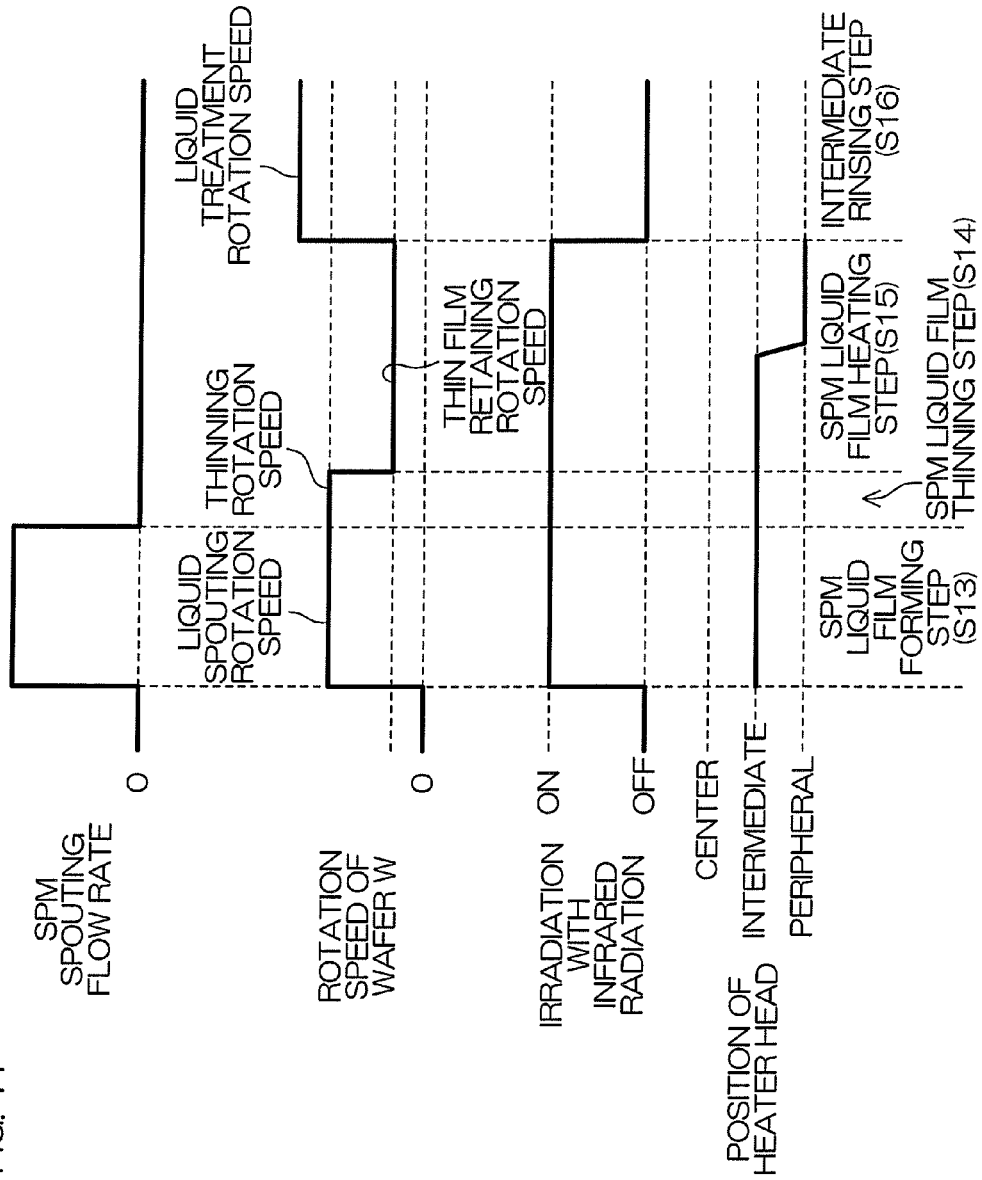
FIG. 17 is a time chart for explaining a sixth exemplary treatment for the resist removing process.

FIG. 17 is a time chart for explaining a sixth exemplary treatment for the resist removing process to be performed in the substrate treatment apparatus 1. In the sixth exemplary treatment, as in the fourth exemplary treatment, the SPM liquid film forming step (Step S13 in FIG. 13), the SPM liquid film thinning step (Step S14 in FIG. 13), the SPM liquid film heating step (Step S15 in FIG. 13), the intermediate rinsing step (Step S16 in FIG. 13), the SC1 supplying step (Step S17 in FIG. 13) and the final rinsing step (Step S18 in FIG. 13), and the spin drying process (Step S19 in FIG. 13) are performed in this order.

The sixth exemplary treatment is different from the fourth exemplary treatment in that the rotation speed (liquid spouting rotation speed) of the wafer W in the SPM liquid film forming step is set at the same speed as the rotation speed (thinning rotation speed, first rotation speed, e.g., 150 rpm) of the wafer W in the SPM liquid film thinning step.

Figure 18:
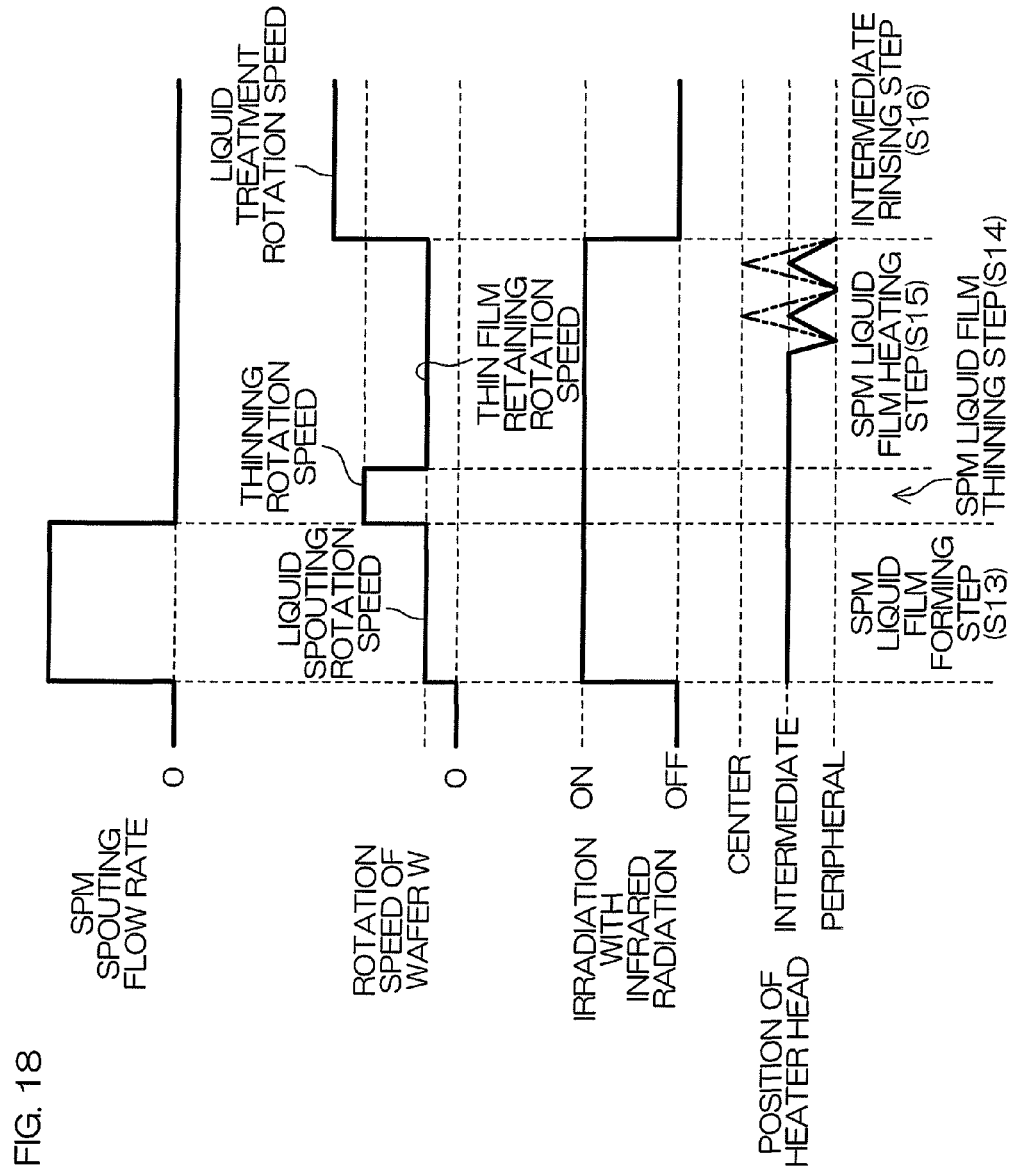
FIG. 18 is a time chart for explaining a seventh exemplary treatment for the resist removing process.

FIG. 18 is a time chart for explaining a seventh exemplary treatment for the resist removing process to be performed in the substrate treatment apparatus 1. In the fourth exemplary treatment, the heater head 35 is moved from the intermediate adjacent position (indicated by the solid line in FIG. 5) to the peripheral adjacent position (indicated by the two-dot-and-dash line in FIG. 5), and then kept still at the peripheral adjacent position (keeping-still step). In the seventh exemplary treatment, in contrast, the heater head 35 is continuously reciprocally moved between the intermediate adjacent position and the peripheral adjacent position while changing its moving direction (continuously moving step).

In the fourth to sixth exemplary treatments, the heater head 35 is moved from the intermediate adjacent position to the peripheral adjacent position and then kept still at the peripheral adjacent position by way of example. However, the heater head 35 may be moved from the peripheral adjacent position to the intermediate adjacent position and then kept still at the intermediate adjacent position.

In the fourth to sixth exemplary treatments, the heater head 35 may be moved not only in the SPM liquid film heating step but also in the SPM liquid film forming step and the SPM liquid film thinning step.

In the seventh exemplary treatment, the reciprocal movement of the heater head 35 may be started at the beginning of the SPM liquid film heating step.

In the seventh exemplary treatment, the heater head 35 may be reciprocally moved not only in the SPM liquid film heating step but also in the SPM liquid film forming step and the SPM liquid film thinning step.

In the fourth to seventh exemplary treatments, the heater head 35 is moved between the intermediate adjacent position and the peripheral adjacent position, but may be moved between the peripheral adjacent position and the center adjacent position. One conceivable case for this arrangement is, for example, that the heater head 35 is reciprocally moved between the peripheral adjacent position and the center adjacent position. Further, the heater head 35 may be moved between the intermediate adjacent position and the center adjacent position. One conceivable case for this arrangement is, for example, that the heater head 35 is reciprocally moved between the intermediate adjacent position and the center adjacent position.

In the SPM liquid film forming step of Step S3 or S13, the heating by the heater head 35 may be obviated. In the SPM liquid film forming step of Step S13 and the SPM liquid film thinning step of Step S14, the heating by the heater head 35 may be obviated. That is, the heating of the SPM liquid by the infrared lamp 38 may be carried out for the first time in the SPM liquid film heating step of Step S4 or S15.

During the supply of the SPM liquid from the lift-off liquid nozzle 4, the lift-off liquid nozzle 4 may be moved (for example, reciprocally moved). Further, the lift-off liquid nozzle 4 is not necessarily required to be the movable nozzle, but may be a stationary nozzle having a spout fixedly directed toward the portion around the rotation center of the wafer W.

The lift-off liquid nozzle 4 may be an oblique nozzle rather than the straight nozzle.

Figure 19:
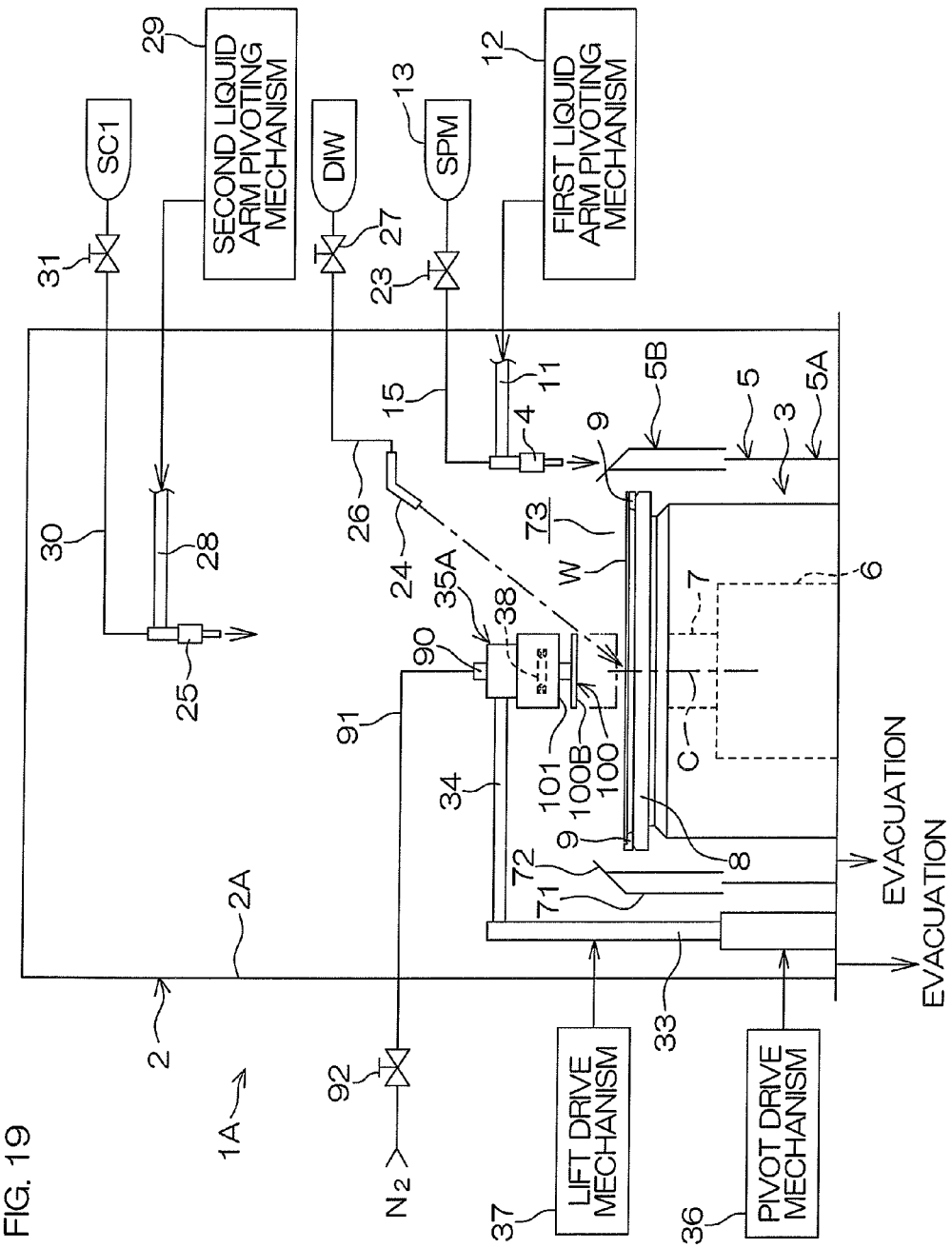
FIG. 19 is a diagram schematically showing the construction of a substrate treatment apparatus according to a second embodiment of the present invention.

FIG. 19 is a diagram schematically showing the construction of a substrate treatment apparatus 1A according to a second embodiment of the present invention. In FIG. 19, components corresponding to those shown in FIG. 1 described above will be designated by the same reference characters as in FIG. 1, and duplicate description will be omitted. Reference will be made again to FIGS. 3, 5, 6, 7, 8 and 10 for description of this embodiment.

The substrate treatment apparatus 1A is an apparatus of a single wafer treatment type to be used, for example, in a resist removing process for removing an unnecessary resist from a front surface (major surface) of a wafer W (an example of a substrate) after an ion implantation process for implanting an impurity into the front surface of the wafer W or after a dry etching process.

The substrate treatment apparatus 1A includes a wafer rotating mechanism (substrate holding unit) 3 which holds and rotates the wafer W, a lift-off liquid nozzle (chemical liquid supplying unit) 4 which supplies an SPM liquid (an example of a resist lift-off liquid (chemical liquid)) onto the front surface (upper surface) of the wafer W held by the wafer rotating mechanism 3, and a heater head (retention head) 35A to be located in opposed relation to the front surface of the wafer W held by the wafer rotating mechanism 3 for heating the SPM liquid on the front surface of the wafer W. The wafer rotating mechanism 3, the lift-off liquid nozzle 4 and the heater head 35A are provided in a treatment chamber 2.

Figure 22:
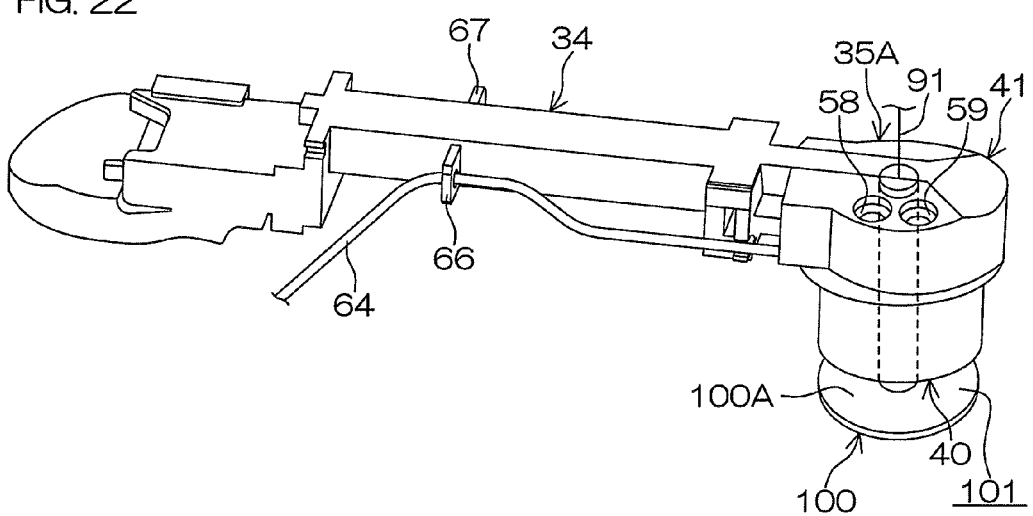
FIG. 22 is a perspective view showing a combination of a heater arm and the heater head in the second embodiment.

FIG. 20 is a schematic sectional view of the heater head 35A. FIG. 21 is a diagram of the heater head 35A taken along a sectional plane and seen in a direction XXI-XXI in FIG. 20. In FIG. 20, components corresponding to those shown in FIG. 2 described above will be designated by the same reference characters as in FIG. 2, and duplicate description will be omitted. FIG. 22 is a perspective view showing a combination of the heater arm 34 and the heater head 35A. In FIG. 22, components corresponding to those shown in FIG. 4 described above will be designated by the same reference characters as in FIG. 4, and duplicate description will be omitted.

The heater head 35A includes a round tubular (cylindrical) inert gas flow pipe (gas flow pipe) 90 extending vertically, a generally annular infrared lamp 38 surrounding the inert gas flow pipe 90, and a disk-shaped lower baffle plate 100 horizontally attached to a distal end (lower end) of the vertically extending inert gas flow pipe 90. In other words, the lower baffle plate 100 is supported by the inert gas flow pipe 90. The heater head 35A further includes a lamp housing 40 which is a bottomed cylindrical container having a top opening 39 and accommodating the infrared lamp 38, a support member 42 which supports the infrared lamp 38 while suspending the infrared lamp 38 in the lamp housing 40, and a lid 41 which closes the opening 39 of the lamp housing 40. In this embodiment, the lid 41 is fixed to a distal end of the heater arm 34.

A distal end portion (lower end portion) of the inert gas flow pipe 90 extends through a bottom plate (upper baffle plate) 52 of the lamp housing 40 to project (downward) from a lower surface 52B of the bottom plate 52 to the distal side, and the distal end of the inert gas flow pipe 90 is closed by the lower baffle plate 100. In this embodiment, the inert gas flow pipe 90, the lamp housing 40 and the lower baffle plate 100 are integrally formed of transparent quartz.

A proximal end portion (upper end portion) of the inert gas flow pipe 90 extends upward to the outside of the lid 41. An inert gas supply line 91 (gas supply unit) is connected to the proximal end of the inert gas flow pipe 90 outside the lid 41. Nitrogen gas (an example of inert gas) is supplied to the inert gas supply line 91 from an inert gas supply source. An inert gas valve 92 (gas supply unit, see FIG. 19) for switching on and off the supply of the nitrogen gas to the inert gas flow pipe 90 is provided in the inert gas supply line 91.

The lower baffle plate 100 has a disk shape defined about a center axis of the inert gas flow pipe 90. The lower baffle plate 100 has substantially the same diameter as the bottom plate 52 of the lamp housing 40 to be described later. The lower baffle plate 100 has an upper surface 100A and a lower surface (opposed surface) 100B, which are each a horizontal and flat surface.

The bottom plate (upper baffle plate) 52 of the lamp housing 40 has a disk shape defined about the center axis of the inert gas flow pipe 90. The bottom plate 52 has an upper surface 52A and a lower surface 52B, which are each a horizontal and flat surface. In other words, the bottom plate 52 and the lower baffle plate 100 are planar plates which are disposed horizontally parallel to each other.

An annular inert gas outlet port (gas outlet port) 101 directed (laterally) outward is defined between a peripheral edge of the upper surface 100A of the lower baffle plate 100 and a peripheral edge of the lower surface 52B of the bottom plate 52 (a peripheral edge of a lower surface of the lamp housing 40). The inert gas outlet port 101 is an outlet port which spouts the nitrogen gas laterally radially horizontally (along the front surface of the wafer W).

As shown in FIGS. 20 and 21, the inert gas flow pipe 90 has a plurality of separate outlet holes 95 (e.g., eight separate outlet holes 95) formed in the lower end portion (distal end portion) thereof below the lower surface 52B of the bottom plate 52 or in a pipe wall portion thereof between the lower surface 52B of the bottom plate 52 and the upper surface 100A of the lower baffle plate 100 as extending thicknesswise of the pipe wall thereof. The separate outlet holes 95 are circumferentially equidistantly provided in the inert gas flow pipe 90 at the same positional level with respect to a gas flow direction of the inert gas flow pipe 90. The separate outlet holes 95 have the same shape and the same size. The separate outlet holes 95 are configured so as to spout the nitrogen gas radially outward of a round sectional plane of the inert gas flow pipe 90 which is taken (perpendicularly to the flow direction) as containing the separate outlet holes 95.

The inert gas outlet port 101 communicates with the separate outlet holes 95. The nitrogen gas supplied to the inert gas flow pipe 90 flows through the inert gas flow pipe 90 to be spouted from the separate outlet holes 95. The nitrogen gas spouted from the separate outlet holes 95 is regulated into streams flowing horizontally radially outward by the bottom plate 52 of the lamp housing 40 and the lower baffle plate 100 and supplied to the inert gas outlet port 101. Thus, the nitrogen gas is spouted horizontally laterally radially from the inert gas outlet port 101.

In order to evenly radially spout the nitrogen gas from the inert gas outlet port 101, the number of the separate outlet holes 95 is desirably four or more, and the separate outlet holes 95 are desirably provided in circumferentially equidistantly spaced relation.

The infrared lamp 38 has the same structure as in the first embodiment (see FIG. 3).

The pipe wall of the inert gas flow pipe 90 surrounded by the infrared lamp 38 is heated by irradiation with infrared radiation emitted from the infrared lamp 38. When the nitrogen gas is supplied to the inert gas flow pipe 90 from the inert gas supply line 91 in this state, the nitrogen gas flowing through the inert gas flow pipe 90 is heated by the pipe wall of the inert gas flow pipe 90. Therefore, the nitrogen gas flowing through the inert gas flow pipe 90 to be thereby heated to a higher temperature is spouted from the inert gas outlet port 101 through the separate outlet holes 95.

During the irradiation with the infrared radiation emitted from the infrared lamp 38, the temperatures of the lamp housing 40, the inert gas flow pipe 90 and the lower baffle plate 100 are also increased. Therefore, the lamp housing 40, the inert gas flow pipe 90 and the lower baffle plate 100 are each formed of heat-resistant quartz and, hence, are substantially free from the breakage and the melt-down. Further, quartz is highly transmissive to the infrared radiation, so that the infrared radiation from the infrared lamp 38 is properly outputted downward of the lower baffle plate 100 through the lamp housing 40 and the lower baffle plate 100.

Since the annular portion 43 of the infrared lamp 38 assumes a horizontal attitude, the front surface of the wafer W horizontally held has an increased irradiation area. Thus, the SPM liquid present on the wafer W can be efficiently irradiated with the infrared radiation.

In the resist removing process to be described later, the annular portion 43 of the infrared lamp 38 and the lower surface 100B of the lower baffle plate 100 are located in opposed relation to the front surface of the wafer W held by the wafer rotating mechanism 3.

In this embodiment, as shown in FIG. 6, the inert gas valve 92 is also controlled by the controller 55.

Figure 23A:
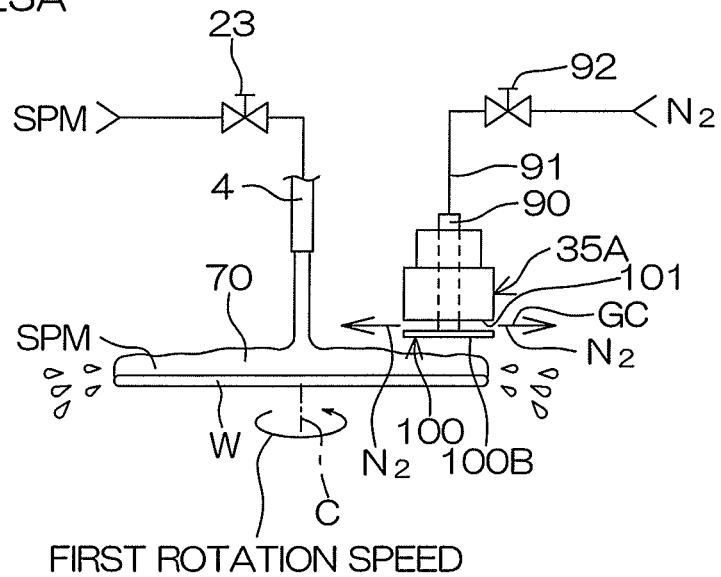
FIGS. 23A and 23B are schematic sectional views for explaining an SPM liquid film forming step and an SPM liquid film heating step in the second embodiment.
Figure 23B:
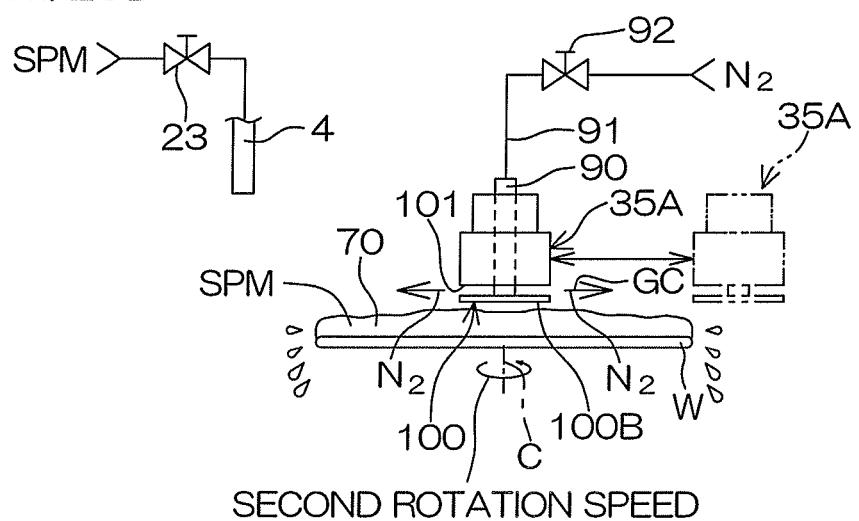

The substrate treatment apparatus 1A according to this embodiment performs an exemplary treatment for the resist removing process based on the process diagram and the time chart respectively shown in FIGS. 7 and 8 described above. FIGS. 23A and 23B are schematic sectional views for explaining an SPM liquid film forming step and an SPM liquid film heating step. For description of a movement range of the heater head 35A in the SPM liquid film heating step, reference will be made to FIG. 10 described above.

Referring to FIGS. 3, 5, 6, 7, 8, 10 and 19 to 23B, the exemplary treatment for the resist removing process will be described.

In the resist removing process, the transport robot (not shown) is controlled to load a wafer W subjected to the ion implantation process into the treatment chamber 2 (see FIG. 19) (Step S1 in FIG. 7: wafer loading step). It is assumed that the wafer W has not been subjected to the resist ashing process. The wafer W is transferred to the wafer rotating mechanism 3 with its front surface facing up. At this time, the heater head 35A, the lift-off liquid nozzle 4 and the SC1 nozzle 25 are located at their home positions so as not to prevent the loading of the wafer W.

With the wafer W held by the wafer rotating mechanism 3, the controller 55 controls the motor 6 to start rotating the wafer W. The rotation speed of the wafer W is increased to a first rotation speed (in a range of 30 to 300 rpm, e.g., 60 rpm), and then maintained at the first rotation speed (Step S2 in FIG. 7). The first rotation speed is a speed which ensures that a liquid film of the SPM liquid can be retained on the front surface of the wafer W. Further, the controller 55 controls the first liquid arm pivoting mechanism 12 to move the lift-off liquid nozzle 4 to above the wafer W.

After the rotation speed of the wafer W reaches the first rotation speed, the controller 55 opens the lift-off liquid valve 23 to supply the SPM liquid onto the front surface of the wafer W from the lift-off liquid nozzle 4 as shown in FIG. 23A.

Since the rotation speed of the wafer W is the first rotation speed, the SPM liquid supplied onto the front surface of the wafer W is accumulated on the front surface of the wafer W, and the SPM liquid film (chemical liquid film) 70 is formed on the front surface of the wafer W as covering the entire front surface (Step S3 in FIG. 7: SPM liquid film forming step).

As shown in FIG. 23A, the controller 55 controls the first liquid arm pivoting mechanism 12 to locate the lift-off liquid nozzle 4 above the rotation center of the wafer W. Thus, the SPM liquid film 70 is formed on the front surface of the wafer W, whereby the entire front surface of the wafer W is covered with the SPM liquid film 70.

Simultaneously with the SPM liquid film forming step of Step S3, the controller 55 controls the amplifier 54 to cause the infrared lamp 38 to emit the infrared radiation, and controls the pivot drive mechanism 36 and the lift drive mechanism 37 to pivot and vertically move the heater arm 34 retaining the heater head 35A above the wafer W. More specifically, the heater head 35A is moved to a peripheral retracted position above the peripheral edge portion of the front surface of the wafer W, and then moved down from the peripheral retracted position to a peripheral adjacent position to be opposed to the peripheral edge portion of the front surface of the wafer W (as indicated by the two-dot-and-dash line in FIG. 10).

Simultaneously with the SPM liquid film forming step of Step S3, the controller 55 opens the inert gas valve 92. The nitrogen gas is supplied to the inert gas flow pipe 90 (see FIG. 20) to be thereby vigorously spouted from the inert gas outlet port 101 of the heater head 35A horizontally laterally radially. Thus, a gas curtain GC is formed laterally around the heater head 35A.

A liquid film forming period required for forming the SPM liquid film 70 over the entire front surface of the wafer W varies depending on the flow rate of the SPM liquid to be spouted from the lift-off liquid nozzle 4, but may be in a range of 2 to 15 seconds, e.g., 5 seconds.

After a lapse of the liquid film forming period (e.g., 5 seconds) from the start of the supply of the SPM liquid, the controller 55 controls the motor 6 to reduce the rotation speed of the wafer W to a predetermined second rotation speed that is lower than the first rotation speed. Thus, the SPM liquid film heating step of Step S4 is performed.

The second rotation speed is a speed (in a range of 1 to 20 rpm, e.g., 15 rpm) which ensures that the SPM liquid film 70 can be retained on the front surface of the wafer W without the supply of the SPM liquid to the wafer W. In synchronism with the reduction of the rotation speed of the wafer W by the motor 6, as shown in FIG. 23B, the controller 55 closes the lift-off liquid valve 23 to stop supplying the SPM liquid from the lift-off liquid nozzle 4. At the same time, the controller 55 controls the first liquid arm pivoting mechanism 12 to move the lift-off liquid nozzle 4 back to the home position. Even without the supply of the SPM liquid to the wafer W, the SPM liquid film 70 is continuously retained on the front surface of the wafer W by reducing the rotation speed of the wafer W to the second rotation speed.

Even after the reduction of the rotation speed of the wafer W, as shown in FIG. 23B, the SPM liquid present on the front surface of the wafer W is continuously heated by the infrared lamp 38 of the heater head 35A (Step S4 in FIG. 7: SPM liquid film heating step). The controller 55 controls the amplifier 54 to cause the infrared lamp 38 to emit the infrared radiation, and controls the pivot drive mechanism 36 and the lift drive mechanism 37 to reciprocally move the heater head 35A between a center adjacent position (opposed to the rotation center of the wafer W as indicated by the solid line in FIG. 10) and the peripheral adjacent position (indicated by the two-dot-and-dash line in FIG. 10) as shown in FIGS. 23B and 10. Further, the controller 55 keeps the inert gas valve 92 open. Thus, the nitrogen gas is vigorously spouted from the inert gas outlet port 101 of the heater head 35A horizontally laterally radially, whereby the gas curtain GC is formed.

By the irradiation with the infrared radiation emitted from the infrared lamp 38, the SPM liquid is rapidly heated in a region of the front surface of the wafer W opposed to the infrared lamp 38. Since the irradiation with the infrared radiation emitted from the infrared lamp 38 is continued, a greater amount of SPM liquid mist is generated around the front surface of the wafer W.

Figure 24:
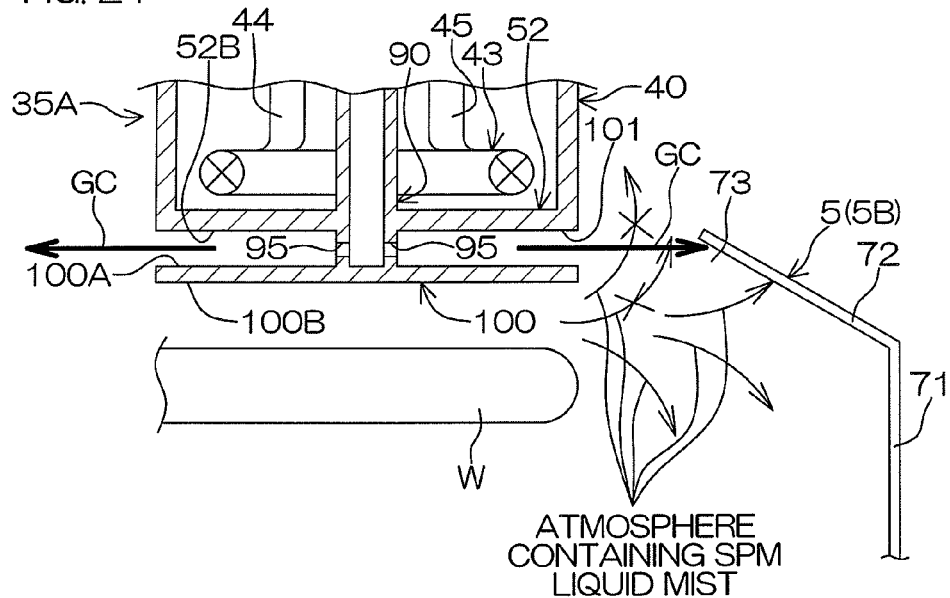
FIG. 24 is a diagram showing a gas curtain to be formed by nitrogen gas spouted from an inert gas outlet port of the heater head.

FIG. 24 is a diagram showing the gas curtain GC formed by the nitrogen gas spouted from the inert gas outlet port 101.

With the heater head 35A located at any of the adjacent positions, the inert gas outlet port 101 is located in the opening 73 of the cup 5. The nitrogen gas radially spouted from the inert gas outlet port 101 totally forms a film-like radial gas stream. The nitrogen gas is spouted toward the open end of the cup 5 from the inert gas outlet port 101 located in the opening 73. Therefore, the gas curtain GC of the film-like radial gas stream is formed to close the entire opening 73 from above. Thus, the internal atmosphere of the cup 5 containing the SPM liquid mist is confined in the cup 5 to be thereby prevented from flowing out of the cup 5 as shown in FIG. 24.

As described above, the nitrogen gas having a higher temperature is spouted from the inert gas outlet port 101. Therefore, the gas curtain GC can be formed at a higher temperature. Thus, the SPM liquid present on the front surface of the wafer W held by the wafer rotating mechanism 3 can be substantially prevented from being cooled. As a result, the SPM liquid present on the front surface of the wafer W can be kept hot.

Then, the region of the front surface of the wafer W opposed to the infrared lamp 38 is moved along an arcuate zone path from a region including the rotation center of the wafer W to a region including the peripheral edge of the wafer W as shown in FIG. 10. Thus, the entire front surface of the wafer W can be heated.

Since the SPM liquid film 70 is heated around an interface between the front surface of the wafer W and the SPM liquid film 70 by the irradiation with the infrared radiation emitted from the infrared lamp 38, a reaction between the resist present on the front surface of the wafer W and the SPM liquid can be promoted. The peripheral adjacent position is a position at which a part of the annular portion 43 of the infrared lamp 38 reaches the outer peripheral edge of the wafer W or projects radially outward of the outer peripheral edge of the wafer W when the heater head 35A is seen from above.

When the heater head 35A is located at any of the adjacent positions, the lower surface of the heater head 35A, i.e., the lower surface 100B of the lower baffle plate 100, is kept spaced a minute distance (e.g., 3 mm) from the front surface of the wafer W. Therefore, an atmosphere present between the lower surface 100B and the front surface of the wafer W can be isolated from a peripheral environment to be thereby kept hot. This suppresses the reduction in the temperature of the SPM liquid present in a region of the front surface of the wafer W opposed to the lower surface 100B. Thus, the SPM liquid can be maintained at a further higher temperature in the region of the front surface of the wafer W opposed to the lower surface 100B.

In the SPM liquid film heating step of Step S4, the SPM liquid film 70 is heated around the interface between the front surface of the wafer W and the SPM liquid film 70. Thus, the reaction between the SPM liquid and the resist present on the front surface of the wafer W proceeds, so that the resist is lifted off from the front surface of the wafer W.

After a lapse of a predetermined liquid film heating period (in a range of 5 to 240 seconds, e.g., about 14 seconds) from the reduction of the rotation speed of the wafer W, the controller 55 controls the amplifier 54 to stop emitting the infrared radiation from the infrared lamp 38. Further, the controller 55 controls the pivot drive mechanism 36 and the lift drive mechanism 37 to move the heater head 35A back to the home position. Then, the controller 55 controls the motor 6 to increase the rotation speed of the wafer W to a predetermined liquid treatment rotation speed (in a range of 300 to 1500 rpm, e.g., 1000 rpm). Further, the controller 55 opens the DIW valve 27 to supply the DIW from the spout of the DIW nozzle 24 toward a portion around the rotation center of the wafer W (Step S5 in FIG. 7: intermediate rinsing step). The DIW supplied onto the front surface of the wafer W receives a centrifugal force generated by the rotation of the wafer W to flow toward the peripheral edge of the wafer W on the front surface of the wafer W. Thus, SPM liquid adhering to the front surface of the wafer W is rinsed away with the DIW.

After the supply of the DIW is continued for a predetermined intermediate rinsing period, the DIW valve 27 is closed to stop supplying the DIW onto the front surface of the wafer W.

While maintaining the rotation speed of the wafer W at the liquid treatment rotation speed, the controller 55 opens the SC1 valve 31 to supply the SC1 from the SC1 nozzle 25 onto the front surface of the wafer W (Step S6 in FIG. 7). The controller 55 controls the second liquid arm pivoting mechanism 29 to pivot the second liquid arm 28 within the predetermined angular range to reciprocally move the SC1 nozzle 25 between the position above the rotation center of the wafer W and the position above the peripheral edge of the wafer W. Thus, the SC1 supply position on the front surface of the wafer W at which the SC1 is supplied from the SC1 nozzle 25 is reciprocally moved along the arcuate path crossing the wafer rotating direction within the range from the rotation center of the wafer W to the peripheral edge of the wafer W. Thus, the SC1 is evenly supplied over the entire front surface of the wafer W, whereby foreign matter such as a resist residue and particles adhering to the front surface of the wafer W can be removed by chemical power of the SC1.

After the supply of the SC1 is continued for a predetermined SC1 supplying period, the controller 55 closes the SC1 valve 31, and controls the second liquid arm pivoting mechanism 29 to move the SC1 nozzle 25 back to the home position. While maintaining the rotation speed of the wafer W at the liquid treatment rotation speed, the controller 55 opens the DIW valve 27 to supply the DIW from the spout of the DIW nozzle 24 toward the portion around the rotation center of the wafer W (Step S7 in FIG. 7: rinsing step). The DIW supplied onto the front surface of the wafer W receives a centrifugal force generated by the rotation of the wafer W to flow toward the peripheral edge of the wafer W on the front surface of the wafer W, whereby SC1 adhering to the front surface of the wafer W is rinsed away with the DIW.

After the supply of the DIW is continued for a predetermined rinsing period, the DIW valve 27 is closed to stop supplying the DIW onto the front surface of the wafer W. In the intermediate rinsing step of Step S5 and the rinsing step of Step S7, the rinse liquid is not limited to the DIW, but carbonated water, electrolytic ion water, ozone water, reduced water (hydrogen water), magnetic water or the like may be used as in the first embodiment.

After a lapse of a predetermined period from the start of the rinsing step, the controller 55 closes the DIW valve 27 to stop supplying the DIW onto the front surface of the wafer W. Thereafter, the controller 55 drives the motor 6 to increase the rotation speed of the wafer W to a predetermined higher rotation speed (e.g., 1500 to 2500 rpm), whereby a spin drying process is performed to spin off the DIW from the wafer W to dry the wafer W (Step S8 in FIG.

7). In the spin drying process of Step S8, DIW adhering to the wafer W is removed from the wafer W.

After the spin drying process is performed for a predetermined spin drying period, the controller 55 controls the motor 6 to stop rotating the wafer rotating mechanism 3. Thus, the resist removing process is completed for the single wafer W, and the treated wafer W is unloaded from the treatment chamber 2 by the transport robot (Step S9).

According to this embodiment, as described above, the infrared lamp 38 is located in opposed relation to the front surface of the wafer W, and the infrared radiation is emitted from the infrared lamp 38, whereby the SPM liquid is heated in the region of the front surface of the wafer W opposed to the infrared lamp 38.

Simultaneously with the heating by the infrared lamp 38, the infrared lamp 38 is moved along the front surface of the wafer W. Therefore, the region of the front surface of the wafer W opposed to the infrared lamp 38 is moved along the arcuate zone path within the range from the region including the rotation center of the wafer W to the region including the peripheral edge of the wafer W, whereby substantially the entire front surface of the wafer W is heated by the infrared lamp 38.

In this case, the SPM liquid present on the front surface of the wafer W is heated around the interface between the front surface of the wafer W and the SPM liquid, so that the reaction between the SPM liquid and the resist present on the front surface of the wafer W can be promoted. Therefore, the resist can be advantageously removed from the entire front surface of the wafer W. Even a resist having a hardened layer can be removed from the front surface of the wafer W without the ashing. Without the need for the ashing of the resist, it is possible to eliminate the problem of the damage to the front surface of the wafer W due to the ashing.

While the SPM liquid present on the front surface of the wafer W is heated, the nitrogen gas is spouted from the annular inert gas outlet port 101 horizontally laterally radially. Thus, the gas curtain GC is formed as closing the opening 73. The internal space of the cup 5 accommodating the wafer rotating mechanism 3 is isolated from the external space of the cup 5 by the gas curtain GC.

When the SPM liquid is rapidly heated by the infrared lamp 38, a greater amount of the SPM liquid mist is liable to be generated around the front surface of the wafer W. However, the internal space and the external space of the cup 5 are isolated from each other by the gas curtain GC formed by the nitrogen gas spouted from the annular inert gas outlet port 101. Thus, the atmosphere containing the SPM liquid mist can be confined within the cup 5 to be thereby substantially prevented from diffusing into the treatment chamber 2 (outside the gas curtain GC). This prevents the contamination of the inside of the treatment chamber 2.

In the arrangement of this embodiment, the inert gas outlet port 101 and the infrared lamp 38 are disposed in adjacent relation, and the inert gas outlet port 101 is horizontally moved as the infrared lamp 38 is moved. Therefore, the atmosphere containing the SPM liquid mist can be efficiently confined within the cup 5 irrespective of the position of the heater head 35.

Further, the nitrogen gas is horizontally spouted from the inert gas outlet port 101, and the heater head 35A is horizontally moved. Therefore, the gas curtain GC is kept constant irrespective of the position of the heater head 35A.

In the exemplary treatment described above, the supply of the SPM liquid is obviated in the SPM liquid film heating step (Step S4 in FIG. 7). In the SPM liquid film heating step of Step S4, however, the SPM liquid may be supplied at a flow rate lower than the first flow rate onto the front surface of the wafer W, or may be intermittently supplied at the first flow rate to the wafer W held by the wafer rotating mechanism 3.

Figure 25:
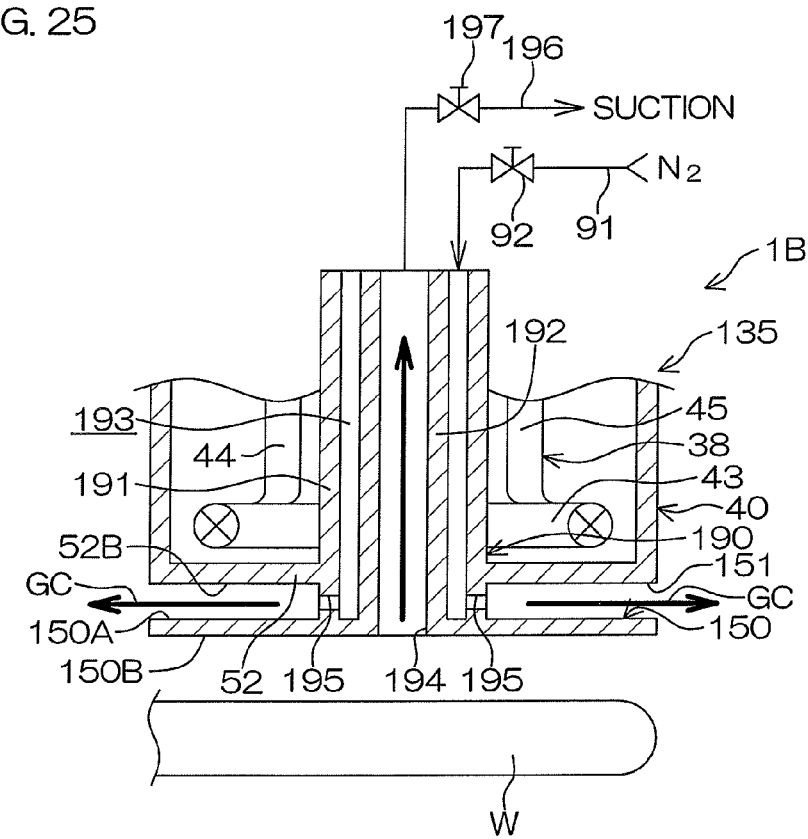
FIG. 25 is a sectional view of a heater head (retention head) of a substrate treatment apparatus according to a third embodiment of the present invention.

FIG. 25 is a sectional view of a heater head (retention head) 135 of a substrate treatment apparatus 1B according to a third embodiment of the present invention. The substrate treatment apparatus 1B has substantially the same construction as in FIG. 19, except that the heater head (retention head) 135 is provided instead of the heater head 35A shown in FIG. 20. In the heater head 135 shown in FIG. 25, components corresponding to those of the heater head 35A of the second embodiment will be designated by the same reference characters as in FIG. 20, and duplicate description will be omitted.

In the heater head 135 of the third embodiment, a vertically extending round suction pipe 192 is inserted in an inert gas flow pipe 191 (gas flow pipe). Thus, the inert gas flow pipe 191 and the suction pipe 192 form a double pipe structure 190.

In the heater head 135 of the third embodiment, the suction pipe 192 has a suction port 194 provided in a lower surface (opposed surface) 150B of a lower baffle plate 150. The lower baffle plate 150 has substantially the same structure as the lower baffle plate 100 shown in FIG. 20, except that the suction port 194 is provided therein. An annular inert gas outlet port (gas outlet port) 151 directed outward is defined between a peripheral edge of an upper surface 150A of the lower baffle plate 150 and the peripheral edge of the lower surface 52B of the bottom plate 52.

The inert gas flow pipe 191 is a round pipe (cylindrical pipe) having greater inner and outer diameters than the inert gas flow pipe 90 (see FIG. 20). A distal end portion (lower end portion) of the inert gas flow pipe 191 extends through the bottom plate 52 of the lamp housing 40 to project (downward) from the lower surface 52B of the bottom plate 52 to the distal side, and the distal end of the inert gas flow pipe 191 is partly closed by the lower baffle plate 150. The suction pipe 192 is a round pipe (cylindrical pipe) having a smaller outer diameter than the inner diameter of the inert gas flow pipe 191 and disposed coaxially with the inert gas flow pipe 191. Therefore, a cylindrical inert gas flow passage 193 is defined between an inner wall of the inert gas flow pipe 191 and an outer wall of the suction pipe 192. The inert gas supply line 91 is connected to the inert gas flow passage 193.

A distal end portion (lower end portion) of the suction pipe 192 vertically extends through the lower baffle plate 150 to open in the lower surface 150B of the lower baffle plate 150 to form the suction port 194. A proximal end (upper end) of the suction pipe 192 is connected to one of opposite ends of a suction line 196. The other end of the suction line 196 is connected to a constantly operating suction device (not shown). A suction valve 197 for opening and closing the suction pipe 192 is provided in the suction line 196.

In this embodiment, the inert gas flow pipe 191, the suction pipe 192, the lamp housing 40 and the lower baffle plate 150 are integrally formed of transparent quartz.

The inert gas flow pipe 191 has a plurality of separate outlet holes 195 (e.g., eight separate outlet holes 195) formed in the lower end portion (distal end portion) thereof below the lower surface 52B of the bottom plate 52 or a pipe wall portion thereof between the lower surface 52B of the bottom plate 52 and the upper surface 150A of the lower baffle plate 150 as extending thicknesswise of the pipe wall. The separate outlet holes 195 are circumferentially equidistantly provided in the inert gas flow pipe 191 at the same positional level with respect to a gas flow direction in the inert gas flow pipe 191. The separate outlet holes 195 have the same shape and the same size. The separate outlet holes 195 are configured so as to spout the nitrogen gas radially outward of a round sectional plane of the inert gas flow pipe 191 which is taken (perpendicularly to the flow direction) as containing the separate outlet holes 95.

As shown in FIG. 25, the inert gas outlet port (gas outlet port) 151 communicates with the separate outlet holes 195. The nitrogen gas supplied to the inert gas flow passage 193 flows through the inert gas flow passage 193 to be spouted from the separate outlet holes 195. The nitrogen gas spouted from the separate outlet holes 195 is regulated into streams flowing horizontally radially outward by the bottom plate 52 of the lamp housing 40 and the lower baffle plate 150 and supplied to the inert gas outlet port 151. Thus, the nitrogen gas is spouted horizontally laterally radially from the inert gas outlet port 151.

According to the third embodiment, when the lower surface 150B of the lower baffle plate 150 is located in closely opposed relation to the front surface of the wafer W (at a position equivalent to any of the adjacent positions described above), the suction port 194 is also opposed to the front surface of the wafer W. When the suction valve 197 is opened in this state to suck the suction port 194, an atmosphere present between the lower surface 150B of the lower baffle plate 150 and the front surface of the wafer W is sucked through the suction port 194. By the suction through the suction port 194, the pressure in a space defined between the lower surface 150B of the lower baffle plate 150 and the front surface of the wafer W is reduced to a negative pressure.

Where the infrared lamp 38 disposed in opposed relation to the front surface of the wafer W is used to heat the SPM liquid present on the front surface of the wafer W, there is a possibility that the SPM liquid present on the front surface of the wafer W is rapidly heated to cause significant convection above the front surface of the wafer W. As the convection is increased, the amount of heat escaping from the SPM liquid present on the front surface of the wafer W is increased. Therefore, the SPM liquid present on the front surface of the wafer W is likely to be cooled.

In the third embodiment, the pressure in the space defined between the lower surface 150B of the lower baffle plate 150 and the front surface of the wafer W is kept negative. This substantially prevents the significant convention from occurring in the space between the lower surface of the lower baffle plate 150 and the front surface of the wafer W, thereby reducing the amount of the heat escaping from the SPM liquid present on the front surface of the wafer W due to the convection. Thus, the SPM liquid present on the front surface of the wafer W is substantially prevented from being cooled. As a result, the SPM liquid present on the front surface of the wafer W can be kept hot.

In this case, the pressure in the space defined between the lower surface 150B of the lower baffle plate 150 and the front surface of the wafer W decreases in a direction toward the suction port 194. Therefore, a particularly excellent temperature keeping effect can be provided on a portion of the front surface of the wafer W opposed to the suction port 194.

Further, the SPM liquid is liable to be rapidly heated by the infrared lamp 38 to suddenly boil to generate a greater amount of SPM liquid mist in the space defined between the lower surface 150B of the lower baffle plate 150 and the front surface of the wafer W. However, an atmosphere containing the SPM liquid mist is sucked into the suction port 194 to be thereby expelled from the space defined between the lower surface 150B of the lower baffle plate 150 and the front surface of the wafer W.

Figure 26:
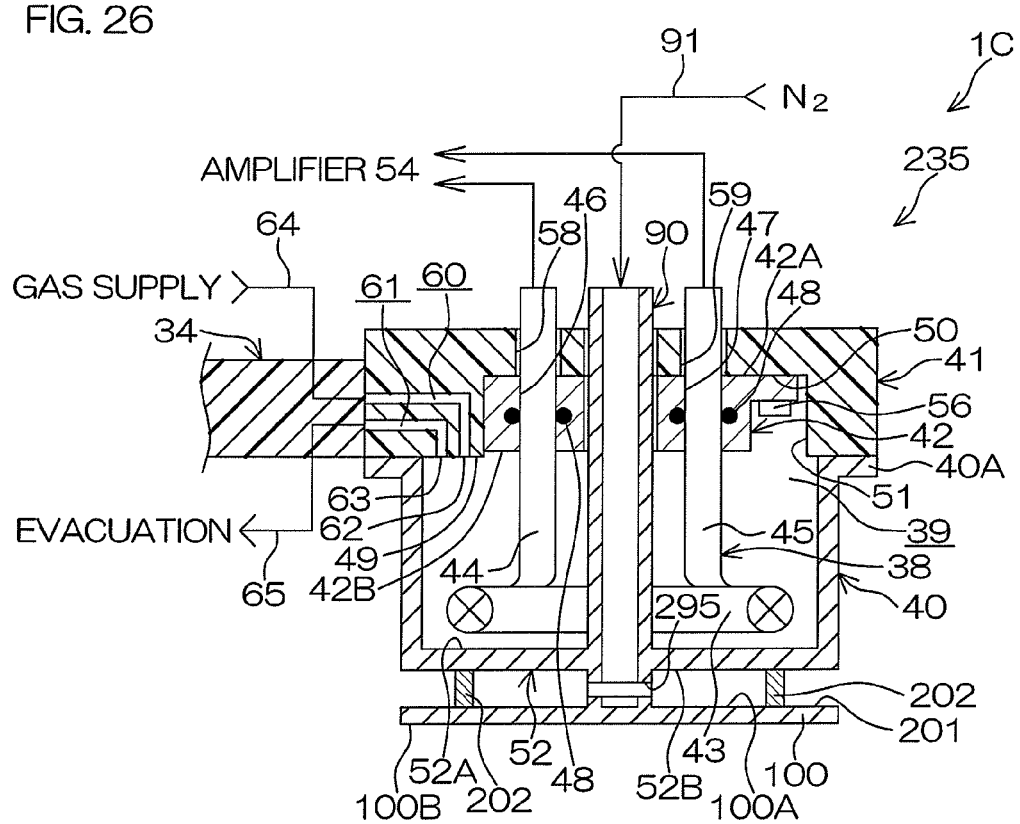
FIG. 26 is a sectional view of a heater head (retention head) of a substrate treatment apparatus according to a fourth embodiment of the present invention.

FIG. 26 is a sectional view of a heater head (retention head) 235 of a substrate treatment apparatus 1C according to a fourth embodiment of the present invention. The substrate treatment apparatus 1C has substantially the same construction as in FIG. 19, except that the heater head (retention head) 235 is provided instead of the heater head 35A shown in FIG. 20. In the heater head 235 shown in FIG. 26, components corresponding to those of the heater head 35A of the second embodiment will be designated by the same reference characters as in FIG. 20, and duplicate description will be omitted.

In the heater head 235 of the fourth embodiment, the inert gas flow pipe 90 has a single annular outlet hole 295 extending thicknesswise therethrough. The lamp housing 40 and the lower baffle plate 100 are connected to each other by a plurality of connection pieces 202 for supporting the lower baffle plate 100.

The third embodiment and the fourth embodiment may be combined together. That is, the single annular outlet hole 295 may be employed instead of the plurality of separate outlet holes 195 in the arrangement shown in FIG. 25.

In the second to fourth embodiments, the bottom plate 52 of the lamp housing 40 serves as the upper baffle plate, but the upper baffle plate may be provided separately from the lamp housing 40. In this case, quartz is desirably employed as a material for the upper baffle plate.

Further, the heater head 35A, 135, 235 may be configured so as not to be scanned (moved).

The nitrogen gas is employed as the gas to be spouted from the inert gas outlet port 101, 151 by way of example, but clean air or other inert gas may be employed as the gas.

Figure 27:
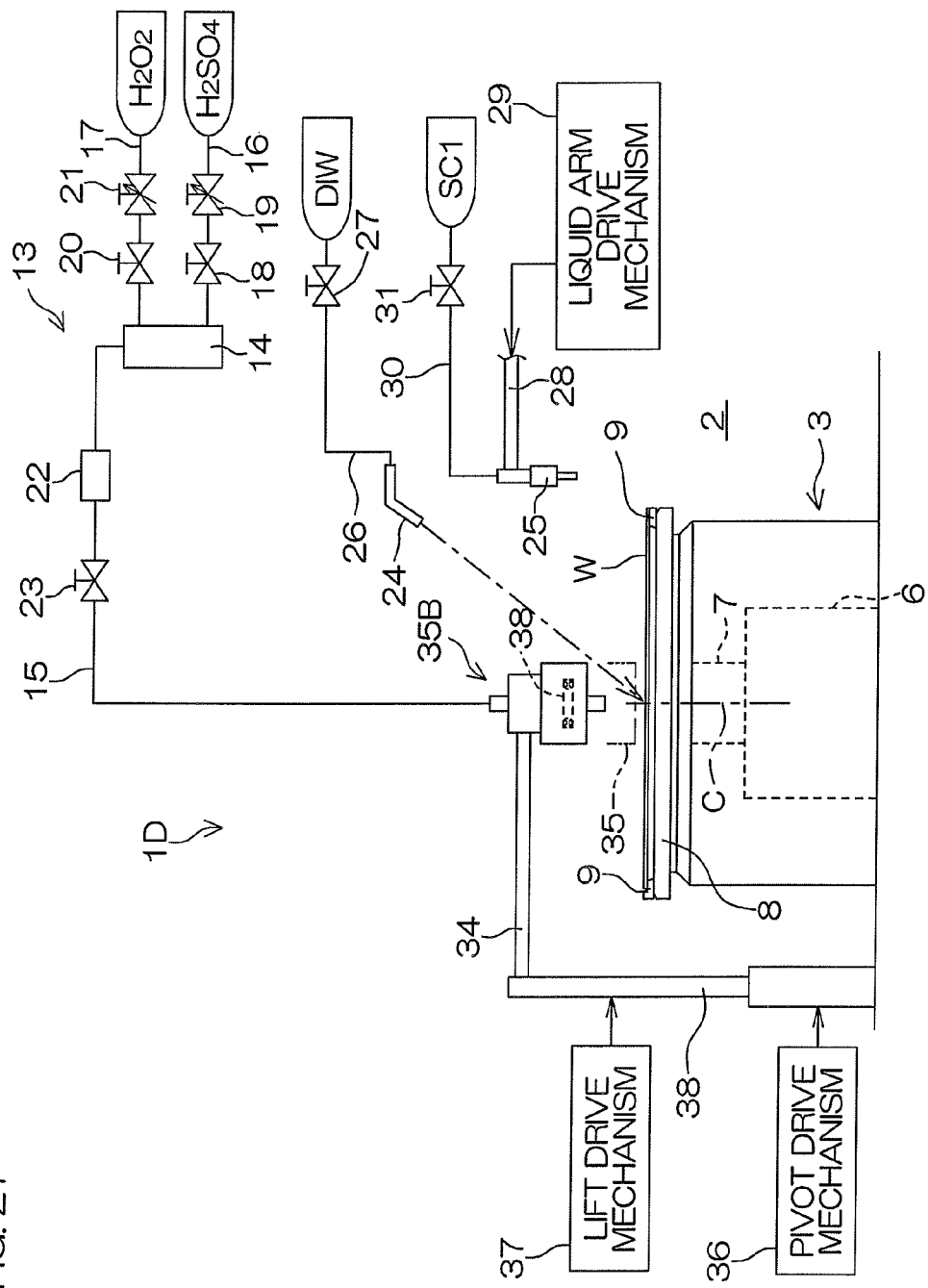
FIG. 27 is a diagram schematically showing the construction of a substrate treatment apparatus according to a fifth embodiment of the present invention.

FIG. 27 is a diagram schematically showing the construction of a substrate treatment apparatus 1D according to a fifth embodiment of the present invention. In FIG. 27, components corresponding to those shown in FIG. 1 described above will be designated by the same reference characters as in FIG. 1, and duplicate description will be omitted. Reference will be made again to FIGS. 3, 5, 6, 7 and 8 for the description of this embodiment.

The substrate treatment apparatus 1D is an apparatus of a single wafer treatment type to be used in a resist removing process for removing an unnecessary resist from a front surface (major surface) of a wafer W (an example of a substrate) after an ion implantation process for implanting an impurity into the front surface of the wafer W or after a dry etching process.

The substrate treatment apparatus 1D includes a wafer rotating mechanism (substrate holding unit) 3 which holds and rotates the wafer W, and an integral head (retention head) 35B to be located in opposed relation to the front surface (upper surface) of the wafer W held by the wafer rotating mechanism 3 to supply an SPM liquid (an example of a resist lift-off liquid (chemical liquid)) onto the front surface of the wafer W and heat the SPM liquid on the front surface of the wafer W. The wafer rotating mechanism 3 and the integral head 35B are provided in a treatment chamber 2.

Figure 28:
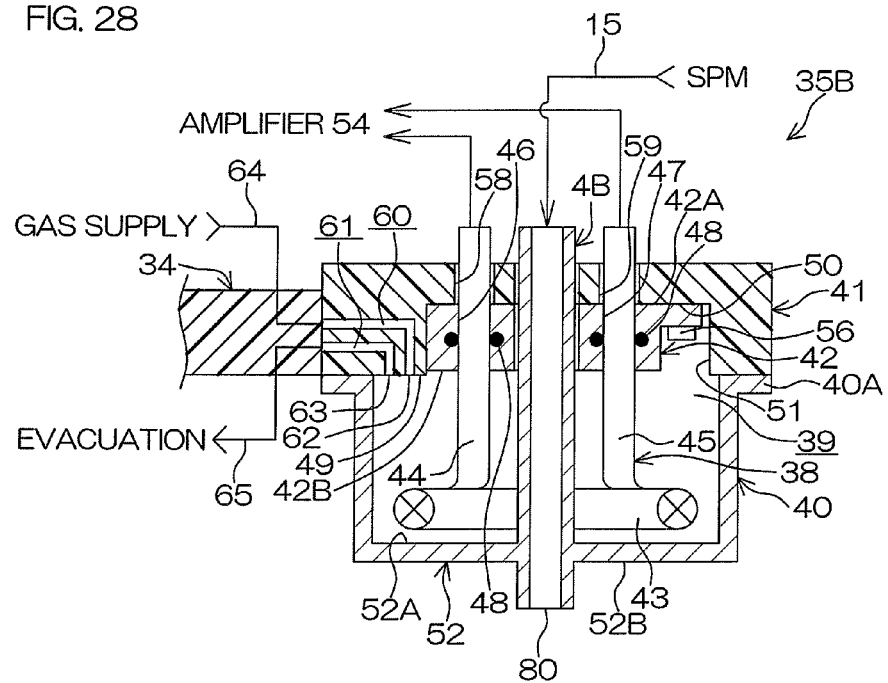
FIG. 28 is a schematic sectional view of an integral head in the fifth embodiment.
Figure 29:
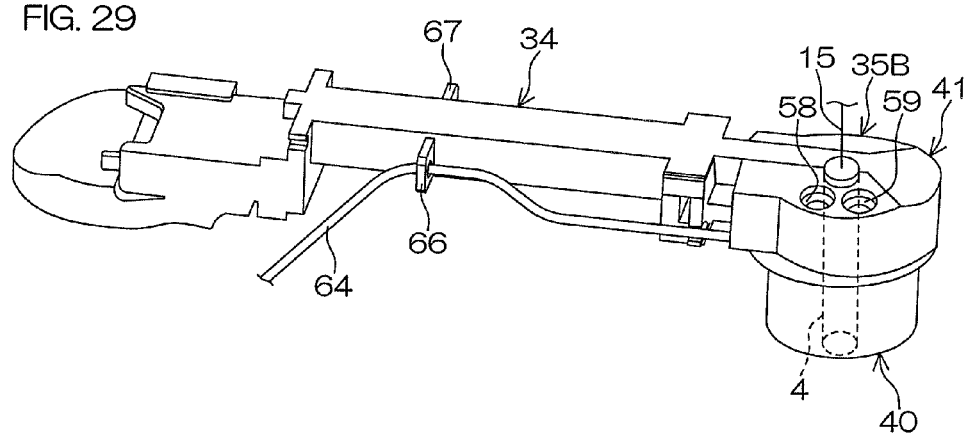
FIG. 29 is a perspective view showing a combination of an arm and the integral head in the fifth embodiment.

FIG. 28 is a schematic sectional view of the integral head 35B. In FIG. 28, components corresponding to those shown in FIG. 2 described above will be designated by the same reference characters as in FIG. 2, and duplicate description will be omitted. FIG. 29 is a perspective view showing a combination of an arm 34 and the integral head 35B. In FIG.

29, components corresponding to those shown in FIG. 4 described above will be designated by the same reference characters as in FIG. 4, and duplicate description will be omitted.

The integral head 35B includes a vertically extending lift-off liquid flow pipe (chemical liquid flow pipe) 4B, and a generally annular infrared lamp 38 surrounding the lift-off liquid flow pipe 4B. The lift-off liquid flow pipe 4B is a round pipe (cylindrical pipe). The integral head 35B further includes a lamp housing 40 which is a bottomed container having a top opening 39 and accommodating the infrared lamp 38, a support member 42 which supports the infrared lamp 38 while suspending the infrared lamp 38 in the lamp housing 40, and a lid 41 which closes the opening 39 of the lamp housing 40. In this embodiment, the lid 41 is fixed to a distal end of the arm 34. Further, the lift-off liquid flow pipe 4B and the lamp housing 40 are integrally formed of transparent quartz.

A distal end portion (lower end portion) of the lift-off liquid flow pipe 4B extends through a bottom plate 52 of the lamp housing 40, and projects (downward) from a lower surface 52B of the bottom plate 52 to the distal side to open downward. The distal opening of the lift-off liquid flow pipe 4B serves as a lift-off liquid outlet port (chemical liquid outlet port) 80 from which the SPM liquid is spouted.

On the other hand, a proximal end portion of the lift-off liquid flow pipe 4B extends upward to the outside of the lid 41 (see FIG. 28). A lift-off liquid supply line 15 is connected to the proximal end of the lift-off liquid flow pipe 4B from the outside of the lid 41, so that the SPM liquid is supplied to the lift-off liquid flow pipe 4B from the lift-off liquid supply line 15.

When electric power is supplied to the infrared lamp 38 from an amplifier 54 as shown in FIG. 28, the infrared lamp 38 emits infrared radiation, which is in turn outputted downward from the integral head 35B through the lamp housing 40. The bottom plate 52 of the lamp housing 40 is heated, for example, to about 300° C. by irradiation with the infrared radiation emitted from the infrared lamp 38. Thus, the bottom plate 52 of the lamp housing 40 functions as a heat source. In this embodiment, therefore, not only the infrared lamp 38 but also the bottom plate 52 of the lamp housing 40 functions as a part of a heater. Since the bottom plate 52 of the lamp housing 40 functions as the heater for heating the SPM liquid, the lamp housing 40 serves to heat the SPM liquid as well as to protect the infrared lamp 38.

A pipe wall of the lift-off liquid flow pipe 4B surrounding the infrared lamp 38 is heated to about 300° C. by the irradiation with the infrared radiation emitted from the infrared lamp 38. In this state, the SPM liquid is supplied to the lift-off liquid flow pipe 4B from a lift-off liquid supplying mechanism 13, whereby the SPM liquid flowing through the lift-off liquid flow pipe 4B is heated by the pipe wall of the lift-off liquid flow pipe 4B. Further, the SPM liquid flowing through the lift-off liquid flow pipe 4B receives the infrared radiation emitted from the infrared lamp 38 to be thereby heated. Therefore, the SPM liquid flowing through the lift-off liquid flow pipe 4B to be thereby heated to a higher temperature is spouted from the lift-off liquid outlet port 80.

As described above, the lamp housing 40 and the lift-off liquid flow pipe 4B are partly heated to about 300° C. by the irradiation with the infrared radiation emitted from the infrared lamp 38. Therefore, the lamp housing 40 and the lift-off liquid flow pipe 4B are formed of heat-resistant quartz and, therefore, are substantially free from the breakage and the melt-down.

An annular portion 43 of the infrared lamp 38 and the bottom plate 52 are disposed parallel to each other, so that the annular portion 43 extends along the bottom plate 52. Therefore, the annular portion 43 can emit the infrared radiation over a greater irradiation area of the bottom plate 52, so that the bottom plate 52 can be efficiently heated by the infrared lamp 38. Since the annular portion 43 of the infrared lamp 38 assumes a horizontal attitude, the front surface of the wafer W horizontally held also has a greater irradiation area. Thus, the SPM liquid present on the front surface of the wafer W can be efficiently irradiated with the infrared radiation.

Figure 30A:
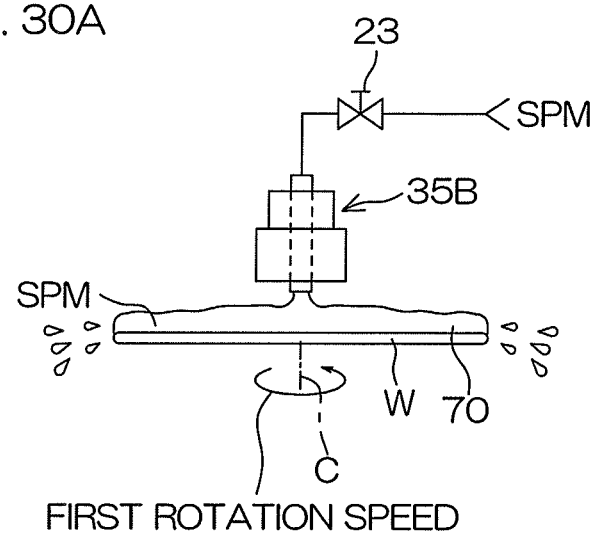
FIGS. 30A and 30B are schematic sectional views for explaining an SPM liquid film forming step and an SPM liquid film heating step in the fifth embodiment.
Figure 30B:
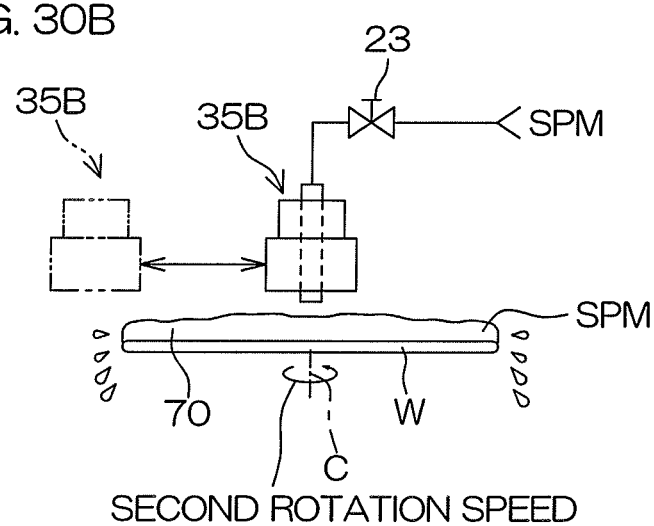
Figure 31:
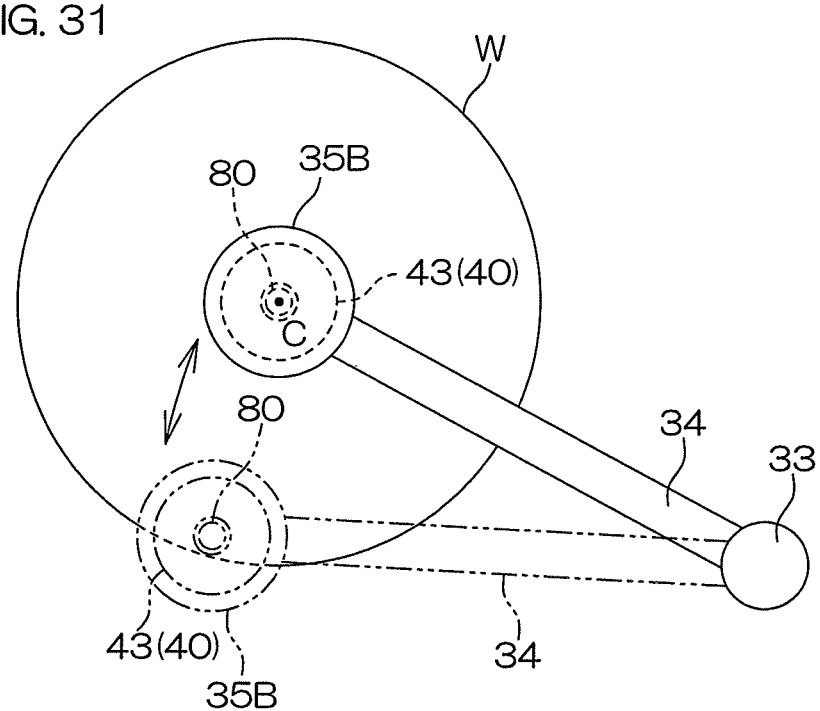
FIG. 31 is a plan view showing a movement range of the integral head in the respective steps shown in FIGS. 30A and 30B.

The substrate treatment apparatus 1D according to this embodiment performs an exemplary treatment for the resist removing process based on the process diagram and the time chart respectively shown in FIGS. 7 and 8 described above. FIGS. 30A and 30B are schematic sectional views for explaining an SPM liquid film forming step and an SPM liquid film heating step. FIG. 31 is a plan view showing a movement range of the integral head 35B in the respective steps shown in FIGS. 30A and 30B.

Referring to FIGS. 3, 5, 6, 7, 8 and 27 to 30B, a first exemplary treatment for the resist removing process to be performed by the substrate treatment apparatus 1D will be described.

In the resist removing process, the transport robot (not shown) is controlled to load a wafer W subjected to the ion implantation process into the treatment chamber 2 (Step S1 in FIG. 7: wafer loading step). It is assumed that the wafer has not been subjected to a resist ashing process and a resist present on a front surface of the wafer W is hydrophobic. The wafer W is transferred to the wafer rotating mechanism 3 with its front surface facing up. At this time, the integral head 35B and the SC1 nozzle 25 are located at their home positions so as not to prevent the loading of the wafer W.

With the wafer W held by the wafer rotating mechanism 3, the controller 55 controls the motor 6 to start rotating the wafer W. The rotation speed of the wafer W is increased to a first rotation speed (in a range of 30 to 300 rpm, e.g., 60 rpm), and then maintained at the first rotation speed (Step S2 in FIG. 7). The first rotation speed is a speed which ensures that the wafer W can be covered with the SPM liquid. Further, the controller 55 controls the pivot drive mechanism 36 and the lift drive mechanism 37 to pivot and vertically move the arm 34 retaining the integral head 35B above the wafer W. More specifically, the controller 55 locates the integral head 35B at a center adjacent position at which the integral head 35B is opposed to the rotation center of the front surface of the wafer W held by the wafer rotating mechanism 3. The center adjacent position is a position at which the lift-off liquid outlet port 80 of the lift-off liquid flow pipe 4B incorporated in the integral head 35B is opposed to the rotation center of the front surface of the wafer W (as indicated by a solid line in FIG. 31).

After the rotation speed of the wafer W reaches the first rotation speed, the controller 55 opens the sulfuric acid valve 18, the hydrogen peroxide solution valve 20 and the lift-off liquid valve 23 to supply the SPM liquid to the lift-off liquid flow pipe 4B as shown in FIG. 30A. Thus, the SPM liquid flowing through the lift-off liquid flow pipe 4B is spouted from the lift-off liquid outlet port 80 to be supplied onto the front surface of the wafer W. Further, the controller 55 controls the amplifier 54 to cause the infrared lamp 38 to emit infrared radiation.

As described above, the SPM liquid flowing through the lift-off liquid flow pipe 4B surrounded by the infrared lamp 38 is heated by the irradiation with the infrared radiation emitted from the infrared lamp 38. Therefore, the SPM liquid flowing through the lift-off liquid flow pipe 4B to be thereby heated to a higher temperature is spouted from the lift-off liquid outlet port 80 to be supplied onto the front surface of the wafer W.

Since the rotation speed of the wafer W is the first rotation speed, the SPM liquid supplied onto the front surface of the wafer W is accumulated on the front surface of the wafer W, and an SPM liquid film (chemical liquid film) 70 is formed on the front surface of the wafer W as covering the entire front surface (Step S3 in FIG. 7: SPM liquid film forming step).

As shown in FIG. 30A, the controller 55 controls the pivot drive mechanism 36 and the lift drive mechanism 37 to locate the integral head 35B at the center adjacent position at the start of the SPM liquid film forming step. With the lift-off liquid outlet port 80 located above the rotation center of the wafer W, the SPM liquid can be distributed over the entire front surface of the wafer W.

Thereafter, the controller 55 controls the pivot drive mechanism 36 to pivot the arm 34 to horizontally move the integral head 35B (along the front surface of the wafer W) toward a peripheral adjacent position, while the SPM liquid is spouted from the lift-off liquid outlet port 80 of the lift-off liquid flow pipe 4B. The peripheral adjacent position is a position at which the lift-off liquid outlet port 80 of the lift-off liquid flow pipe 4B incorporated in the integral head 35B is opposed to the peripheral edge of the front surface of the wafer W (as indicated by a two-dot-and-dash line in FIG. 31).

Since the heater (the infrared lamp 38 and the bottom plate 52) and the lift-off liquid flow pipe 4B are integrally retained by the integral head 35B, an SPM liquid spouting position on the wafer W at which the SPM liquid is spouted from the lift-off liquid outlet port 80 is always located close to a region of the wafer W opposed to the heater 38, 52. Therefore, the SPM liquid just supplied onto the front surface of the wafer W can be heated by the heater 38, 52.

A liquid film forming period required for forming the SPM liquid film 70 over the entire front surface of the wafer W varies depending on the flow rate of the SPM liquid to be spouted from the lift-off liquid outlet port 80, but may be in a range of 2 to 15 seconds, e.g., 5 seconds.

After a lapse of the liquid film forming period (e.g., 5 seconds) from the start of the supply of the SPM liquid, the controller 55 controls the motor 6 to reduce the rotation speed of the wafer W to a predetermined second rotation speed that is lower than the first rotation speed. Thus, the SPM liquid film heating step of Step S4 is performed.

The second rotation speed is a speed (in a range of 1 to 20 rpm, e.g., 15 rpm) which ensures that the SPM liquid film 70 can be retained on the front surface of the wafer W without the supply of the SPM liquid to the wafer W. In synchronism with the reduction of the rotation speed of the wafer W by the motor 6, the controller 55 closes the lift-off liquid valve 23 to stop supplying the SPM liquid from the lift-off liquid outlet port 80. Even without the supply of the SPM liquid to the wafer W, the SPM liquid film 70 is continuously retained on the front surface of the wafer W by reducing the rotation speed of the wafer W to the second rotation speed.

Even after the reduction of the rotation speed of the wafer W, as shown in FIG. 30B, the SPM liquid present on the front surface of the wafer W is continuously heated by the heater 38, 52 of the heater head 35B (Step S4 in FIG. 7: SPM liquid film heating step).

The controller 55 controls the amplifier 54 to cause the infrared lamp 38 to emit the infrared radiation and, as shown in FIGS. 30B and 31, controls the pivot drive mechanism 36 and the lift drive mechanism 37 to reciprocally move the integral head 35B between the center adjacent position and the peripheral adjacent position.

Since the bottom plate 52 of the lamp housing 40 is heated to about 300° C. by the irradiation with the infrared radiation emitted from the infrared lamp 38, the SPM liquid is heated to a higher temperature on the order of 250° C. in a region of the front surface of the wafer W opposed to the lower surface 52B of the bottom plate 52. Thus, the SPM liquid is rapidly heated. Then, the region of the front surface of the wafer W opposed to the lower surface 52B of the bottom plate 52 is moved along an arcuate zone path within a range from a region including the rotation center of the wafer W to a region including the peripheral edge of the wafer W. Thus, the entire front surface of the wafer W can be heated. In this case, the wafer W immediately below the infrared lamp 38 is heated, whereby the SPM liquid is heated around an interface between the wafer W and the SPM liquid.

When the integral head 35B is located at any of the adjacent positions, the lower surface 52B of the bottom plate 52 and the front surface of the wafer W are kept spaced a minute distance (e.g., about 3 mm) from each other. Therefore, an atmosphere present between the lower surface 52B and the front surface of the wafer W can be isolated from a peripheral environment to be thereby kept hot. This suppresses the reduction in the temperature of the SPM liquid in the region of the front surface of the wafer W opposed to the lower surface 52B of the bottom plate 52. Thus, the SPM liquid can be maintained at a further higher temperature in the region opposed to the bottom plate 52.

In the SPM liquid film heating step of Step S4, the SPM liquid film 70 is heated around the interface between the front surface of the wafer W and the SPM liquid film 70. Thus, a reaction between the SPM liquid and the resist present on the front surface of the wafer W proceeds, so that the resist is lifted off from the front surface of the wafer W.

After a lapse of a predetermined liquid film heating period (in a range of 5 to 240 seconds, e.g., about 14 seconds) from the reduction of the rotation speed of the wafer W, the controller 55 closes the sulfuric acid valve 18 and the hydrogen peroxide solution valve 20 and, at the same time, controls the amplifier 54 to stop emitting the infrared radiation from the infrared lamp 38. Further, the controller 55 controls the pivot drive mechanism 36 and the lift drive mechanism 37 to move the integral head 35B back to the home position.

In this embodiment, as described above, the SPM liquid flowing through the lift-off liquid flow pipe 4B surrounded by the infrared lamp 38 is heated by the irradiation with the infrared radiation emitted from the infrared lamp 38. Therefore, the SPM liquid flowing through the lift-off liquid flow pipe 4B to be thereby heated to a higher temperature is supplied to the front surface of the wafer W.

Further, the heater 38, 52 is located in opposed relation to the front surface of the wafer W and the infrared radiation is emitted from the infrared lamp 38, whereby the SPM liquid is heated in the region of the front surface of the wafer W opposed to the heater 38, 52. Simultaneously with the heating by the heater 38, 52, the heater 38, 52 is moved along the front surface of the wafer W. Therefore, the region of the front surface of the wafer W opposed to the lower surface 52B of the bottom plate 52 is moved along the arcuate zone path in the range from the region including the rotation center of the wafer W to the region including the peripheral edge of the wafer W, so that substantially the entire front surface of the wafer W can be heated by the heater 38, 52.

Therefore, the SPM liquid flowing through the lift-off liquid flow pipe 4B to be thereby heated to a higher temperature is supplied onto the front surface of the wafer W, and thereafter further heated by the heater 38, 52. Thus, the SPM liquid film 70 formed on the front surface of the wafer W is heated around the interface between the wafer W and the SPM liquid film 70.

Since the SPM liquid present on the front surface of the wafer W is heated around the interface between the wafer W and the SPM liquid, even a resist having a hardened layer can be removed from the front surface of the wafer W without the ashing. Without the need for the ashing of the resist, it is possible to eliminate the problem of the damage to the front surface of the wafer W due to the ashing.

Figure 32:
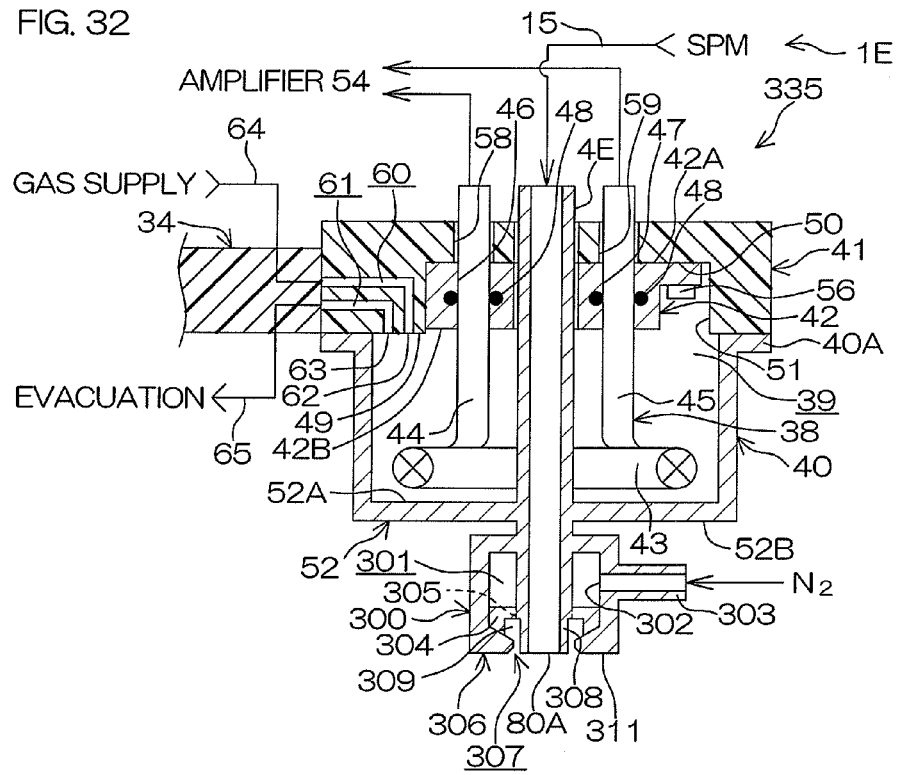
FIG. 32 is a sectional view of an integral head (retention head) of a substrate treatment apparatus according to a sixth embodiment of the present invention.

FIG. 32 is a sectional view of an integral head (retention head) 335 of a substrate treatment apparatus 1E according to a sixth embodiment of the present invention. The substrate treatment apparatus 1E has substantially the same construction as in FIG. 27, except that the integral head 335 is provided instead of the integral head 35B shown in FIG. 28. In the integral head 335 shown in FIG. 32, components corresponding to those of the integral head 35B of the fifth embodiment will be designated by the same reference characters as in FIG. 28, and duplicate description will be omitted.

In the integral head 335 of the sixth embodiment, a cylindrical outer pipe 300 is provided around a distal end portion of a lift-off liquid flow pipe (chemical liquid flow pipe) 4E, so that the distal end portion of the lift-off liquid flow pipe 4E serves as a bifluid nozzle of a so-called external mixing type.

The lift-off liquid flow pipe 4E is a round pipe (cylindrical pipe) having a greater length than the lift-off liquid flow pipe 4B of the fifth embodiment (see FIG. 28). The distal end portion of the lift-off liquid flow pipe 4E extends through the bottom plate 52 of the lamp housing 40 to project (downward) from the lower surface 52B of the bottom plate 52 to the distal side. The projection of a lift-off liquid outlet port (chemical liquid outlet port) 80A from the lower surface 52B in the sixth embodiment is greater than the projection of the lift-off liquid outlet port 80 (see FIG. 28) from the lower surface 52B in the fifth embodiment. The lift-off liquid flow pipe 4E has substantially the same structure as the lift-off liquid flow pipe 4B (see FIG. 28) except for its distal end portion.

The outer pipe 300 has a generally cylindrical shape coaxial with the cylindrical lift-off liquid flow pipe 4E. The outer pipe 300 is formed of quarts, for example, integrally with the lift-off liquid flow pipe 4E.

A portion of the outer pipe 300 excluding its upper end portion has a generally constant inner diameter that is greater than the outer diameter of the lift-off liquid flow pipe 4E. Therefore, a generally cylindrical gap is defined between an outer wall of the lift-off liquid flow pipe 4E and an inner wall of the outer pipe 300 about the center axis of the lift-off liquid flow pipe 4E to serve as a cylindrical flow passage 301. The upper end portion of the outer pipe 300 has an inner periphery having a smaller diameter that is equal to the outer diameter of the lift-off liquid flow pipe 4E. Thus, an upper end of the cylindrical flow passage 301 is closed.

The outer pipe 300 has a gas inlet 302 provided in a longitudinally (vertically) middle portion thereof as communicating with the cylindrical flow passage 301. A nitrogen gas pipe 303 is connected to the gas inlet 302. One of opposite ends of the nitrogen gas pipe 303 is connected to the gas inlet 302, and nitrogen gas is supplied to the other end of the nitrogen gas pipe 303 from a nitrogen gas supply source not shown.

A flange 304 is provided around a portion of the lift-off liquid flow pipe 4E adjacent to the lift-off liquid outlet port 80A, and a gas deflection flow passage 305 extends through the flange 304 along the center axis of the lift-off liquid flow pipe 4E. A distal end portion of the outer pipe 300 (adjacent to the lift-off liquid outlet port 80A) serves as a blocking portion 306, which has a tapered inner wall having an inner diameter decreasing toward the distal end. An outer wall of the blocking portion 306 has an annular distal end face 311 surrounding the lift-off liquid outlet port 80A and a gas outlet port 307 to be described later and extending perpendicularly to the center axis of the lift-off liquid flow pipe 4E.

A short tubular portion 308 projects from an end of the flange 304 along the center axis of the lift-off liquid flow pipe 4E. That is, the distal end portion of the lift-off liquid flow pipe 4E serves as the short tubular portion 308. The short tubular portion 308 is disposed in a generally center portion of the blocking portion 306. The inner diameter of the blocking portion 306 is greater than the outer diameter of the short tubular portion 308. A generally cylindrical gap is defined between the blocking portion 306 and the short tubular portion 308 about the center axis of the lift-off liquid flow pipe 4E to serve as a swirl generating flow passage 309. The swirl generating flow passage 309 has an annular opening which is defined around the lift-off liquid outlet port 80A to serve as the gas outlet port 307.

The cylindrical flow passage 301, the gas deflection flow passage 305 and the swirl generating flow passage 309 communicate with each other, and cooperatively define a gas flow passage. Nitrogen gas flowing into the swirl generating flow passage 309 from the gas deflection flow passage 305 swirls around the lift-off liquid flow pipe 4E to be guided to the gas outlet port 307. The nitrogen gas swirls around the lift-off liquid flow pipe 4E in the swirl generating flow passage 309, whereby nitrogen gas spouted from the gas outlet port 307 forms a swirl around the gas outlet port 307. The swirl of the nitrogen gas surrounds the SPM liquid spouted from the lift-off liquid outlet port 80A along the center axis of the lift-off liquid flow pipe 4E.

When the SPM liquid is supplied to the lift-off liquid flow pipe 4E from the lift-off liquid supply line 15 and the nitrogen gas is supplied to the nitrogen gas pipe 303, the SPM liquid and the nitrogen gas are spouted from the lift-off liquid outlet port 80A and the gas outlet port 307, respectively, to the outside space. Then, the SPM liquid and the nitrogen gas collide with each other to be mixed together in the outside space, whereby minute droplets of the SPM liquid are generated. Then, the SPM liquid droplets form a jet stream, which is spouted toward the front surface of the wafer W held by the wafer rotating mechanism 3.

According to the sixth embodiment, the SPM liquid spouted from the lift-off liquid outlet port 80A and the nitrogen gas spouted from the gas outlet port 307 are mixed together, whereby higher-temperature minute SPM liquid droplets are generated. The SPM liquid supplied in the form of minute liquid droplets onto the front surface of the wafer W is easily heated to a higher temperature by the heater 38, 52. Thus, the SPM liquid film 70 present on the front surface of the wafer W can be advantageously maintained at a higher temperature on the order of 200° C. or higher.

Figure 33:
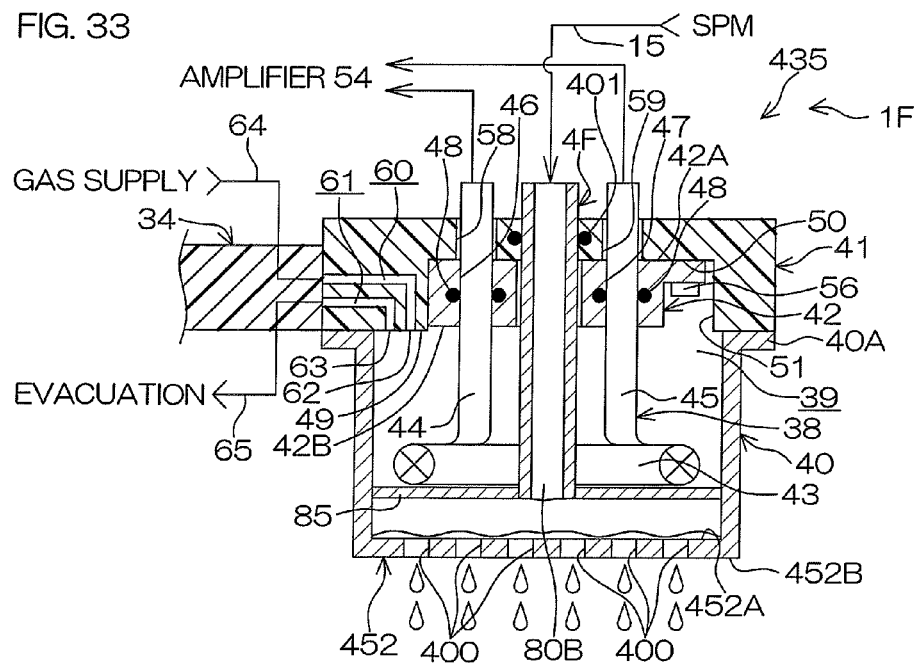
FIG. 33 is a sectional view of an integral head (retention head) of a substrate treatment apparatus according to a seventh embodiment of the present invention.

FIG. 33 is a sectional view of an integral head (retention head) 435 of a substrate treatment apparatus 1F according to a seventh embodiment of the present invention. The substrate treatment apparatus 1F has substantially the same construction as in FIG. 27, except that the integral head 435 is provided instead of the integral head 35B shown in FIG. 28. In the integral head 435 shown in FIG. 33, components corresponding to those of the integral head 35B of the fifth embodiment will be designated by the same reference characters as in FIG. 28, and duplicate description will be omitted.

In the integral head 435 of the seventh embodiment, a distal end portion of a lift-off liquid flow pipe (chemical liquid flow pipe) 4F does not reach a bottom plate 452 of a lamp housing 40, and a lift-off liquid outlet port (opening) 80B of the lift-off liquid flow pipe 4F is opposed to and spaced a predetermined distance from an upper surface 452A of the bottom plate 452. The bottom plate 452 has a multiplicity of smaller-diameter through-holes (chemical liquid outlet ports) 400 extending vertically therethrough. The through-holes 400 are distributed over the entire bottom plate 452.

The lift-off liquid flow pipe 4F is a round quartz pipe (cylindrical pipe) having a smaller length than the lift-off liquid flow pipe 4B (see FIG. 28) of the fifth embodiment. The lift-off liquid flow pipe 4F is fixedly supported by a lid 41, for example, via an O-ring 401.

The bottom plate 452 has substantially the same structure as the bottom plate 52 (see FIG. 28) of the fifth embodiment, except that the multiplicity of through-holes 400 are provided. Therefore, the bottom plate 452 has an upper surface 452B and a lower surface (opposed surface) 452B which are equivalent to the upper surface 52A and the lower surface 52B (see FIG. 28). The bottom plate 452 is heated to a higher temperature by irradiation with infrared radiation emitted from the infrared lamp 38, thereby serving as a heat source. In this embodiment, therefore, not only the infrared lamp 38 but also the bottom plate 452 serves as a heater.

Further, the lower end of the annular portion 43 of the infrared lamp 38 is located at a slightly higher position than the lower end of the lift-off liquid flow pipe 4F (i.e., the lift-off liquid outlet port 80B). That is, the distal end portion of the lift-off liquid flow pipe 4F is surrounded by the annular portion 43. Therefore, a distance between the annular portion 43 of the infrared lamp 38 and the upper surface 452A of the bottom plate 452 is greater than a distance between the lift-off liquid outlet port 80B and the upper surface 452A of the bottom plate 452. The distance between the annular portion 43 of the infrared lamp 38 and the upper surface 452A of the bottom plate 452 is set to a distance such that the bottom plate 452 can be heated to a higher temperature by the irradiation with the infrared radiation emitted from the infrared lamp 38. In the resist removing process, the lower surface 452B of the bottom plate 452 is located close to the front surface of the wafer W.

A disk-shaped plate member 85 is provided around the lower end of the lift-off liquid flow pipe 4F. The plate member 85 is formed of quartz, and protects the infrared lamp 38 from the SPM liquid.

According to the seventh embodiment, the SPM liquid flowing through the lift-off liquid flow pipe 4F is spouted from the lift-off liquid outlet port 80B, and then received by the bottom plate 452 of the lamp housing 40 to be spouted in a shower form from the multiplicity of through-holes 400 of the bottom plate 452. The SPM liquid received by the bottom plate 452 is once accumulated on the upper surface 452A of the bottom plate 452 before being spouted from the through-holes 400. The SPM liquid is irradiated with the infrared radiation emitted from the infrared lamp 38 to be thereby further heated. Thus, the SPM liquid supplied onto the front surface of the wafer W held by the wafer rotating mechanism 3 can be heated to a further higher temperature. Therefore, the SPM liquid film 70 present on the front surface of the wafer W can be advantageously maintained at a higher temperature on the order of 200° C. or higher.

Droplets of the SPM liquid are spouted from the through-holes 400. The SPM liquid supplied in the form of liquid droplets onto the front surface of the wafer W is easily heated to a higher temperature by the heater 38, 452. Thus, the SPM liquid film 70 present on the front surface of the wafer W can be advantageously maintained at the higher temperature.

With the provision of the through-holes 400 in the entire bottom plate 452, the SPM liquid droplets can be extensively supplied over the front surface of the wafer W.

In the fifth to seventh embodiments, the SPM liquid present on the front surface of the wafer W is not heated by the heater 38, 52 (38,452) of the integral head 35B, 335, 435 in the SPM liquid film forming step of Step S3 (see FIG. 7). That is, the SPM liquid is heated by the heater 38, 52 (38, 452) for the first time in the SPM liquid film heating step of Step S4.

While the embodiments of the present invention have thus been described, the present invention may be embodied in other ways.

The infrared lamp 38 includes a single circular (annular) lamp by way of example but not by way of limitation. An infrared lamp including a plurality of circular lamps disposed coaxially may be employed as the infrared lamp. Further, a plurality of linear infrared lamps disposed parallel to each other in a horizontal plane may be employed instead of the infrared lamp 38.

The lamp housing 40 has a cylindrical shape, but may have a polygonal tubular shape (e.g., a rectangular tubular shape). In this case, the bottom plate 52, 452 also has a rectangular plate shape.

A disk-shaped or rectangular opposed plate (opposed member) having an opposed surface to be opposed to the front surface of the wafer W may be provided separately from the bottom plate 52, 452 of the lamp housing 40. In this case, quartz may be used as a material for the opposed plate.

The present invention is applicable to a substrate treatment apparatus adapted to selectively etch a nitride film on a major surface of a substrate with the use of a hot etching liquid such as hot phosphoric acid.

While the present invention has been described in detail byway of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application Nos. 2012-044650 and 2012-044651 filed in the Japan Patent Office on Feb. 29, 2012, Japanese Patent Application Nos. 2012-059259 and 2012-059260 filed in the Japan Patent Office on Mar. 15, 2012, and Japanese Patent Application No. 2012-144295 filed in the Japan Patent Office on Jun. 27, 2012, and the disclosure of these applications is entirely incorporated herein by reference.

What is claimed is:
1. A substrate treatment apparatus comprising:
   a treatment chamber;
   a substrate holding unit provided in the treatment chamber to hold a substrate, the substrate holding unit being configured to horizontally hold the substrate with a major surface directed upward;

a chemical liquid supplying unit which supplies a chemical liquid onto the major surface of the substrate held by the substrate holding unit;

an infrared lamp located above the substrate holding unit in opposed relation to the major surface of the substrate held by the substrate holding unit to heat the chemical liquid supplied onto the major surface of the substrate by irradiation with infrared radiation emitted from the infrared lamp;

an annular gas outlet port to be located above the substrate holding unit in opposed relation to the major surface of the substrate held by the substrate holding unit, the annular gas outlet port being directed horizontally to radially spout a gas horizontally along the major surface of the substrate;

a retention head which retains the infrared lamp and the gas outlet port together;

a gas flow pipe through which the gas flows to be spouted from an outlet hole thereof extending thicknesswise through a pipe wall thereof;

a gas supplying unit which supplies the gas to the gas flow pipe; and an upper baffle plate and a lower baffle plate which deflect the gas flowing through the gas flow pipe and spouted from the outlet hole to form a horizontal gas stream flowing horizontally along the major surface of the substrate held by the substrate holding unit, wherein respective outer peripheries of the upper and lower baffle plates define the horizontally-directed annular gas outlet port; and wherein the horizontal gas stream formed by deflecting the gas by the pair of baffle plates is supplied to the gas outlet port to radially spout the gas horizontally along the major surface of the substrate.

2. The substrate treatment apparatus according to claim 1, further comprising a retention head moving unit which horizontally moves the retention head above the substrate holding unit along the major surface of the substrate held by the substrate holding unit, wherein the infrared lamp has a smaller diameter than the substrate held by the substrate holding unit.

3. The substrate treatment apparatus according to claim 1, further comprising a cup which accommodates the substrate holding unit and has an upper end defining an opening, above the substrate holding unit, having a size such that the substrate can be passed through the opening, wherein the gas outlet port is disposed in the opening, and adapted to horizontally spout the gas toward the upper end of the cup.

4. The substrate treatment apparatus according to claim 1, wherein the outlet hole includes a plurality of separate outlet holes which are provided circumferentially of the gas flow pipe in circumferentially spaced relation.

5. The substrate treatment apparatus according to claim 1, wherein the outlet hole has a horizontal annular shape extending circumferentially of the gas flow pipe.

6. The substrate treatment apparatus according to claim 1,
wherein the infrared lamp has a horizontal annular shape surrounding the gas flow pipe such that the gas flow pipe extends vertically through the horizontal annular shape,
wherein the pipe wall of the gas flow pipe is heated by the irradiation with the infrared radiation emitted from the infrared lamp to heat the gas flowing through the gas flow pipe.

7. The substrate treatment apparatus according to claim 1, wherein the pipe wall of the gas flow pipe is formed of quartz.

8. The substrate treatment apparatus according to claim 1,
wherein the retention head includes a lamp housing which accommodates the infrared lamp,
wherein the pipe wall of the gas flow pipe is formed integrally with the lamp housing and the lower baffle plate.

9. The substrate treatment apparatus according to claim 1, wherein the lower baffle plate is supported by the gas flow pipe.

10. The substrate treatment apparatus according to claim 1, further comprising:
a suction pipe having a suction port and inserted in the gas flow pipe; and
a suction unit which sucks an inside of the suction pipe;
wherein the gas flow pipe and the suction pipe are configured in a double pipe structure such that the suction pipe is inserted in the gas flow pipe;
wherein a distal end portion of the suction pipe extends through the lower baffle plate to form the suction port.

11. The substrate treatment apparatus according to claim 1, wherein the chemical liquid is a resist lift-off liquid.

* * * * *